(12) United States Patent
Noguchi et al.

(10) Patent No.: US 6,849,535 B2
(45) Date of Patent: Feb. 1, 2005

(54) SEMICONDUCTOR INTEGRATED CIRCUIT DEVICE AND MANUFACTURING METHOD OF SEMICONDUCTOR INTEGRATED CIRCUIT DEVICE

(75) Inventors: Junji Noguchi, Ome (JP); Naofumi Ohashi, Hanno (JP); Kenichi Takeda, Tokorozawa (JP); Tatsuyuki Saito, Ome (JP); Hizuru Yamaguchi, Akishima (JP); Nobuo Owada, Ome (JP)

(73) Assignee: Renesas Technology Corp., Tokyo (JP)

( * ) Notice: Subject to any disclaimer, the term of this patent is extended or adjusted under 35 U.S.C. 154(b) by 59 days.

(21) Appl. No.: 10/128,265

(22) Filed: Apr. 24, 2002

(65) Prior Publication Data

US 2002/0113271 A1 Aug. 22, 2002

Related U.S. Application Data

(62) Division of application No. 09/666,053, filed on Sep. 20, 2000, now abandoned, which is a continuation of application No. 09/621,536, filed on Jul. 21, 2000, now abandoned.

(30) Foreign Application Priority Data

Aug. 10, 1999 (JP) ............................................. 11-226876

(51) Int. Cl.⁷ ............................................. H01L 21/44
(52) U.S. Cl. ....................... 438/622; 438/637; 438/643; 438/653; 438/687; 438/692
(58) Field of Search ................................. 438/622, 624, 438/627, 637, 643, 653, 687, 691, 692; 257/751, 752, 758, 762, 767, 774, 776

(56) References Cited

U.S. PATENT DOCUMENTS 3,837,929 A    9/1974 Caule ......................... 148/6.16

(List continued on next page.)

FOREIGN PATENT DOCUMENTS

| EP | 0 508 156  | 10/1992 |
|----|-----------|---------|
| JP | 5-47735   | 2/1993  |
| JP | 6-37038   | 2/1994  |
| JP | 6-224194  | 8/1994  |
| JP | 6-283520  | 10/1994 |
| JP | 7-135192  | 5/1995  |
| JP | 9-82798   | 3/1997  |
| JP | 9-306915  | 11/1997 |
| JP | 10-56014  | 2/1998  |
| JP | 10-261715 | 9/1998  |

OTHER PUBLICATIONS

B. Luther et al., "Planar Copper–Polyimide Back End of the Line Interconnections for ULSI Devices", VMIC Conference 1993 ISMIC–102/93/0015, Jun. 8–9, 1993, pp. 15–21.

(List continued on next page.)

*Primary Examiner*—Minh-Loan Tran
(74) *Attorney, Agent, or Firm*—Miles & Stockbridge P.C.

(57) ABSTRACT

A semiconductor device comprises a semiconductor substrate; a first insulating film overlying a surface of the semiconductor substrate, an upper surface of the first insulating film being nitrided; a first copper-embedded interconnection embedded in the first insulating film, and which first copper-embedded interconnection contains copper as a main component; a copper nitride film overlying an upper surface of the first copper-embedded interconnection; a cap insulating film overlying an upper surface of the first insulating film and an upper surface of the copper nitride film; and a second insulting film overlying the cap insulating film.

3 Claims, 49 Drawing Sheets

U.S. PATENT DOCUMENTS

| | | | |
|---|---|---|---|
| 4,910,169 A | 3/1990 | Hoshino | 437/198 |
| 5,281,304 A | 1/1994 | Kadomura | 156/656 |
| 5,391,517 A | 2/1995 | Gelatos et al. | 437/190 |
| 5,447,887 A | 9/1995 | Filipiak et al. | 437/200 |
| 5,677,244 A | 10/1997 | Venkatraman | 437/198 |
| 5,693,563 A | 12/1997 | Teong | 437/190 |
| 5,744,376 A | 4/1998 | Chan et al. | 437/190 |
| 5,814,557 A | 9/1998 | Venkatraman et al. | 438/622 |
| 5,818,110 A | 10/1998 | Cronin | 257/775 |
| 6,016,000 A | 1/2000 | Moslehi | 257/522 |
| 6,043,153 A | 3/2000 | Nogami et al. | 438/687 |
| 6,048,789 A | 4/2000 | Vines et al. | 438/633 |
| 6,068,879 A | 5/2000 | Pasch | 427/97 |
| 6,083,840 A | 7/2000 | Mravic et al. | 438/693 |
| 6,117,775 A | 9/2000 | Kondo et al. | 438/690 |
| 6,136,680 A | 10/2000 | Lai et al. | 438/597 |
| 6,143,658 A | 11/2000 | Donnelly, Jr. et al. | 438/687 |
| 6,146,135 A | 11/2000 | Watanabe et al. | 432/221 |
| 6,153,043 A | 11/2000 | Edelstein et al. | 156/345 |
| 6,159,857 A | 12/2000 | Liu et al. | 438/687 |
| 6,165,894 A | 12/2000 | Pramanick et al. | 438/627 |
| 6,171,957 B1 | 1/2001 | Mackawa | 438/672 |
| 6,174,810 B1 * | 1/2001 | Islam et al. | 438/687 |
| 6,181,012 B1 | 1/2001 | Edelstein et al. | 257/762 |
| 6,191,007 B1 | 2/2001 | Matsui et al. | 438/459 |
| 6,207,552 B1 | 3/2001 | Wang et al. | 438/618 |
| 6,242,349 B1 | 6/2001 | Nogami et al. | 438/687 |
| 6,326,299 B1 | 12/2001 | Homma et al. | 438/633 |
| 6,348,402 B1 | 2/2002 | Kawanoue et al. | 438/618 |
| 6,355,571 B1 | 3/2002 | Huang et al. | 438/706 |
| 6,376,345 B1 | 4/2002 | Ohashi et al. | 438/542 |
| 6,509,273 B1 | 1/2003 | Imai et al. | 438/693 |
| 6,521,532 B1 | 2/2003 | Cunningham | 438/687 |
| 6,596,637 B1 | 7/2003 | Schonauer et al. | 438/687 |
| 2001/0030367 A1 | 10/2001 | Noguchi et al. | 257/758 |
| 2002/0027287 A1 | 3/2002 | Takagi et al. | 257/758 |
| 2002/0042193 A1 | 4/2002 | Noguchi et al. | 438/618 |

FOREIGN PATENT DOCUMENTS

| | | |
|---|---|---|
| JP | 11-16912 | 1/1999 |
| JP | 11-87353 | 3/1999 |
| JP | 11-135466 | 5/1999 |
| JP | 11-251317 | 9/1999 |
| JP | 11-330246 | 11/1999 |
| JP | 2000-150435 | 5/2000 |
| JP | 2001-298009 | 10/2001 |

OTHER PUBLICATIONS

J. Noguchi et al., "TDDB Improvement in Cu Metallization under Bias Stress", IEEE 38$^{th}$ Annual International Reliability Physics Symposium, 2000, pp. 339–343.

S. Matsushita, "The Lighting in Clean Rooms Induces the Corrosion of Copper: Hitachi Announces the Mechanism for Photo–Corrosion", Semiconductor FPD World, Jul. 2000, pp. 69–73 (translation attached).

Y. Homma et al., "Control of Photocorrosion in the Copper Damascene Process", Journal of the Electrochemical Society, 147 (3), 2000, pp. 1193–1198.

T. Ohmura et al., "CMP Device 'SP4000'", Electronic Materials, May 1996, pp. 53–55 (translation attached).

M. Tsujimura, "Clean CMP System", Electronic Materials, May 1996, pp. 62–65 (tranlation attached).

Y. Hirakura, "CMC Device 'Avanti–472'", Electronic Materials, May 1996, pp. 33–35 (translation attached).

T. Kawane, "Etching Low–k Films—Improving Resistance to Heat and O$_2$ Plasma is the Key to Succesfully Applying Organic Films to the Cu–Damascene Process", Semiconductor World, Nov. 1998, pp. 74–76 (translation attached).

U.S. Appl. No. 09/646,671, Uno et al., filed Jun. 21, 2000.

* cited by examiner

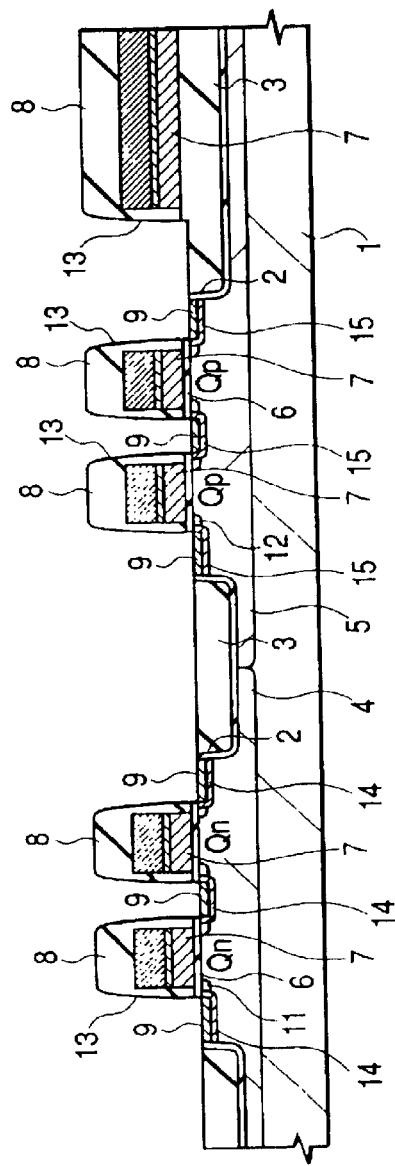
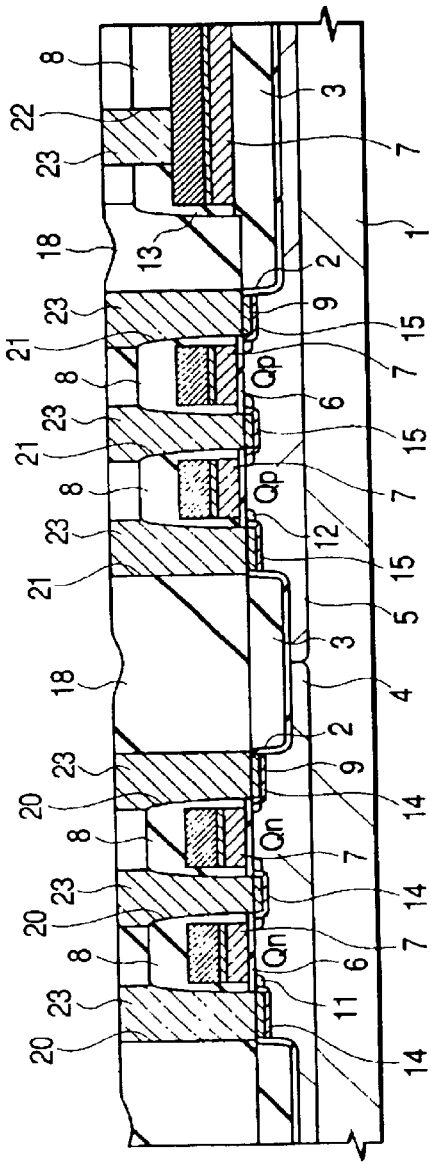
FIG. 3
FIG. 4

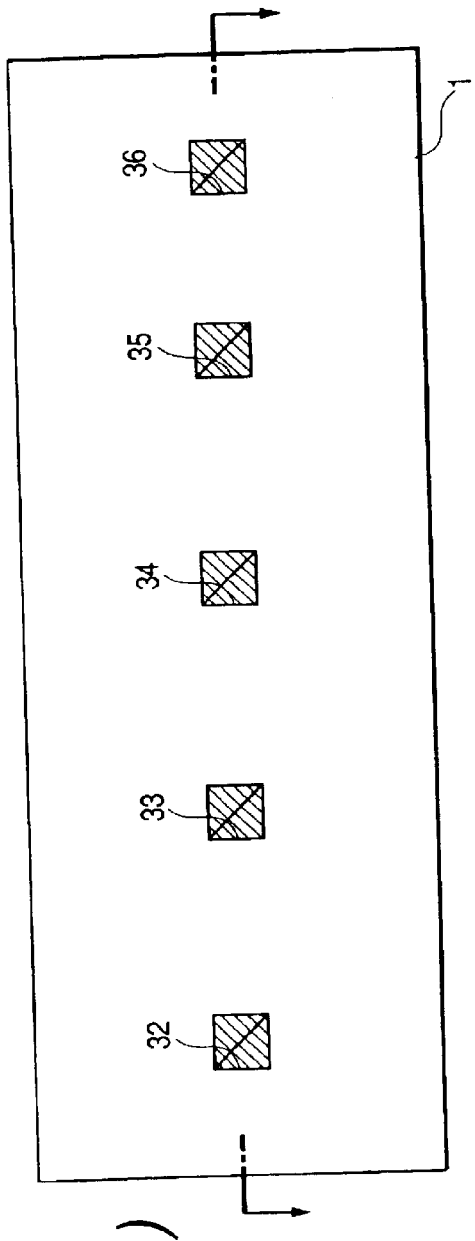
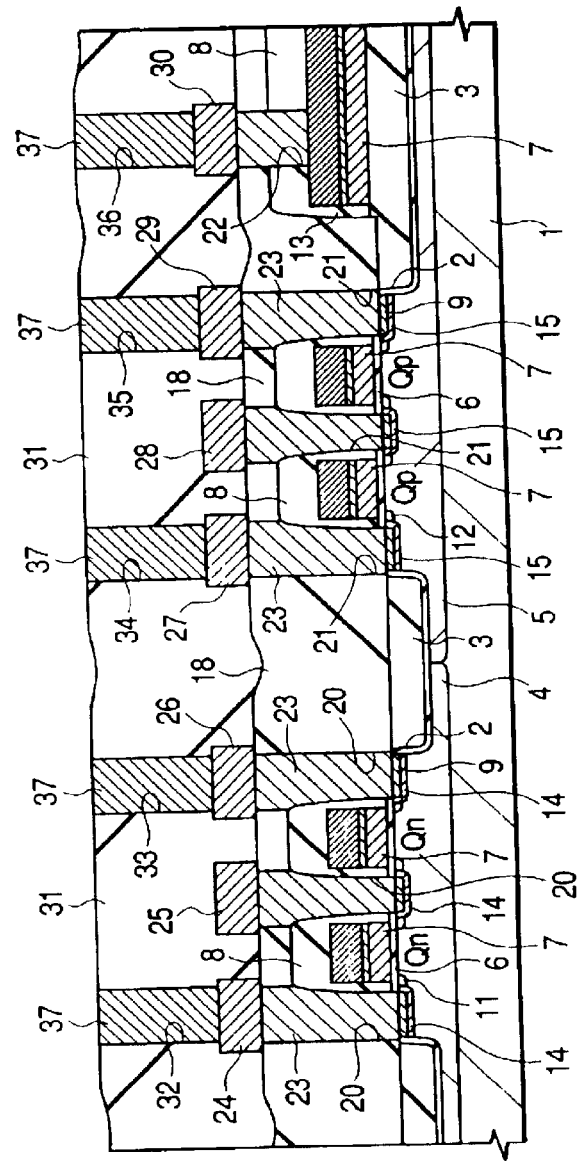
FIG. 6(a)
FIG. 6(b)

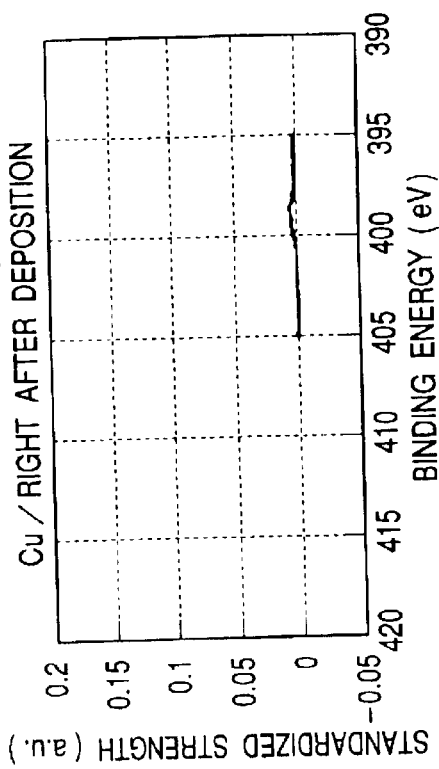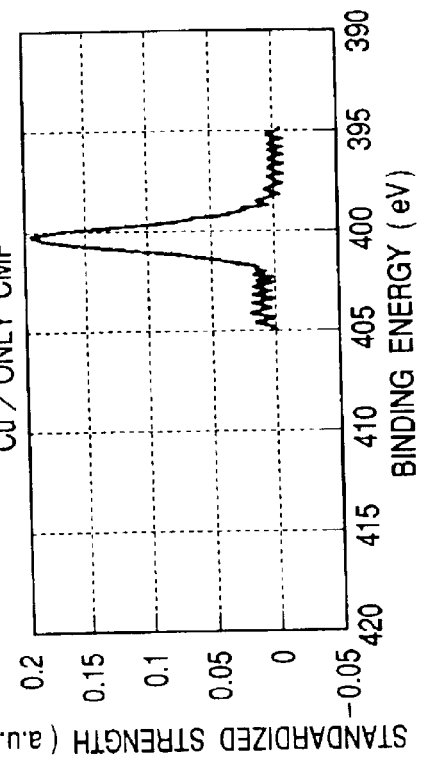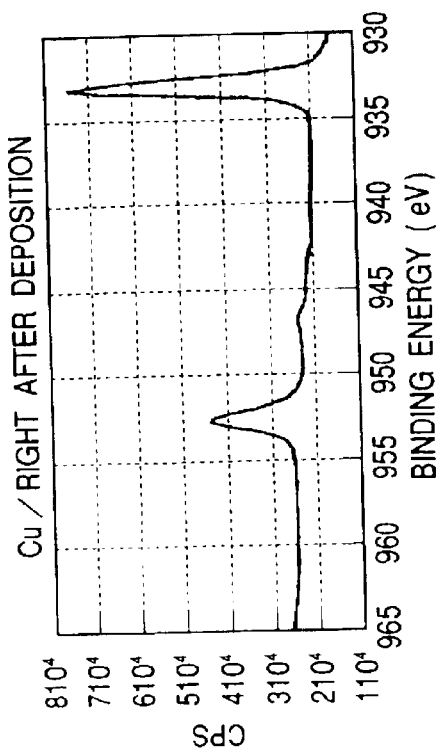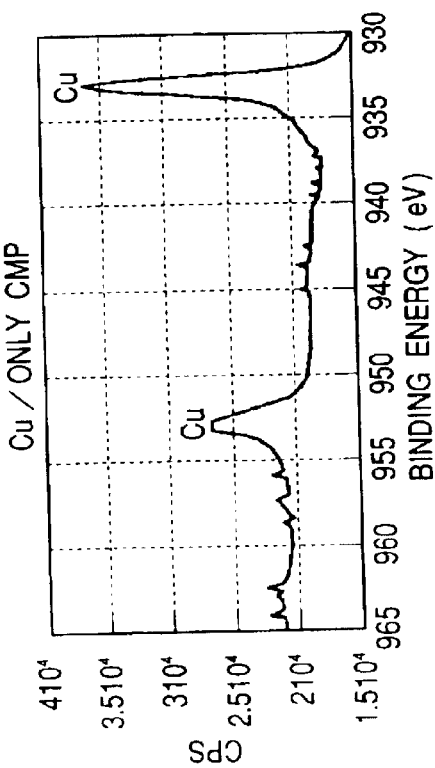

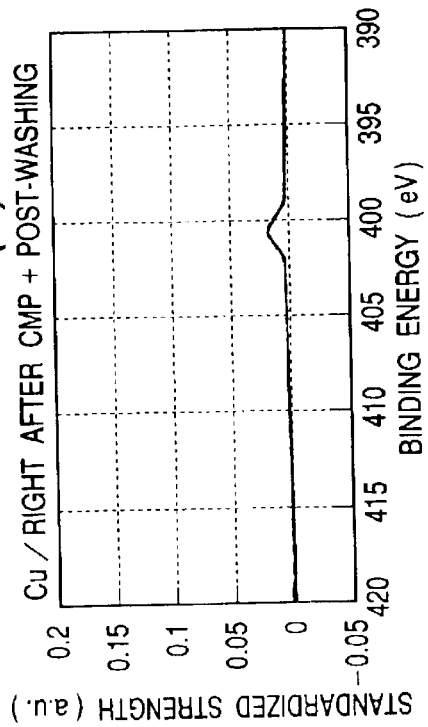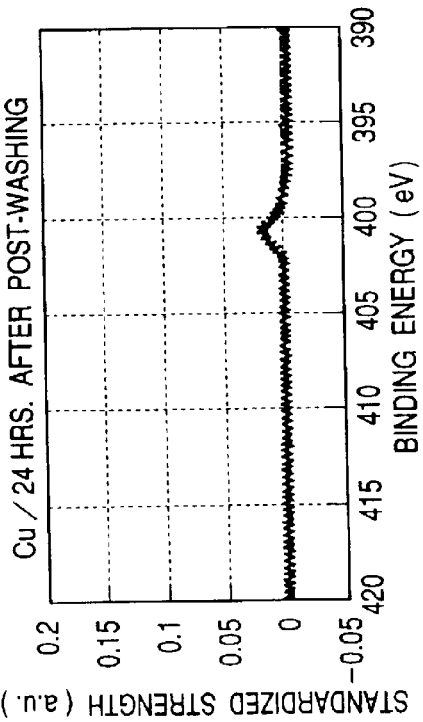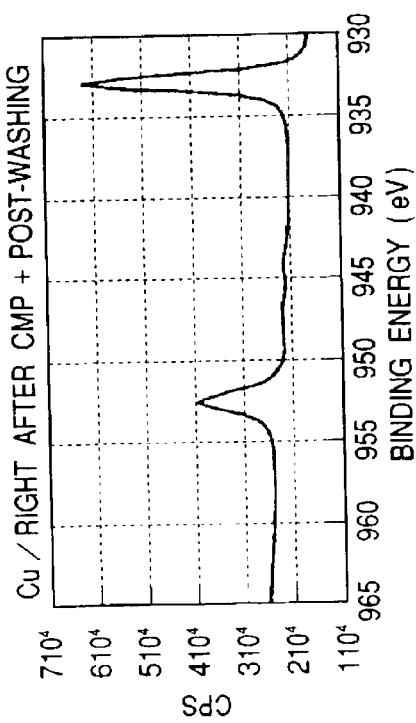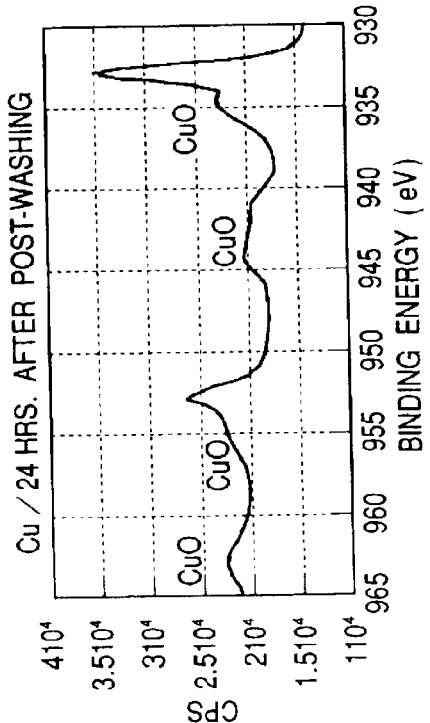

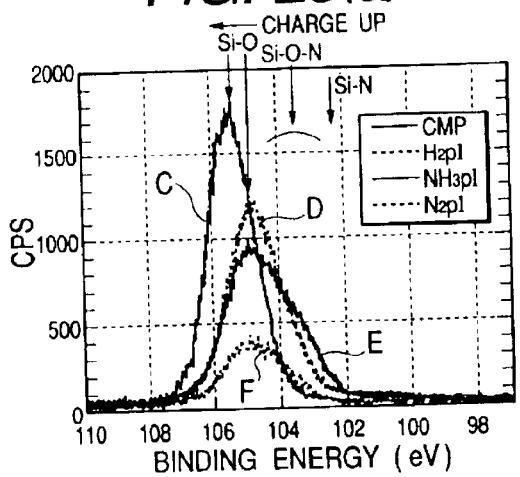
FIG. 25(a)
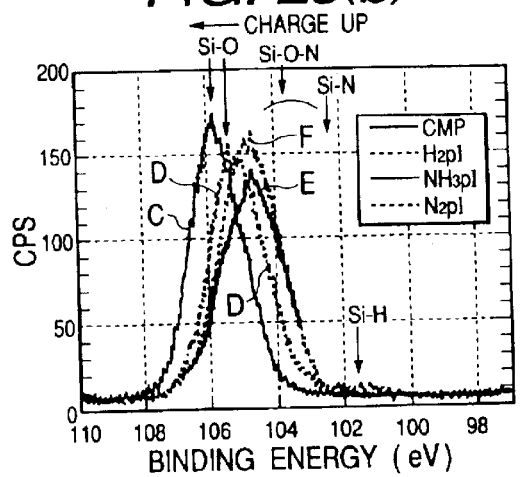
FIG. 25(b)
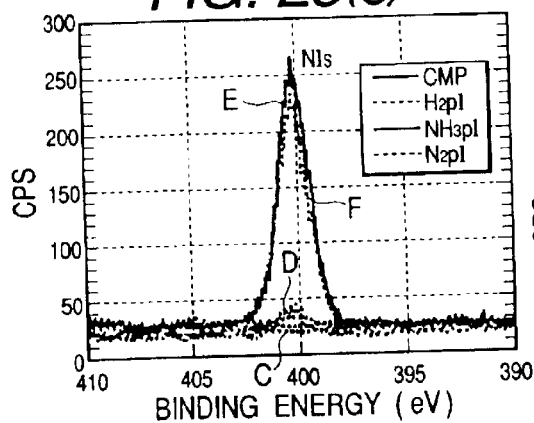
FIG. 25(c)
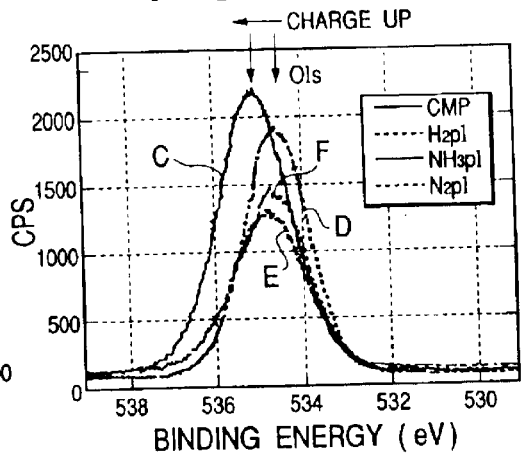
FIG. 25(d)
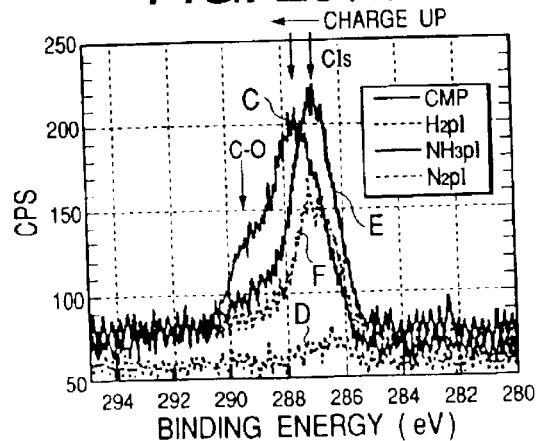
FIG. 25(e)
FIG. 25(f)
| CONDITION | Si3Nx |
|---|---|
| CMP | — |
| H2pl | Si3N1.08 |
| NH3pl | Si3N4.22 |
| N2pl | Si3N3.81 |

THERMAL ELIMINATION OF HYDROGEN
Ar–H m/z=41

THERMAL ELIMINATION OF ORGANIC MATTER A($C_nH_{2n-1}$) $C_2H_3$ m/z=27

THERMAL ELIMINATION OF ORGANIC MATTER B($C_nH_{2n+1}$) $C_4H_9$ m/z=57

THERMAL ELIMINATION OF ORGANIC MATTER C($C_nH_{2n+1}O$) $C_3H_7O$ m/z=59

THERMAL ELIMINATION OF Si
AND ORGANIC MATTER
Si, C2H4 m/z=28

THERMAL ELIMINATION OF SiO
AND ORGANIC MATTER
SiO, C3H6 m/z=44

THERMAL ELIMINATION OF SiH
AND ORGANIC MATTER
SiH, C2H5 m/z=29

THERMAL ELIMINATION OF SiH3
AND ORGANIC MATTER
SiH3 m/z=31

FIG. 37

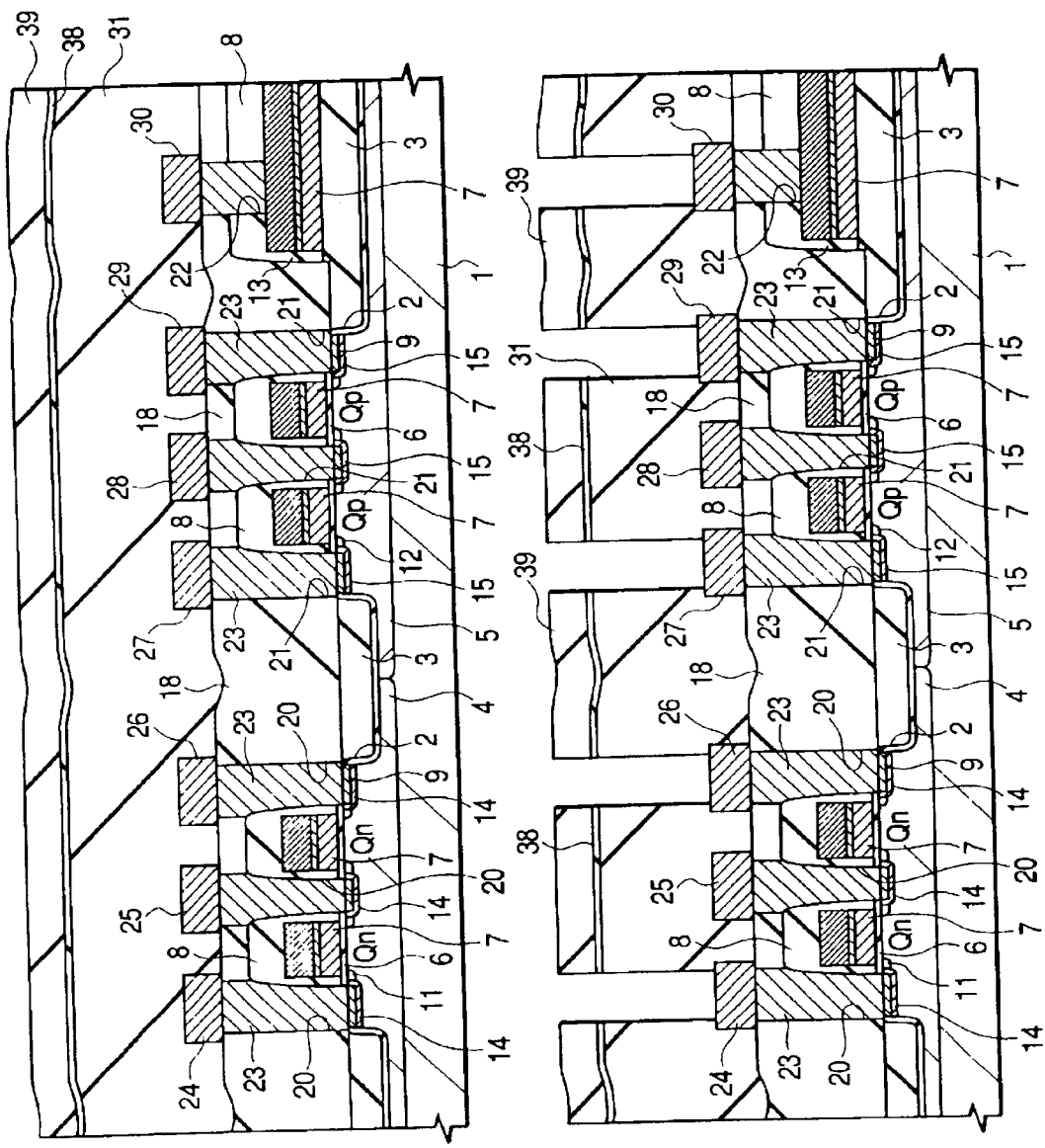

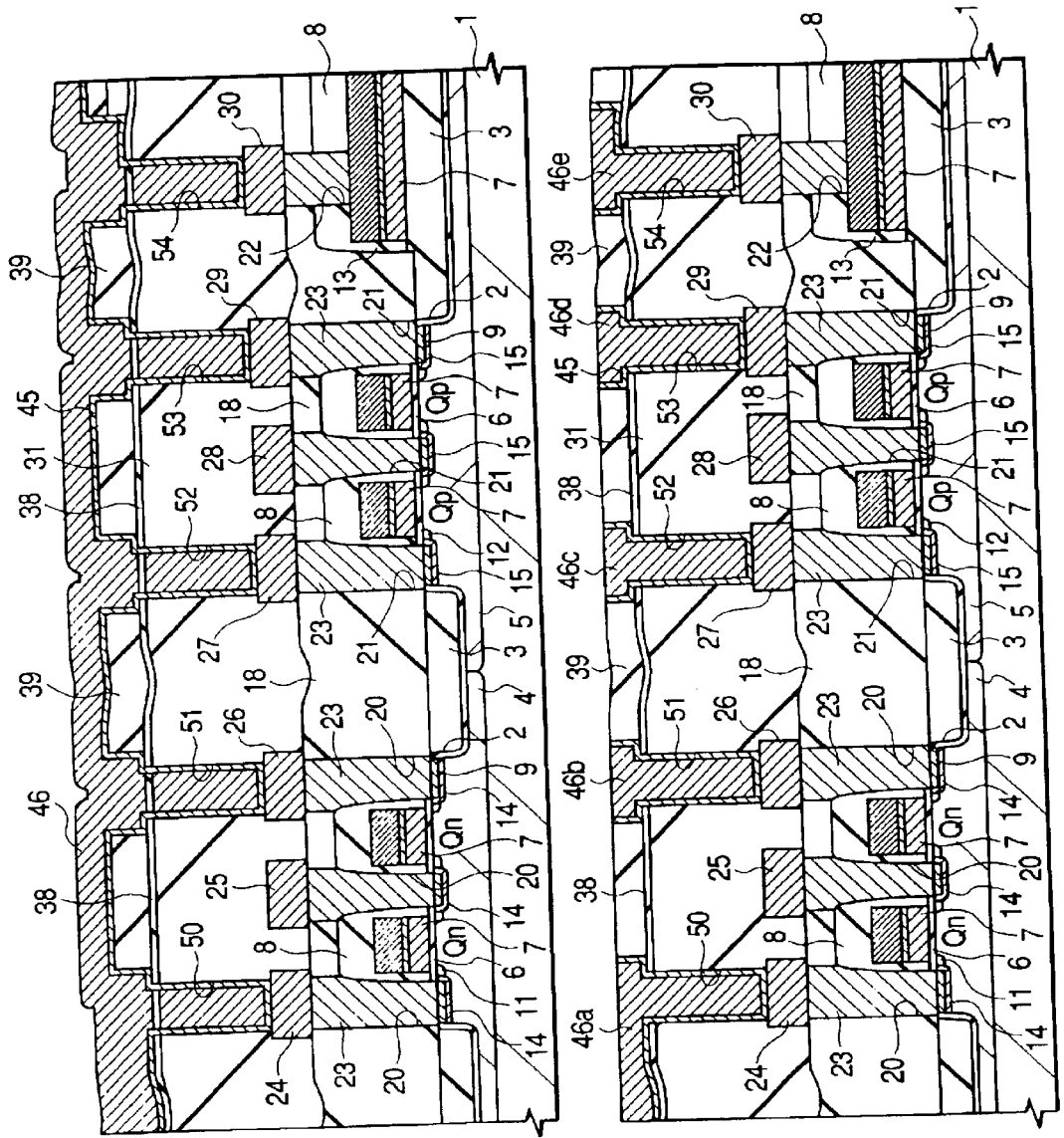

SEMICONDUCTOR INTEGRATED CIRCUIT DEVICE AND MANUFACTURING METHOD OF SEMICONDUCTOR INTEGRATED CIRCUIT DEVICE

This application is a division of application Ser. No. 09/666,053 filed Sep. 20, 2009 now abandoned, which is a continuation of application Ser. No. 09/621,536 filed Jul. 21, 2000 now abandoned.

BACKGROUND OF THE INVENTION

This invention relates to a semiconductor integrated circuit device and a manufacturing method thereof, in particular, a technique effective when adapted for the so-called damascene method wherein an interconnection having copper as a main conductive layer is formed by cutting a groove in an insulating film, forming a copper film to be embedded in the groove and polishing by CMP (Chemical Mechanical Polishing).

Attendant on the recent tendency to miniaturizing an interconnection in a semiconductor integrated circuit device, a deterioration in the performance of the semiconductor integrated circuit device resulting from an increase in interconnection resistance or interconnection delay has come to be a problem. It has led to a serious problem particularly in a high-performance logic LSI as a factor for disturbing its performance. As described on pages 15 to 21 in the Preprint of 1993 VMIC (VLSI Multilevel Interconnection Conference), a method for forming an interconnection pattern in an interconnection groove by embedding a metal, which has copper (Cu) as a main conductive layer, in an interconnection groove formed in an insulating film and then removing the unnecessary portion of the metal outside the interconnection groove by chemical mechanical polishing (CMP) is now under investigation.

Described in Japanese Patent Application Laid-Open No. Hei 9-306915 is a technique which comprises forming an interconnection groove in a silicon oxide film on a semiconductor substrate, depositing a titanium nitride film and copper film by sputtering, filling the groove with copper by reflow, removing the copper film outside the groove by CMP and then heat treating in a hydrogen atmosphere. According to it, defects in the copper interconnection can be reduced by this technique.

Described in Japanese Patent Application Laid-Open No. Hei 10-56014 is a technique comprising polishing a material, which has a titanium nitride film and tungsten film and is formed over a semiconductor substrate, by CMP and subjecting the polished surface to plasma treatment with a halogen-based mixed gas. According to it, no interconnection short-circuit occurs even if micro scratches are formed by CMP.

Described in Japanese Patent Application Laid-Open No. Hei 10-56014 is a technique comprising forming a photosensitive SOG film over a base on which an interconnection is to be formed, forming an interconnection groove in the SOG film, forming a titanium nitride film, a copper film and a copper titanium alloy film, leaving the films only inside of the interconnection groove by CMP, and heat treating in an ammonia atmosphere to form a titanium nitride film over the surface layer of the copper titanium alloy film.

Described in Japanese Patent Application Laid-Open No. Hei 11-16912 is a technique of subjecting the surface of a through-hole or the like of a copper interconnection formed by the damascene method to plasma treatment in an atmosphere such as ammonia.

SUMMARY OF THE INVENTION

The present inventors have found the below-described problems in the interconnection forming technique, so called damascene method, which comprises forming the above-described interconnection groove, forming a metal film (ex. copper film) to be embedded in the groove and removing the copper film outside the interconnection groove by CMP.

When application of the above-described technique to high-performance logic LSI is considered, a reduction in interconnection resistance is one of the most important problems to be technically investigated. The present inventors therefore are now investigating copper as a metal constituting the interconnection. Copper tends to be diffused in a silicon oxide film, which is an insulating film, compared with another metal (ex. aluminum or tungsten) so that a barrier film covering the interconnection must be studied. As the barrier film in the interconnection groove, a titanium nitride film is studied. As a film (cap film) covering the upper portion of the interconnection, a silicon nitride film is studied. Reliability improvement of the interconnection by covering copper with the titanium nitride film lying on the interconnection groove and the silicon nitride film for capping the upper portion of the interconnection, thereby blocking diffusion of copper into the intrastratum insulating film (silicon oxide film) is under investigation.

When copper is employed as an interconnection material, TDDB (Time Dependence on Dielectric Breakdown) is markedly short compared with another metal material (ex. aluminum or tungsten). The TDDB test is one of acceleration test methods for evaluating the dielectric breakdown resistance between interconnections. According to it, time dependence on dielectric breakdown (lifetime) under the ordinary using condition can be estimated from the time dependence on dielectric breakdown under a higher electric field at a higher predetermined temperature than the ordinary using condition. The TDDB is a lifetime estimated from this TDDB test. The TDDB will be described later in detail.

FIG. 55 is a graph illustrating the measured data of TDDB characteristics of a copper interconnection, an aluminum interconnection and a tungsten interconnection. The TDDB and electric field strength are plotted along the ordinate and abscissa, respectively. When the characteristics (data A) of the aluminum interconnection and those (data B) of the tungsten interconnection are extrapolated, the TDDB at an electric field strength of 0.2 MV/cm (ordinary using condition) easily exceeds $3 \times 10^8$ sec (10 years), which is a development target of the present inventors. When the characteristics (data C) of the copper interconnection is extrapolated, on the other hand, there is almost no margin for the development target of 10 years. The aluminum interconnection is formed by film deposition and patterning by photolithography, while the tungsten interconnection is formed by the damascene method similar to the copper interconnection. The copper interconnection and tungsten interconnection differ only in the material. There is no difference in their structures. A marked difference in TDDB characteristics between these two materials suggests that it results from the difference in the interconnection material. Here, the TDDB characteristics are measured at 140° C.

A deterioration in the TDDB characteristics is generally presumed to result from a reduction in the withstand voltage between interconnections due to diffusion of copper, used as an interconnection material, into its surroundings. According to the investigation by the present inventors, however, it is mainly caused by drifting and diffusion of not copper atoms but ionized copper fed from copper oxide or copper silicide at an electric potential between interconnections. Copper is presumed to be mainly diffused from the interface between an insulating film having a copper interconnection formed thereon and a cap film. Described specifically, copper ions are formed from a copper compound such as copper oxide or copper silicide formed over the surface of the copper interconnection and then, such ionized copper drifts and is diffused along the interface between the insulating film wherein an interconnection is to be formed and a cap film by an electric field between interconnections. The copper atoms thus diffused are presumed to increase a leak current. The increase in the leak current heightens thermal stress and finally causes dielectric breakdown at a leak path, leading to the expiration of the lifetime. This mechanism will be described later in detail.

According to the investigation by the present inventors, formation of a multilayered interconnection layer causes a problem that there appears peeling between the lower interconnection and insulating film (cap film) formed thereover in the CMP step for forming an upper interconnection.

In addition, use of a silicon nitride film as a cap film on the copper interconnection is accompanied with the problem that a silicide is formed on the interface between copper and a silicon nitride film, causing an increase in the resistance of the copper interconnection.

An object of the present invention is to improve the dielectric breakdown resistance (reliability) of a copper interconnection formed by the damascene method.

Another object of the present invention is to suppress the generation of peeling of a cap film from an interconnection layer.

A further object of the present invention is to prevent an increase in the resistance of a copper interconnection when a silicon nitride film is employed as a cap film.

The above-described and the other objects and novel features of the present invention will be apparent from the description herein and accompanying drawings.

Among the inventions disclosed herein, representative ones will next be summarized simply.

In the present invention, the surface of each of an interconnection and an intrastratum insulating film (ex. silicon oxide film) in which the interconnection has been embedded is subjected to a reducing plasma after the CMP step but prior to the formation of a cap film (ex. silicon nitride film).

This treatment makes it possible to continuously form the interface between the interconnection and intrastratum insulating film, and the cap insulating film, leading to an improvement in the adhesion on the interface and, in turn, a marked improvement in the TDDB characteristics.

The summaries of the present invention will next be described.

In one aspect, the present invention provides a manufacturing method which comprises forming a first insulating film (ex. silicon oxide film) over a semiconductor substrate; forming a groove (interconnection groove) in the first insulating film; successively forming a first conductive film (a blocking film, for example, a titanium nitride film, for preventing diffusion of copper) and a second conductive film (copper film) to be embedded in the groove; polishing the second conductive film and first conductive film to form an interconnection in the groove; treating the surface of each of the first insulating film and interconnection to a plasma of reducing atmosphere; and then depositing a first insulating film and, over the interconnection, a second insulating film (a cap insulating film, for example, a silicon nitride film).

In the above-described method, as the plasma of reducing atmosphere, an ammonia ($NH_3$) plasma or a hydrogen ($H_2$) plasma can be employed. In addition, a mixed gas plasma of ammonia ($NH_3$) and a diluting gas (one or more gases selected from hydrogen ($H_2$), nitrogen ($N_2$), argon (Ar) and helium (He)) or a mixed gas plasma of hydrogen ($H_2$) and a diluting gas (one or more gases selected from ammonia ($NH_3$), nitrogen ($N_2$), argon (Ar) and helium (He)) can also be used. The mixed gas contains ammonia or hydrogen in an amount of at least 5%.

It is possible to form a silicon oxide film as the first insulating film, a copper film as the second conductive film and a silicon nitride film as the second insulating film. It is needless to say that copper may contain alloy elements, additives and/or impurities within an extent not impairing the properties of copper as an interconnection. In the embodiment, copper having a purity as high as 4N, that is, 99.99% or higher is usually employed.

After the polishing step but prior to plasma treatment, the surface of each of the first insulating film and interconnection can be washed with an acid. For washing, an aqueous solution of hydrogen fluoride (HF) or citric acid ($C(CH_2COOH)_2(OH)(COOH)$) can be employed.

In the polishing step, abrasive-grain-free chemical mechanical polishing can be adopted. Polishing can be conducted in three stages, that is, first polishing by abrasive-grain-free chemical mechanical polishing, second polishing by abrasive-grain-using chemical mechanical polishing, and third polishing by selective chemical mechanical polishing conducted at a 5:1 selection ratio of the first conductive film to the second conductive film.

In another aspect, the present invention provides a manufacturing method which comprises forming a first insulating film over a semiconductor substrate, forming a groove in the first insulating film, forming a first conductive film and a second conductive film to embed the groove therewith, polishing the second and first conductive films to form an interconnection in the groove, subjecting the surface of each of the first insulating film and interconnection to reducing treatment and nitriding treatment with a plasma, and then depositing a'second insulating film over the first insulating film and interconnection.

In this case, an ammonia ($NH_3$) plasma, or a mixed gas plasma of ammonia with one or more gases selected from hydrogen ($H_2$), nitrogen ($N_2$), argon (Ar) and helium (He) can be used as the plasma.

In a further aspect, the present invention provides a manufacturing method which comprises forming a first insulating film having a dielectric constant lower than that of a silicon oxide film contained in a protecting film (passivation film), forming a groove or opening in the first insulating film, treating the exposed surface of the first insulating film with a plasma of reducing atmosphere, depositing a first conductive film which covers the surface including the inside wall of the groove or opening, forming a second conductive film to be embedded in the groove or opening, and removing the second conductive film and first conductive film outside the groove or opening by polishing, thereby forming a conductive member in the groove or opening. For this method, the above-described plasma of reducing atmosphere can be used. The second insulating film may be formed over the first insulating film.

In a still further aspect, the present invention provides a semiconductor integrated circuit device which comprises a first insulating film, an interconnection embedded in the groove of the first insulating film, and a second insulating film formed over the first insulating film and interconnection, wherein a nitride film is formed on the interface between the first insulating film and interconnection, and second insulating film. In this device, the first insulating film, interconnection and second insulating film are a silicon oxide film, copper and a silicon nitride film, respectively. The nitrogen concentration in the nitride film becomes higher from the side of the first insulating film and interconnection toward the second insulating film.

In a still further aspect, the present invention provides a manufacturing method which comprises forming a first insulating film over a semiconductor substrate, forming a groove in the first insulating film, depositing a first conductive film over the first insulating film, forming a second conductive film to embed the groove therewith, polishing the second conductive film and first conductive film to form an interconnection in the groove, treating the surface of each of the first insulating film and interconnection with a plasma of reducing atmosphere, and continuously depositing a second insulating film over the first insulating film and interconnection while maintaining a pressure-reduced or inactive condition without exposing the semiconductor substrate to the atmosphere.

The summary of the other inventions of the present application will next be described briefly in items.

1. A manufacturing method of a semiconductor integrated circuit device, which comprises:
   (a) forming a first insulating film over a semiconductor substrate and forming a groove in the first insulating film,
   (b) depositing a first conductive film over the first insulating film and forming a second conductive film to embed the groove therewith,
   (c) removing the second conductive film and first conductive film over the first insulating film outside the groove and forming an interconnection in the groove,
   (d) treating the surface of each of the first insulating film and interconnection with a plasma of reducing atmosphere, and
   (e) after completion of the plasma treating step, depositing a second insulating film over the first insulating film and interconnection.

2. A manufacturing method according to the item 1, wherein the plasma of reducing atmosphere is an ammonia ($NH_3$) plasma or hydrogen ($H_2$) plasma.

3. A manufacturing method according to the item 1, wherein the plasma of reducing atmosphere is mixed gas plasma of ammonia ($NH_3$) and a diluting gas, and the diluting gas contains one or more gases selected from hydrogen ($H_2$), nitrogen ($N_2$), argon (Ar) and helium (He).

4. A manufacturing method according to the item 3, wherein the concentration of ammonia ($NH_3$) is at least 5 wt. % based on the mixed gas.

5. A manufacturing method according to the item 1, wherein the plasma of reducing atmosphere is a mixed gas plasma of hydrogen ($H_2$) and a diluting gas and the diluting gas contains one or more gases selected from ammonia ($NH_3$), nitrogen ($N_2$), argon (Ar) and helium (He).

6. A manufacturing method according to the item 5, wherein the concentration of hydrogen ($H_2$) is at least 5 wt. % based on the mixed gas.

7. A manufacturing method according to the item 1, wherein the first insulating film is a silicon oxide film and the second conductive film is made of copper.

8. A manufacturing method according to the item 7, wherein the second insulating film is a silicon nitride film.

9. A manufacturing method according to the item 8, wherein the plasma of reduced atmosphere is an ammonia ($NH_3$) plasma or a hydrogen ($H_2$) plasma, or a mixed gas plasma thereof with one or more gases selected from nitrogen ($N_2$), argon (Ar) and helium (He).

10. A manufacturing method according to the item 9, wherein the copper has a purity as high as 99.99% or greater.

11. A manufacturing method according to the item 1, which further comprises washing the surface of each of the first insulating film and interconnection with an acid between the steps (c) and (d).

12. A manufacturing method according to the item 11, wherein an aqueous solution of hydrogen fluoride (HF) or citric acid ($C(CH_2COOH)_2(OH)$ (COOH)) is used as the acid for washing.

13. A manufacturing method according to the item 12, wherein the first insulating film, the second conductive film and the second insulating film are a silicon oxide film, copper and a silicon nitride film, respectively.

14. A manufacturing method according to the item 12, wherein the plasma of reduced atmosphere is an ammonia ($NH_3$) plasma or a hydrogen ($H_2$) plasma, or a mixed gas plasma thereof with one or more gases selected from nitrogen ($N_2$), argon (Ar) and helium (He).

15. A manufacturing method according to the item 14, wherein the copper has a purity as high as 99.99% or greater.

16. A manufacturing method according to the item 1, wherein abrasive-grain-free chemical mechanical polishing is employed for the polishing in the step (c).

17. A manufacturing method according to the item 16, wherein the polishing in the step (c) is conducted in three stages, that is, first polishing by abrasive-grain-free chemical mechanical polishing, second polishing by abrasive-grain-using chemical mechanical polishing and third polishing by selective chemical mechanical polishing at a first conductive film:second conductive film selection ratio of at least 5.

18. A manufacturing method according to the item 17, wherein the first insulating film, the second conductive film and the second insulating film are a silicon oxide film, copper and a silicon nitride film, respectively.

19. A manufacturing method according to the item 18, wherein the plasma of reduced atmosphere is an ammonia ($NH_3$) plasma or a hydrogen ($H_2$) plasma, or a mixed gas plasma thereof with one or more gases selected from nitrogen ($N_2$), argon (Ar) and helium (He).

20. A manufacturing method according to the item 19, which further comprises, between the steps (c) and (d), washing the surface of each of the first insulating film and interconnection with an aqueous solution of hydrogen fluoride (HF) or citric acid ($C(CH_2COOH)_2(OH)(COOH)$).

21. A manufacturing method according to the item 20, wherein the copper has a purity as high as 99.99% or greater.

22. A manufacturing method of a semiconductor integrated circuit device, which comprises:
   (a) forming a first insulating film over a semiconductor substrate and forming a groove in the first insulating film,
   (b) depositing a first conductive film over the first insulating film and forming a second conductive film to embed the groove therewith,
   (c) removing the second conductive film and first conductive film over the first insulating film outside the groove by polishing and forming an interconnection in the groove,
   (d) subjecting the surface of each of the first insulating film and interconnection to reducing treatment and nitriding treatment with a plasma, and (e) depositing the second insulating film over the first insulating film and interconnection.

23. A manufacturing method according to the item 22 wherein the plasma is an ammonia ($NH_3$) plasma or a mixed gas plasma thereof with a diluting gas, and the diluting gas is at least one gas selected from hydrogen ($H_2$), nitrogen ($N_2$), argon (Ar) and helium (He).

24. A manufacturing method of a semiconductor integrated circuit having a first insulating film formed over a semiconductor substrate and a protecting film formed thereover for preventing the invasion of impurities, which comprises:
(a) forming a first insulating film having a dielectric constant lower than that of a silicon oxide film contained in the protecting film,
(b) forming a groove or opening in the first insulating film,
(c) treating the exposed surface of the first insulating film with a plasma of reducing atmosphere,
(d) depositing a first conductive film to cover the surface including the inside wall of the groove or opening and forming a second conductive film to embed therewith the groove or opening, and
(e) removing the second conductive film and first conductive film outside the groove or opening by polishing and forming a conductive member in the groove or opening.

25. A manufacturing method according to the item 24, wherein the plasma of reduced atmosphere is an ammonia ($NH_3$) plasma or a hydrogen ($H_2$) plasma, or a mixed gas plasma thereof with one or more gases selected from nitrogen ($N_2$), argon (Ar) and helium (He).

26. A manufacturing method according to the item 25, wherein a second insulating film is formed over the first insulating film, a groove or opening is formed in the first and second insulating films in the step (b) and the surface of the first insulating film exposed to the inside wall of the groove or opening is treated with a plasma of reducing atmosphere.

27. A semiconductor integrated circuit device having a first insulating film formed over a semiconductor substrate, an interconnection embedded in a groove of the first insulating film and a second insulating film formed over the first insulating film and interconnection, wherein a nitride film is formed on the interface between the first insulating film and interconnection, and the second insulating film.

28. A semiconductor integrated circuit device according to the item 27, wherein the first insulating film, interconnection and second insulating film are a silicon oxide film, copper and silicon nitride film, respectively.

29. A semiconductor integrated circuit device according to the item 28, wherein the nitrogen concentration of the nitride film becomes higher from the first insulating film and interconnection toward the second insulating film.

30. A manufacturing method according to the item 1, which further comprises, after the completion of the step (d), depositing the second insulating film over the first insulating film and interconnection continuously while maintaining a reduced-pressure or inactive condition without exposing the semiconductor substrate to the atmosphere.

BRIEF DESCRIPTION OF THE DRAWINGS

FIG. 3 is a fragmentary cross-sectional view of the semiconductor substrate illustrating the manufacturing method of Embodiment 1;

FIG. 4 is a fragmentary cross-sectional view of the semiconductor substrate illustrating the manufacturing method of Embodiment 1;

FIG. 6(*a*) is a plan view illustrating the manufacturing method of Embodiment 1 and FIG. 6(*b*) is a fragmentary cross-sectional view illustrating the manufacturing method of Embodiment 1;

FIGS. 22(*a*) to 22(*d*) are graphs each illustrating XPS data;

FIGS. 23(*a*) to 23(*d*) are graphs each illustrating XPS data;

FIGS. 25(*a*) to 25(*e*) are graphs each illustrating XPS data and FIG. 25(*f*) is a table showing a component ratio;

FIG. 37 is a fragmentary cross-sectional view of a semiconductor substrate illustrating the manufacturing method of a semiconductor integrated circuit device according to Embodiment 2;

FIG. 50 is a fragmentary cross-sectional view of a semiconductor substrate illustrating a manufacturing method of a semiconductor integrated circuit device according to another Embodiment;

FIG. 51 is a fragmentary cross-sectional view of a semiconductor substrate illustrating the manufacturing method of the semiconductor integrated circuit device according to another Embodiment;

FIG. 53 is a fragmentary cross-sectional view of a semiconductor substrate illustrating the manufacturing method of the semiconductor integrated circuit device according to another Embodiment;

FIG. 54 is a fragmentary cross-sectional view of a semiconductor substrate illustrating the manufacturing method of the semiconductor integrated circuit device according to another Embodiment;

FIGS. 56(a) to 56(c) illustrate a sample used in the present application for the measurement of TDDB, wherein FIG. 56(a) is a plan view, and FIGS. 56(b) and 56(c) are cross-sections taken along lines B–B' and C–C' of FIG. 56(a), respectively;

DETAILED DESCRIPTION OF THE INVENTION

The general meaning of each of the terms used in this application will next be described.

Figure 56A:
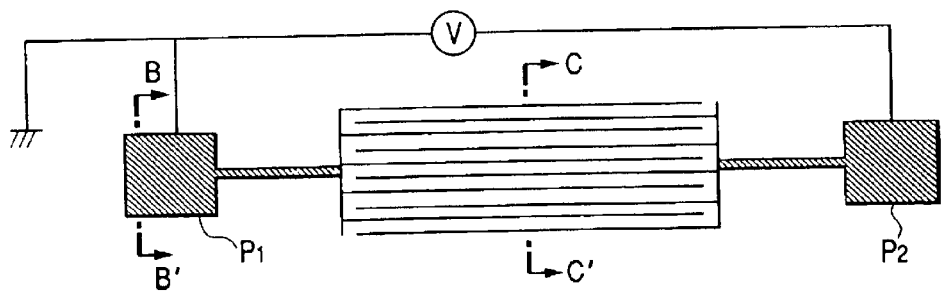
Figure 56B:
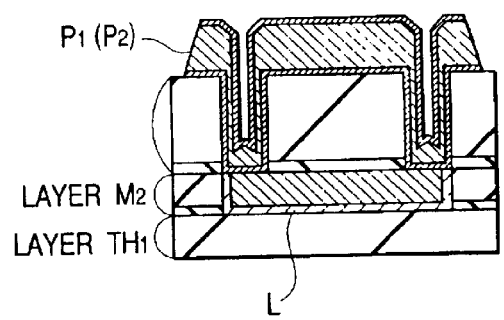
Figure 56C:
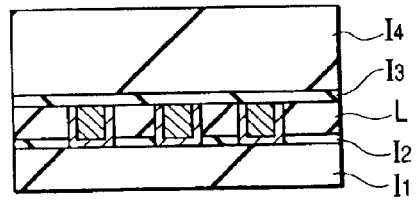
Figure 57:
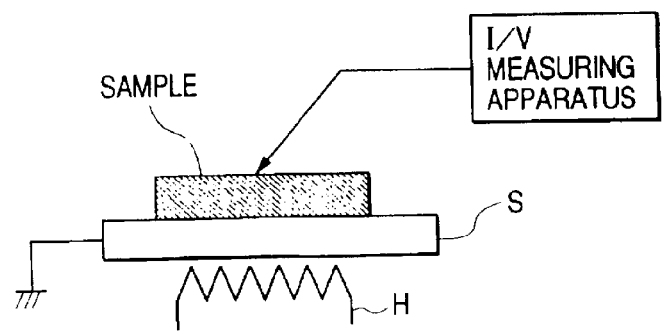
FIG. 57 is a schematic view illustrating the summary of the measurement.
Figure 58:
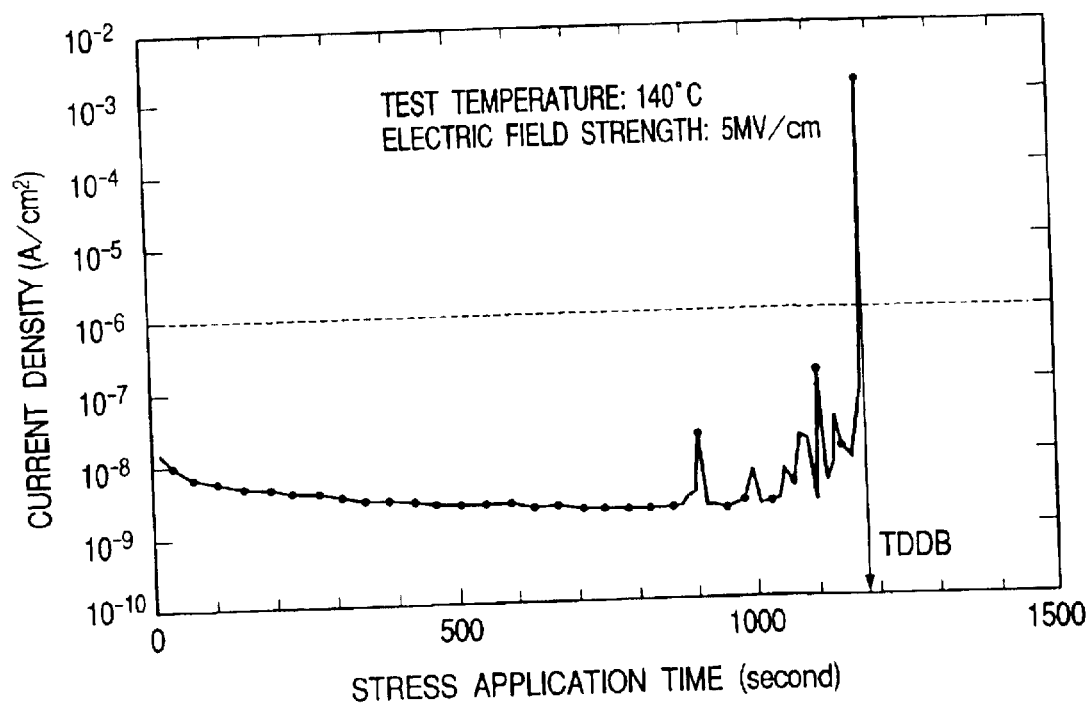
FIG. 58 illustrates one example of measuring results of current and voltage.

The term "TDDB" as used herein means time (lifetime) determined by applying a relatively high voltage between electrodes under measuring conditions of a predetermined temperature (ex. 140° C.), drawing a graph wherein time from application of voltage to dielectric breakdown is plotted against applied electric field, and extrapolating the practical electric field strength (ex. 0.2 MV/cm) in the graph. FIG. 56 illustrates a sample used in the present application for the measurement of TDDB, wherein FIG. 56(a) is a plan view, and FIGS. 56(b) and 56(c) are crosssections taken along lines B–B' and C–C' of FIG. 56(a), respectively. This sample can be formed practically in a TEG (Test Equipment Group) region of a wafer. As illustrated in FIG. 56, a pair of comb-like interconnections L are formed in the second interconnection layer M2 and are connected with pats P1,P2 of the uppermost layer. An electric current is measured by applying an electric field between these comb-like interconnections L. The pads 1,2 are measuring terminals. The width, distance between any two adjacent interconnections and thickness of the comb-like interconnections L are each 0.5 $\mu$m. The length of the interconnection is formed to $1.58 \times 10^5$ $\mu$m. FIG. 57 is a schematic view illustrating the summary of measurement. The sample is supported on a measuring stage S and a current-voltage measuring apparatus (I/V measuring apparatus) is connected between the pads P1 and P2. The sample stage S is heated by a heater H to adjust the temperature of the sample to 140° C. FIG. 58 shows one example of the measuring results of current-voltage under the conditions of the sample temperature of 140° C. and electric field strength of 5 MV/cm. Although TDDB is measured by either one of the constant voltage stress method and low current stress method, the former one wherein an average electric field applied to an insulating film shows a fixed value is employed in the present application. After application of voltage, the current density decreases with the passage of time and then, a drastic increase in the current (dielectric breakdown) is observed. Here, the time until the leak current density reaches 1 $\mu$A/cm$^2$ is designated as TDDB (the TDDB at 5 MV/cm). The term "TDDB" as used herein means the breakdown time (lifetime) at 0.2 MV/cm unless otherwise specifically referred to, but in a broader sense, it is sometimes used as a time until breakdown at a preliminarily designated electric field strength. Unless otherwise specifically described, the TDDB means that at the sample temperature of 140° C. The TDDB is measured using the above-described comb-like interconnections L, but it is needless to say that it reflects the breakdown lifetime between actual interconnections.

The term "plasma treatment" as used herein means treatment of exposing the surface of a substrate or, when a member such as insulating film or metal film is formed on the substrate, the surface of the member to the circumstance under plasma condition and giving chemical or mechanical (bombardment) action of the plasma to the surface. Plasma is usually formed by, while supplementing a specific gas (treating gas) as needed in a reaction chamber substituted with the gas, ionizing the gas by the action of high-frequency electric field or the like. In practice, however, it is impossible to completely substitute the chamber with the treating gas. In the present application, therefore, the term "ammonia plasma" does not indicate complete ammonia plasma and existence of impurity gases (nitrogen, oxygen, carbon dioxide, water vapor and/or the like) contained in the plasma is permitted. It is needless to say that the plasma may contain a diluting gas or additive gas.

The term "plasma of reducing atmosphere" as used herein means the plasma circumstance wherein reactive radicals, ions, atoms or molecules having reducing action, that is, oxygen pulling action, predominantly exist. Radicals and ions embrace atomic or molecular radicals and ions. In the plasma circumstance, not only single reactive one but also plural reactive ones may be contained. For example, a hydrogen radical and NH$_2$ radical may coexist in the circumstance.

The term "made of copper" as used herein means that copper is used as a main component. High-purity copper inevitably contains impurities so that a member made of copper is permitted to contain additives or impurities. The term "made of high-purity copper" as used herein means that copper is a high-purity material (ex. 4N (99.99%) and contains any impurities of about 0.01%. This will apply to, not only copper, but also another metal (titanium nitride, or the like).

The term "gas concentration" as used herein means a flow rate of a gas in the mass flow. Described specifically, when the concentration of gas A in a mixture of gas A and gas B is 5%, it means Fa/(Fa+Fb)=0.05 wherein Fa represents the mass flow rate of gas A and Fb represents the mass flow rate of gas B.

The term "polishing liquid (slurry)" usually means a suspension obtained by mixing abrasive grains in a chemical etching agent, but in this application, it embraces a polishing liquid free of an abrasive grain for the convenience sake of this invention.

The term "abrasive grains (slurry grains)" usually means powder such as alumina or silica contained in a slurry.

The term "chemical mechanical polishing (CMP)" usually means polishing of a surface to be polished by relatively moving a polishing pad, which is made of a relatively soft cloth-like sheet material, in a surface direction under the condition brought into contact with the polishing pad, while supplying a slurry. This invention also embraces CML (Chemical Mechanical Lapping) wherein polishing is conducted by moving a surface to be polished relative to the surface of a hard abrasive.

The term "abrasive-grain-free chemical mechanical polishing" means chemical mechanical polishing using a slurry having a weight concentration of the abrasive grains less than 0.5%, while the term "abrasive-grain-using chemical mechanical polishing" means chemical mechanical polishing using a slurry having a weight concentration of the abrasive grain not less than 0.5%. They are however relative naming. In the case where chemical mechanical polishing is conducted using abrasive grains in each of the first and second steps, that in the first step is sometimes called abrasive-grain-free chemical mechanical polishing if the polishing concentration of the first step is smaller by at least one figure, desirably at least 2 figures, than that of the second step.

The term "anticorrosive" means a chemical for preventing or suppressing the progress of polishing by CMP by forming an anticorrosive and/or hydrophobic protecting film on the metal surface and benzotriazole (BTA) is usually employed as the chemical (refer to Japanese Patent Application Laid-Open No. HEI 8-64594, for further details).

The term "conductive barrier layer" is usually a layer for preventing atoms or ions, which constitute an embedded interconnection material, from being transported (including, being diffused) and thereby having an adverse effect on an underlying element and it means a layer made of a conductive material having a comparatively higher conductivity than an insulating film and having diffusion-inhibiting properties, for example, a metal such as Ti, a metal nitride such as TiN, a conductive oxide or a conductive nitride.

The term "selective removal", "selective polishing", "selective etching" or "selective chemical mechanical polishing" means that having a selection ratio of at least 5.

The term "embedded interconnection" usually means an interconnection formed by an interconnection forming technique such as single damascene or dual damascene, more specifically, by embedding a conductive film inside of a groove or the like, which has been formed in an insulating film, and then removing an unnecessary portion of the conductive film on the insulating film.

With regards to the selection ratio, when a selection ratio of "A to B" (or "A relative to B") is X, it means, if the case of polishing rate is taken, that the selection ratio becomes X according to the calculation of a polishing rate of A based on that of B.

In the below-described embodiments, descriptions on the same or like parts will essentially be omitted unless particularly necessary.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described examples, when a reference is made to the number of elements (including the number, value, amount and range), the number of elements is not limited to a specific number but can be not greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential.

Similarly, in the below-described embodiments, when a reference is made to the shape or positional relationship of the constituting elements, that substantially analogous or similar to it is also embraced. This also applies to the above-described value and range.

The term "semiconductor integrated circuit device" as used herein means not only that formed over a single crystal silicon substrate but also that formed over an SOI (silicon on insulator) substrate, a substrate for the production of TFT (Thin Film Transistor) liquid crystals or the like unless otherwise specifically indicated. The term "wafer" means a single crystal silicon substrate (substantially disk-shape in general), SOS substrate, glass substrate, another insulating, semi-insulating or semiconductor substrate or a composite substrate thereof, which is employed for the fabrication of a semiconductor integrated circuit device.

The embodiments of the present invention will next be described specifically based on the accompanying drawings. In all the drawings for describing the embodiments, like members of a function will be identified by like reference numerals and overlapping descriptions will be omitted.

Embodiment 1

A manufacturing method of COM-LSI according to Embodiment 1 of the present invention will next be described in the order of steps based on FIGS. 1 to 19.

Figure 1:
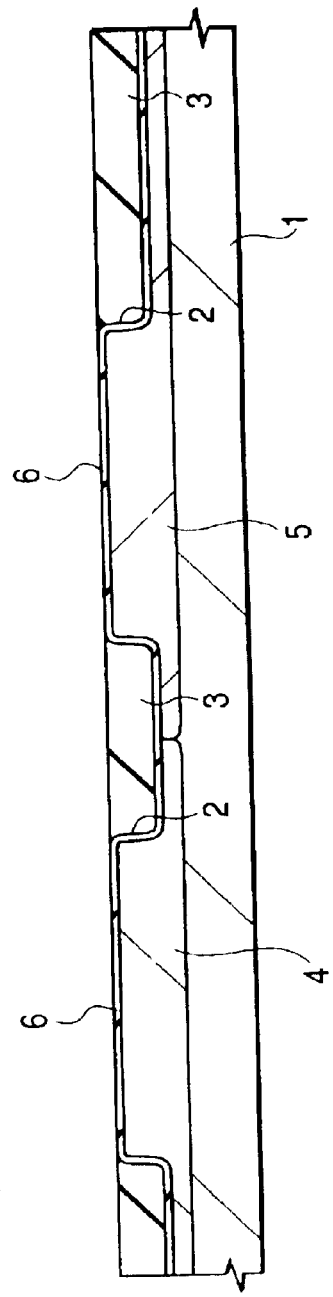
FIG. 1 is a fragmentary cross-sectional view of a semiconductor substrate illustrating a manufacturing method of a semiconductor integrated circuit device according to one embodiment (Embodiment 1) of the present invention.

As illustrated in FIG. 1, after formation of an element isolating groove 2 of about 350 nm deep is formed, by photolithography and dry etching, in a semiconductor substrate (which will hereinafter be called "substrate") 1 having a specific resistance of about 1 to 10 Ωcm and being made of p-type single crystal silicon, a silicon oxide film 3 is deposited, by CVD, over the substrate 1 including the inside of the groove. The surface of the silicon oxide film 3 over the groove is then flattened by chemical mechanical polishing (CMP), followed by ion implantation of p-type impurities (boron) and n-type impurities (phosphorus) to the substrate 1, whereby a p-type well 4 and an n-type well 5 are formed. Then, by steam oxidation of the substrate 1, a gate oxide film 6 of about 6 nm thick is formed over the surface of each of the p-type well 4 and n-type well 5.

Figure 2:
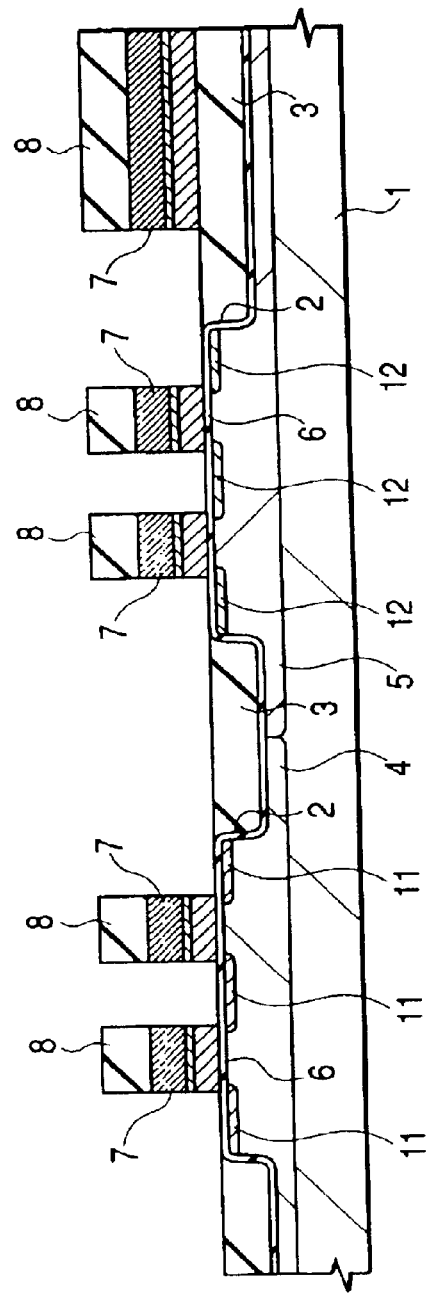
FIG. 2 is a fragmentary cross-sectional view of the semiconductor substrate illustrating the manufacturing method of Embodiment 1.

As illustrated in FIG. 2, a gate electrode 7 having a low-resistance polycrystalline silicon film, WN (tungsten nitride) film and W (tungsten) film is formed over the gate oxide film 6. The polycrystalline silicon film can be formed by CVD, while the WN and W films can be formed by sputtering. The gate electrode 7 is formed by patterning of these deposited films. The gate electrode 7 may be formed by the laminate film of a low-resistance polycrystalline silicon film and W silicide film. After the formation of the gate electrode, $n^-$ type semiconductor region 11 of a low impurity concentration and a $p^-$ type semiconductor region 12 of a low impurity concentration are formed in the p-type well 4 and n-type well 5, respectively, by ion implantation.

As illustrated in FIG. 3, a side wall spacer 13 is then formed on the side wall of the gate electrode 7, for example, by depositing a silicon nitride film by CVD and anisotropic etching of the film. Ion implantation is thereafter conducted, whereby $n^+$ type semiconductor region 14 (source, drain) having a high impurity concentration and $p^+$ type semiconductor region 15 (source and drain) having a high impurity concentration are formed in the p-type well 4 and n-type well 5, respectively. Examples of the n-type impurities include phosphorus and arsenic, while those of the p-type impurities include boron. Then, a metal film such as titanium or cobalt is deposited, followed by heat treatment. By the so-called silicide method to deposit a metal film such as titanium or cobalt and after heat treatment, remove the unreacted metal film, a silicide layer 9 is formed on the surface of each of the $n^+$ type semiconductor region 14 (source, drain) and $p^+$ type semiconductor region 15 (source, drain). By the steps so far mentioned, an n-channel type MISFETQn and p-channel type MISFETQp are completed.

As illustrated in FIG. 4, a silicon oxide film 18 is deposited over the substrate 1 by CVD, followed by dry etching of the silicon oxide film 18 with a photoresist film as a mask, whereby a contact hole 20 and a contact hole 21 are formed over the $n^+$ type semiconductor region 14 (source, drain) and $p^+$ type semiconductor region 15 (source, drain), respectively. At the same time, a contact hole 22 is also formed over the gate electrode 7.

The silicon oxide film 18 is formed from a film having high reflow properties capable of embedding a narrow space between gate electrodes 7,7, for example, BPSG (Boron-doped Phospho Silicate Glass) film. Alternatively, an SOG (Spin On Glass) film formed by spin coating can be used.

Then, a plug 23 is formed inside of each of the contact holes 20, 21 and 22, for example, by depositing a TiN film and a W film by CVD over the silicon oxide film 18 including the inside of each of the contact holes 20, 21 and 22, and removing the unnecessary portion of each of the TiN film and W film over the silicon oxide film 18 by chemical mechanical polishing (CMP) or etching back to leave these films only inside of each of the contact holes 20, 21 and 22.

Figure 5:
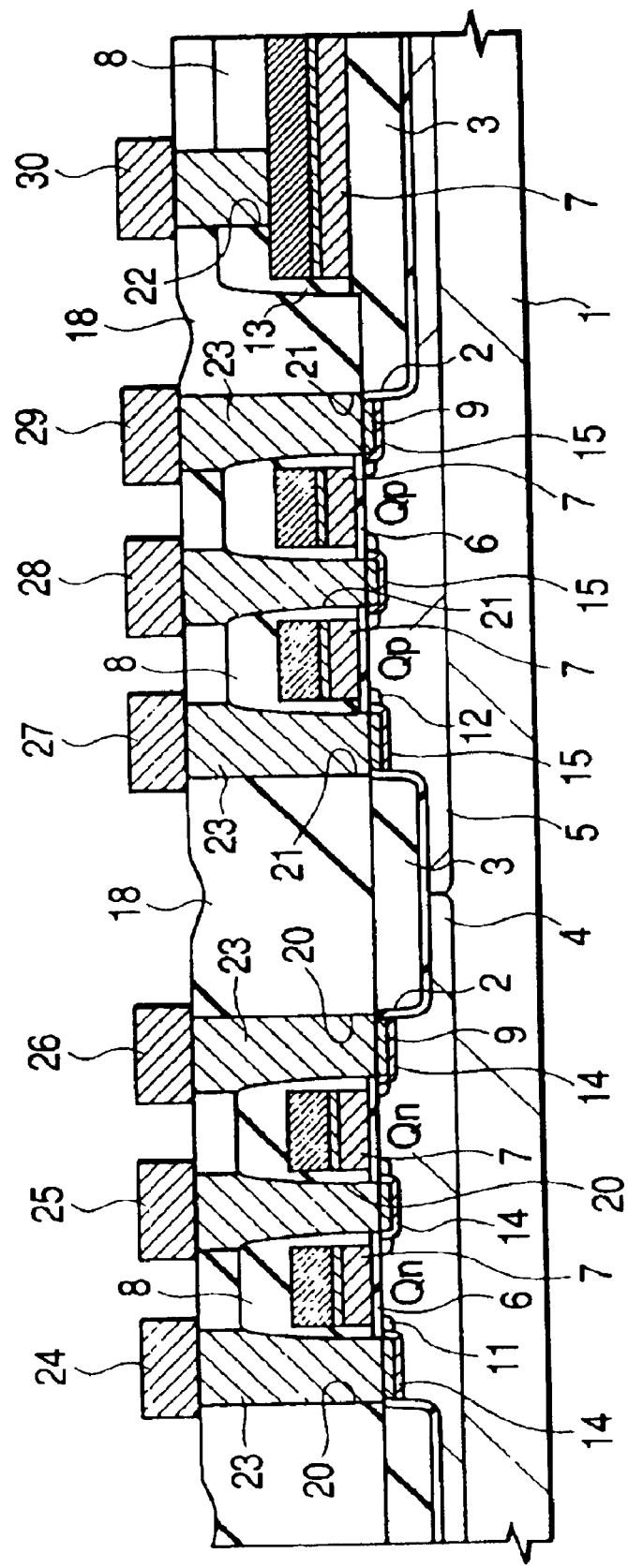
FIG. 5 is a fragmentary cross-sectional view of the semiconductor substrate illustrating the manufacturing method of Embodiment 1.

As illustrated in FIG. 5, W interconnections 24 to 30, which are to be a first interconnection layer, are formed over the silicon oxide film 18, for example, by depositing a W film over the silicon oxide film 18 by sputtering, and dry etching this W film with a photoresist film as a mask. The W interconnections 24 to 30 of the first layer are electrically connected with the source and drain ($n^+$ type semiconductor regions) of the n-channel type MISFETQn, the source and drain ($p^+$ type semiconductor regions) of the p-channel type MISFETQp or the gate electrode 7 through the contact holes 20, 21 and 22.

As illustrated in FIGS. 6(a) and 6(b), a silicon oxide film 31 is deposited over the W interconnections 24 to 30 of the first layer. After through-holes 32 to 36 are formed in the silicon oxide film 31 by dry etching with a photoresist film as a mask, a plug 37 is formed inside of the through-holes 32 to 36.

The silicon oxide film 31 is deposited, for example, by CVD using ozone (or oxygen) and tetraethoxysilane (TEOS) as source gases. The plug 37 is formed, for example, from a W film in a similar manner to that employed for the formation of the plug 23 inside of each of the contact holes 20, 21 and 22.

Figure 7A:
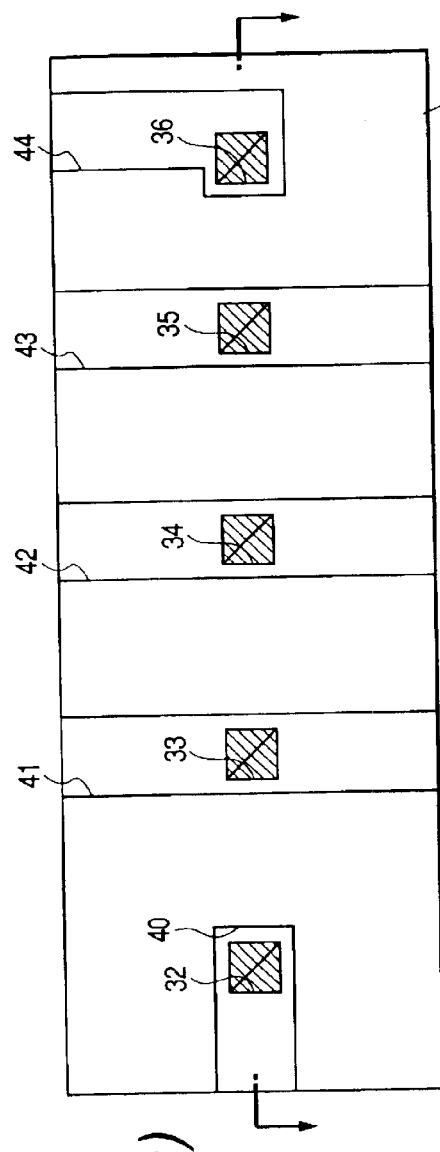
FIG. 7(*a*) is a plan view illustrating the manufacturing method of Embodiment 1 and FIG. 7(*b*) is a fragmentary cross-sectional view illustrating the manufacturing method of Embodiment 1.
Figure 7B:
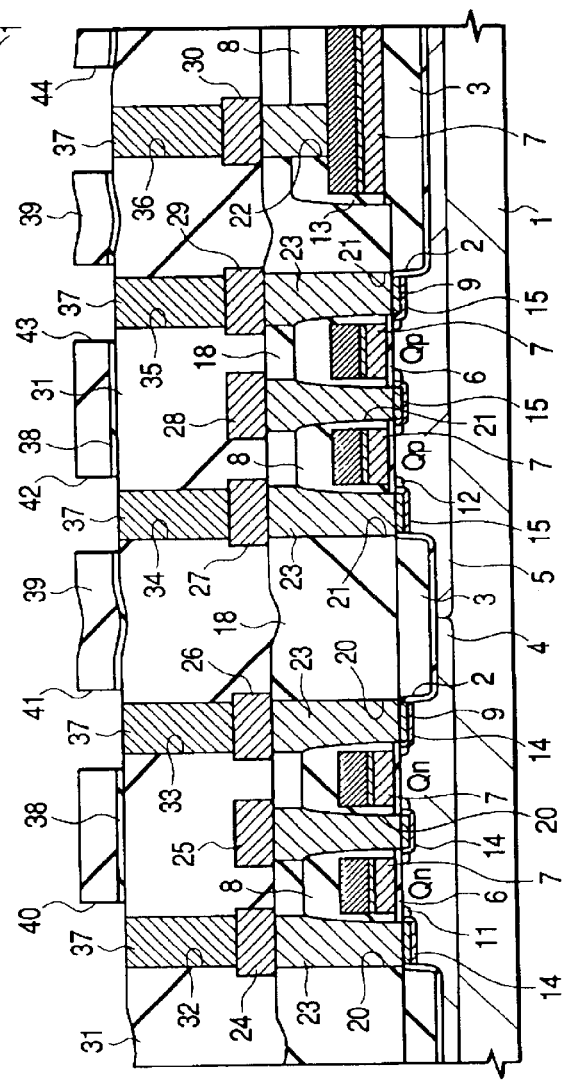

As illustrated in FIGS. 7(a) and 7(b), a thin silicon nitride film 38 of about 50 nm thick is deposited over the silicon oxide film 31 by plasma CVD, followed by deposition of a silicon oxide film 39 of about 450 nm thick over the silicon nitride film 38 by plasma CVD. The silicon oxide film 39 and silicon nitride film 38 over the through-holes 32 to 36 are removed by dry etching with a photoresist film as a mask, whereby interconnection grooves 40 to 44 are formed.

The interconnection grooves 40 to 44 are formed by selectively etching the silicon oxide film 39 using the silicon nitride film 38 as an etching stopper and then etching the silicon nitride film 38. It is possible to control the depth of each of the interconnection grooves 40 to 44 with good precision by forming, in advance, the thin silicon nitride film 38 below the silicon oxide film 39 in which the interconnection grooves 40 to 44 are to be formed, stopping etching once at the surface of the silicon nitride film 38 and then etching the silicon nitride film 38.

The Cu-embedded interconnections to be a second interconnection layer are formed inside of the interconnection grooves 40 to 44 by the following process.

Figure 8:
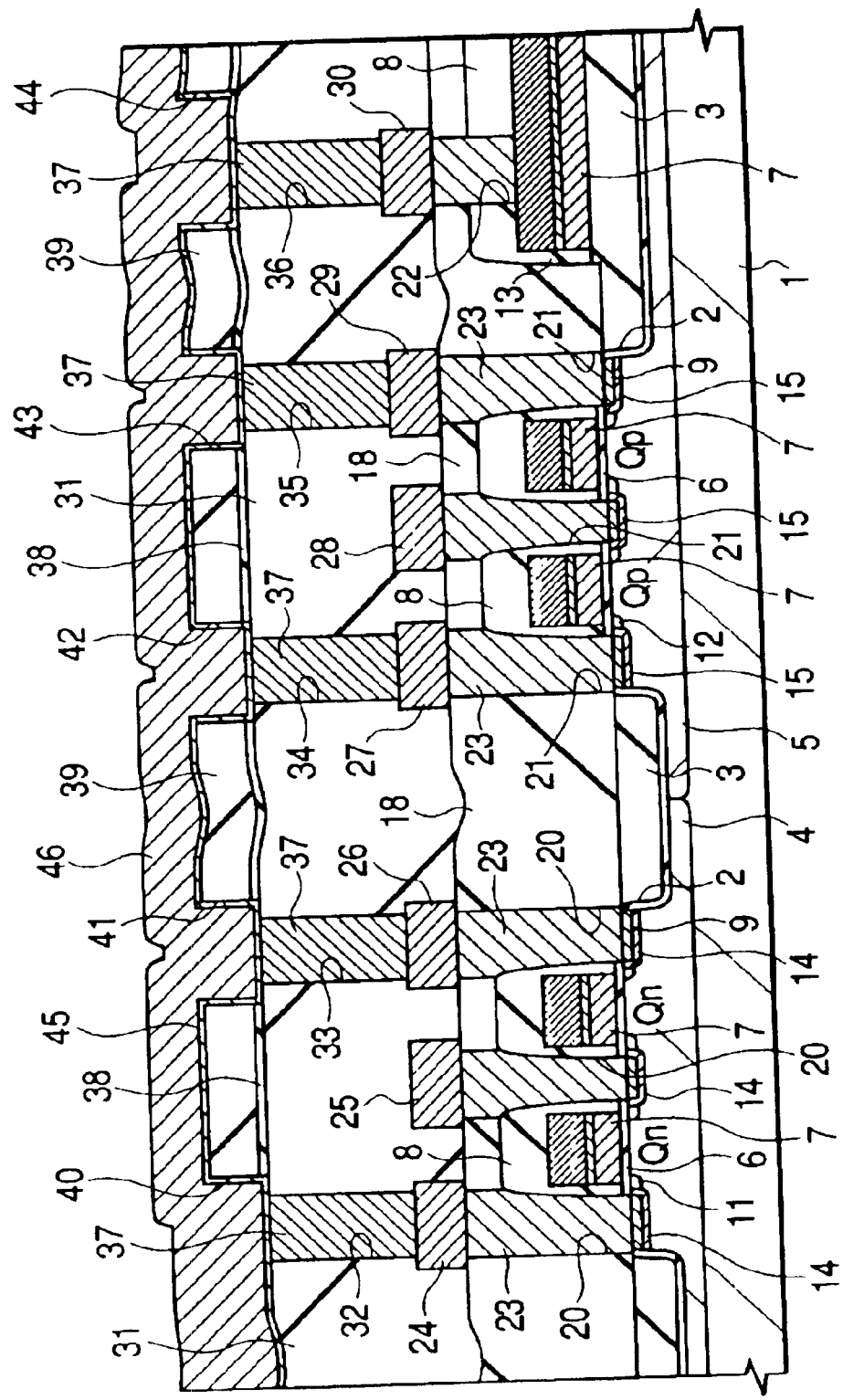
FIG. 8 is a fragmentary cross-sectional view of the semiconductor substrate illustrating the manufacturing method of Embodiment 1.

As illustrated in FIG. 8, after deposition, by sputtering, of a thin TiN (titanium nitride) film 45 of about 50 nm thick over the silicon oxide film 39 including the insides of the interconnection grooves 40 to 44, a Cu film 46 sufficiently thicker (ex. about 800 nm) than the depth of each of the interconnection grooves 40 to 44 is deposited over the TiN film 45 by sputtering. Then, the substrate 1 is heat treated in a non-oxidizing atmosphere (ex. hydrogen atmosphere) of about 475° C. to cause reflow of the Cu film 46, whereby the Cu film 46 is fully embedded inside of each of the interconnection grooves 40 to 44.

Here, the Cu film 46 is formed by sputtering and it is embedded in the groove by reflow. Alternatively, a thin Cu film can be formed by sputtering, followed by the formation of another Cu film corresponding to the Cu film 46 by plating.

Owing to the diffusing tendency of Cu in the silicon oxide film, when the Cu interconnection is formed inside of each of the interconnection grooves 40 to 44, Cu diffuses into the silicon oxide film 39, thereby causing a short-circuit between interconnections or an increase in the parasitic capacitance between interconnections due to an increase in the dielectric constant of the silicon oxide film 39. In addition, Cu is poor in adhesion to an insulating material such as silicon oxide so that it tends to cause peeling at the interface with the silicon oxide film 39.

Accordingly, when a Cu interconnection is formed inside of each of the interconnection grooves 40 to 44, it is necessary to dispose a barrier layer which can suppress diffusion of Cu between the silicon oxide film 39 and Cu film 46 and at the same time, has high adhesion to an insulating material. Furthermore, when the Cu film 46 is embedded inside of each of the interconnection grooves 40 to 44 by the reflow sputtering method as described above, the barrier layer is required to have properties to improve the wetness of the Cu film 46 upon reflow.

High melting-point metal nitrides, such as TiN, WN and: TaN (tantalum nitride), which hardly react with Cu are suited as such a barrier layer. It is also possible to use as the barrier layer a high-melting point metal nitride added with Si (silicon) or a high-melting-point metal such as Ta, Ti, W or TiW alloy which hardly reacts with Cu.

The formation process of the Cu interconnection which will be described below can be adapted to not only the formation of a Cu interconnection with a high-purity Cu film but also to the formation of a Cu interconnection with an alloy film having Cu as a main component.

Figure 9:
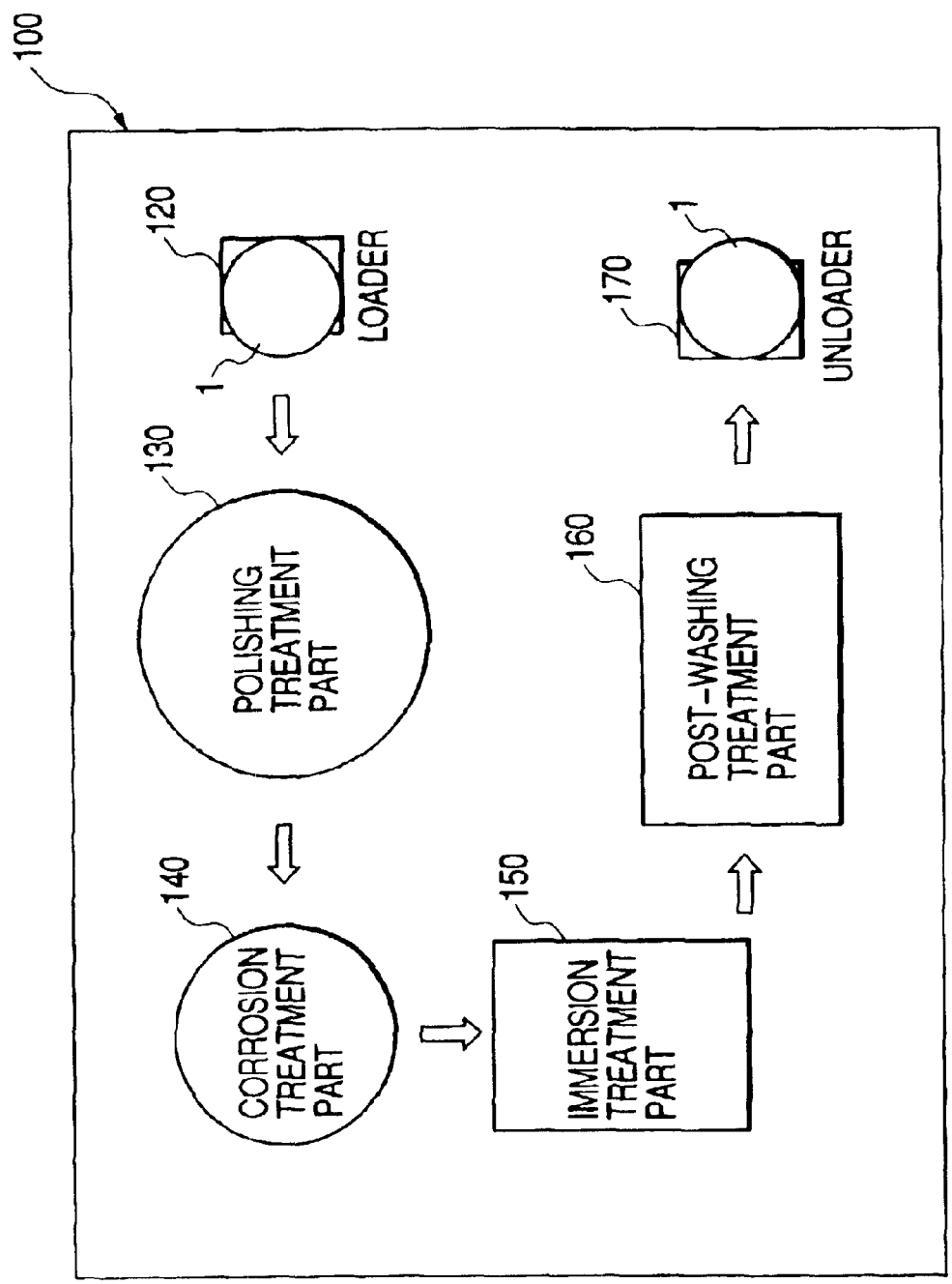
FIG. 9 is a schematic view illustrating one example of the whole constitution of a.CMP apparatus used for the formation of a Cu-embedded interconnection.

FIG. 9 is a schematic view illustrating a single-wafer type CMP apparatus 100 to be used for the polishing of the Cu film 46. This CMP apparatus 100 is equipped with a loader 120 for accommodating therein a plurality of the substrates 1 each having the Cu film 46 formed on the surface thereof, a polishing treatment part 130 for polishing and flattening the Cu film 46, a corrosion treatment part 140 for subjecting the surface of the substrate 1 to corrosion treatment after completion of polishing, an immersion treatment part 150 for maintaining the substrate 1 to have a wet surface until the post washing of the substrate 1 after completion of the corrosion treatment, a post-washing treatment part 160 for post-washing the substrate 1 after completion of the corrosion treatment and an unloader 170 for accommodating therein a plurality of substrates 1 after completion of post-washing.

Figure 10:
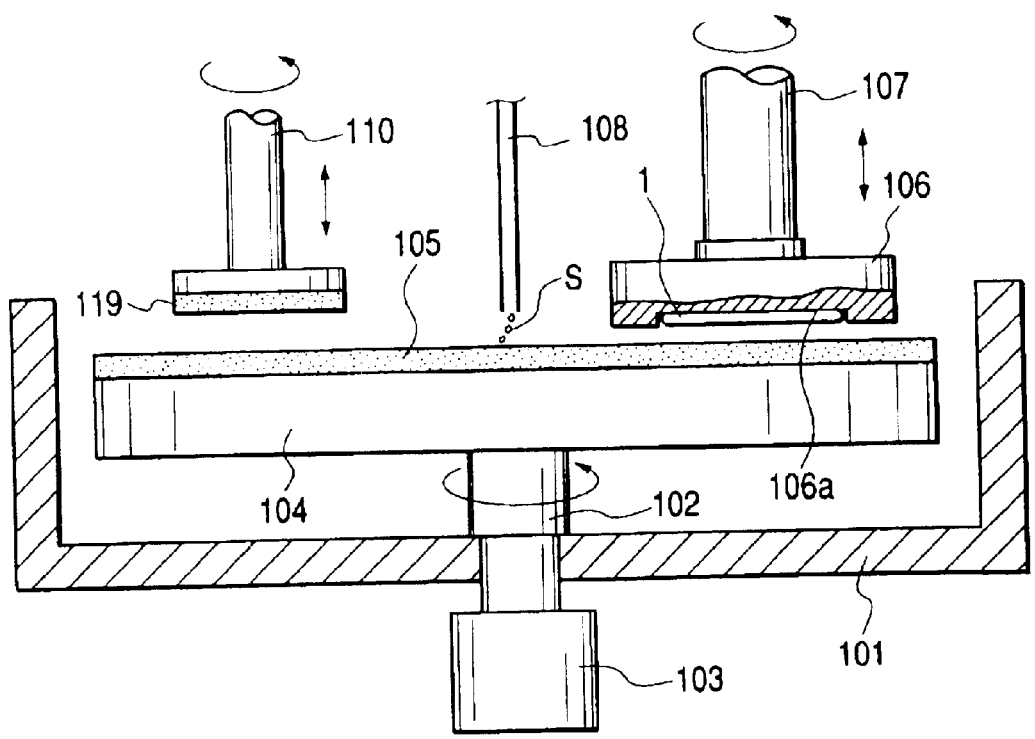
FIG. 10 is a schematic view illustrating a part of the CMP apparatus used for the formation of a Cu-embedded interconnection.

The polishing treatment part 130 of the CMP apparatus 100 has, as illustrated in FIG. 10, a box-like body 101 which is opened at the top thereof. A rotating shaft 102 attached to this box-like body 101 has, at its upper end portion, a polishing disc (platen) 104 to be turned and driven by a motor 103. This polishing disc 104 has, on the surface thereof, a polishing pad 105 formed by uniformly bonding thereto a porous synthetic resin.

In addition, this polishing treatment part 130 is equipped with a wafer carrier 106 for supporting the substrate 1. A driving shaft 107 equipped with the wafer carrier 106 is turned and driven by a motor (not illustrated), integrated with the wafer carrier 106, and at the same time, moved vertically above the polishing disc 104.

The substrate 1 is supported by the wafer carrier 106 by a vacuum adsorption mechanism (not illustrated) disposed in the wafer carrier 106, with the main surface, that is, a surface to be polished, down. The wafer carrier 106 has, at the lower end thereof, a concave portion 106a in which the substrate 1 is to be accommodated. When the substrate 1 is placed in this concave portion 106a, the surface to be polished becomes the substantially same level with or slightly protruded from the bottom surface of the wafer carrier 106.

Above the polishing disc 104, a slurry feeding pipe 108 is disposed for feeding a polishing slurry (S) between the surface of the polishing pad 105 and the surface of the substrate 1 to be polished and by the polishing slurry (S) fed from the lower end of the pipe, the surface of the substrate 1 is chemically and mechanically polished. As the polishing slurry (S), usable is that obtained by dispersing or dissolving main components, for example, abrasive grains such as alumina and an oxidizing agent such as hydrogen peroxide or an aqueous solution of ferric nitrate, in water.

This polishing treatment part 130 is equipped with a dresser 109, which is a tool for smoothening (dressing) the surface of the polishing pad 105. This dresser 109 is installed to the lower end of a driving shaft 110 which moves vertically above the polishing disc 104 and is turned and driven by a motor (not illustrated).

After completion of the polishing, the surface of the substrate 1 is subjected to corrosion treatment at the corrosion treatment part 140. The corrosion treatment part 140 has a similar structure to that of the polishing treatment part 130. First, the main surface of the substrate 1 is pressed against a polishing pad attached onto the surface of a polishing disc (platen) and a polishing slurry is mechanically removed. Then, a chemical liquid containing an anticorrosive such as benzotriazole (BTA) is fed to the main surface of the substrate 1, whereby a hydrophobic protecting film is formed on the surface portion of the Cu interconnection formed on the main surface of the substrate 1.

Figure 11:
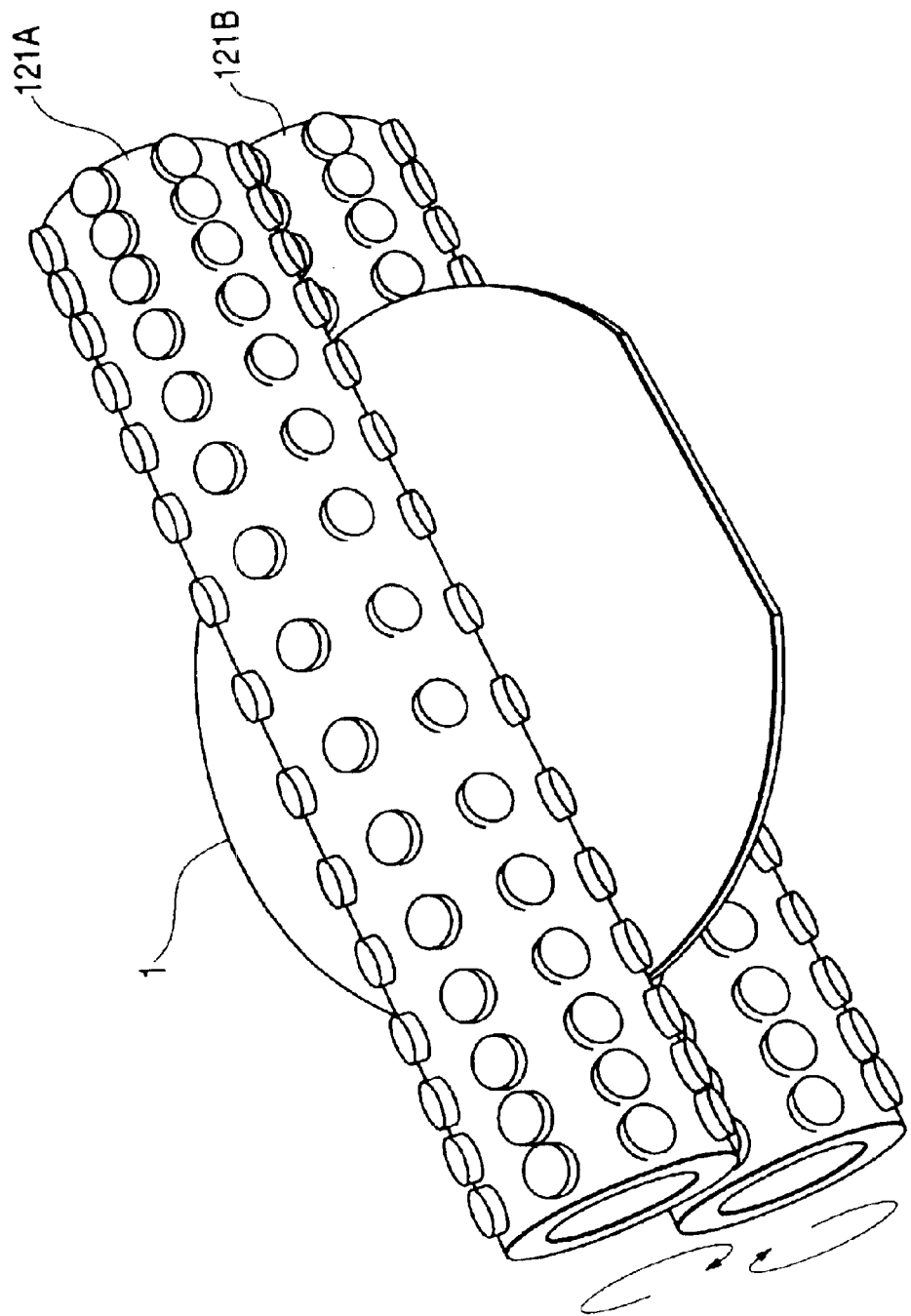
FIG. 11 is a perspective view illustrating a scrub washing method of a wafer.

Mechanical washing (pre-washing) of the polishing slurry is conducted, for example, as shown in FIG. 11. The both sides of the substrate 1 turned within a horizontal plane are sandwiched by cylindrical brushes 121A,121B made of a porous synthetic resin such as PVA (polyvinyl alcohol) and are washed simultaneously while turning the brushes 121A, 121B within a plane vertical to the surface of the substrate 1. Upon corrosion treatment after pre-washing, the oxidizing agent in the polishing slurry adhered to the main surface of the substrate 1 at the polishing treatment part 130 is removed sufficiently by conducting pure water scrub washing, pure water ultrasonic washing, pure water running water washing or pure water spin washing as needed prior to or simultaneously with the corrosion treatment, whereby a hydrophobic protecting film is formed under the conditions substantially free from the action of the oxidizing agent.

After completion of the corrosion treatment, the substrate 1 is temporarily stored in the immersion treatment part 150 in order to prevent the surface from being dried. The immersion treatment part 150 serves for maintaining the surface of the substrate 1, which has finished corrosion treatment, to be wet until post-washing and it has such a structure that the predetermined number of the substrates 1 are immersed and stored in an immersion tank (storage container) from which pure water is overflowed. Corrosion of the Cu interconnections 28 to 30 can be prevented more completely by supplying the immersion tank with pure water cooled to a temperature low enough to substantially terminate the progress of electrochemical corrosion of the Cu interconnections 28 to 30.

In order to prevent drying of the substrate 1, it is possible to adopt another method such as supply of pure water shower, insofar as the surface of the substrate 1 is kept wet by the method.

The substrate 1 transferred to the post-washing treatment part 160 is subjected to post-washing at once with the wet state of the surface being maintained. In this part, scrub washing (or brush washing) of the surface of the substrate 1 is carried out while supplying thereto a weakly alkaline chemical liquid such as a washing liquid containing $NH_4OH$ to neutralize the oxidizing agent and then, foreign particles formed upon etching are removed by an aqueous solution of hydrofluoric acid fed onto the surface of the substrate 1. Prior to or simultaneously with the scrub washing, the surface of the substrate 1 can be subjected to pure water scrub washing, pure water ultrasonic washing, running pure water washing or pure water spin washing or the opposite surface of the substrate 1 can be subjected to pure water scrub washing.

After completion of the post-washing treatment, the substrate 1 is rinsed with pure water, spin-dried and accommodated in the unloader 170. A plurality of the substrates 1 are transferred in one lot to the subsequent step.

Figure 12:
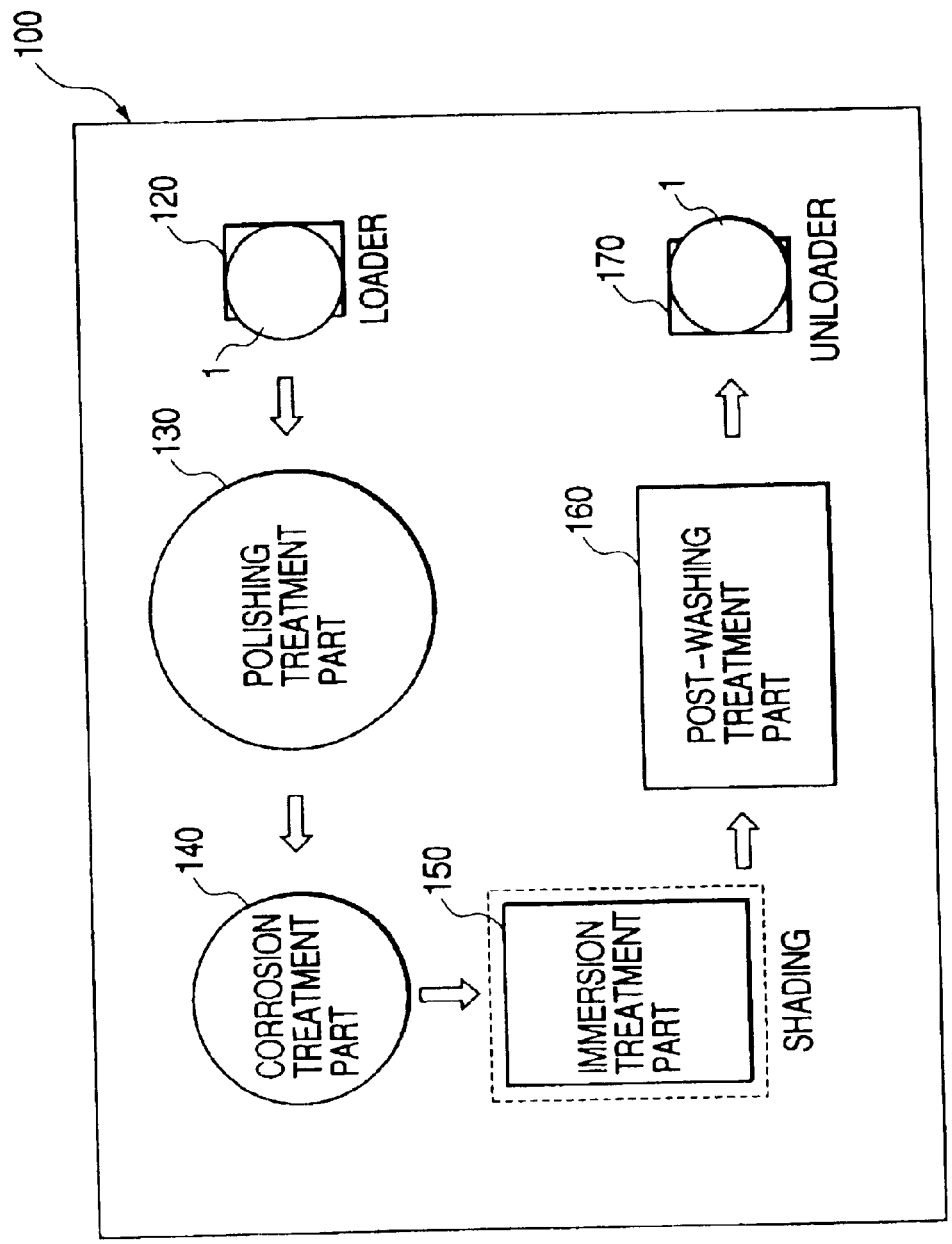
FIG. 12 is a schematic view illustrating another example of the whole constitution of a CMP apparatus used for the formation of a Cu-embedded interconnection.

As illustrated in FIG. 12, it is possible to prevent the surface of the substrate 1 during storage from being. exposed to an illumination light by forming the immersion treatment part (wafer storing part) 150, which serves to prevent surface drying of the substrate 1 after completion of the corrosion treatment, to have a light shading structure. By this structure, generation of a short-circuit current due to the photovoltaic effect can be prevented. The immersion treatment part 150 is formed to have a light shading structure by covering the immersion tank (storage container) with a shade sheet or the like, thereby reducing the illuminance inside of the immersion tank (storage container) to 500 lux or less, preferably 300 lux or less, more preferably 100 lux or less.

Figure 13:
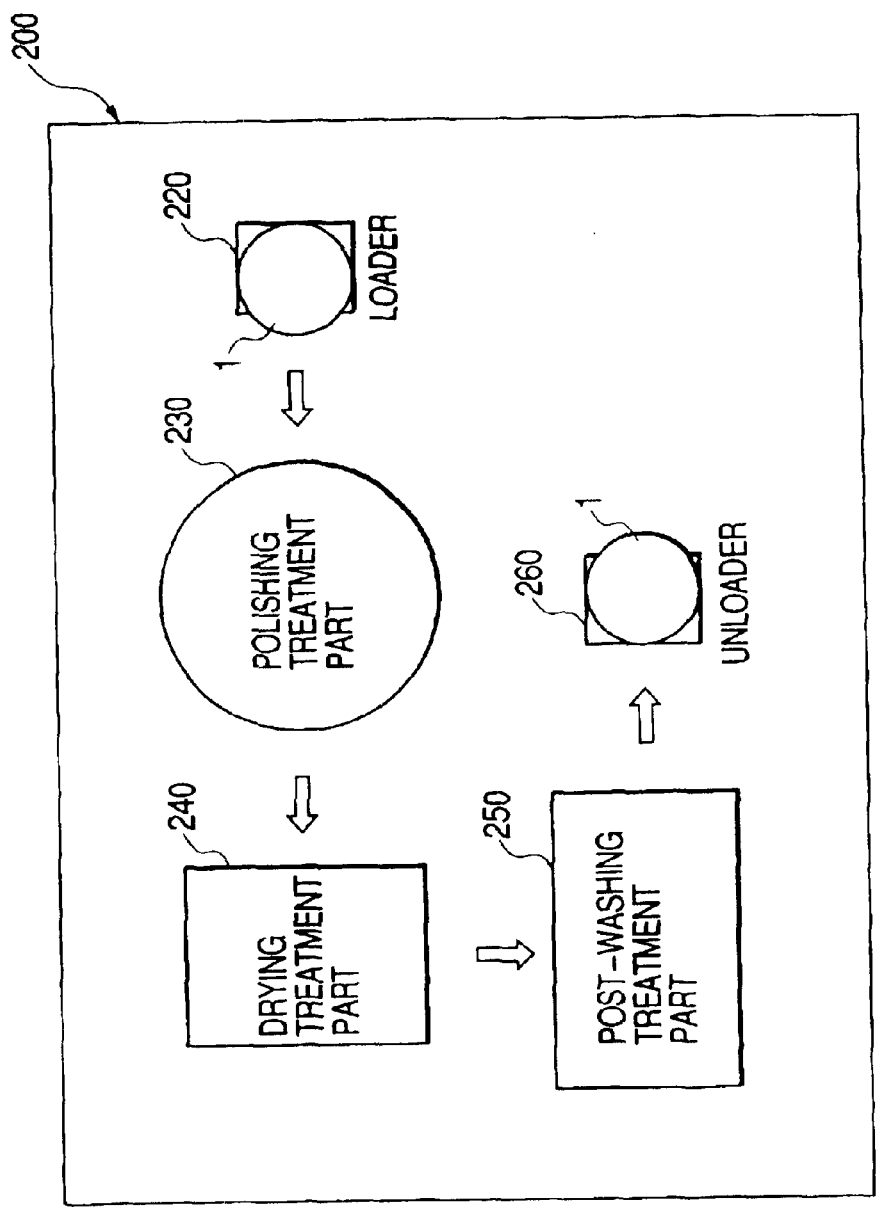
FIG. 13 is a schematic view illustrating a further example of the whole constitution of a CMP apparatus used for the formation of a Cu-embedded interconnection.

As illustrated in FIG. 13, the substrate 1 may be carried into the drying treatment part rightly after the polishing treatment, in other words, right before the initiation of the electrochemical corrosion due to the oxidizing agent in the polishing slurry left on the surface of the substrate and the water content in the polishing slurry may be removed by forced drying. The CMP apparatus 200 shown in FIG. 13 is equipped with a loader 220 for accommodating a plurality of substrates 1 each having a Cu-film-formed surface, a polishing treatment part 230 for polishing and flattening the Cu film, thereby forming an interconnection, a drying treatment part 240 for drying the surface of the substrate 1 after completion of the polishing, a post-washing part 250 for post-washing the substrate 1 and an unloader 260 for accommodating therein a plurality of the substrates 1 after completion of the post-washing. According to the Cu interconnection forming process using this CMP apparatus 200, the substrate 1 subjected to polishing treatment in the polishing treatment part 230 is transferred to the drying treatment part 240 rightly after the polishing treatment, in other words, rightly before the initiation of the electrochemical corrosion reaction due to the oxidizing agent in the polishing slurry left on the surface and in the drying treatment part, the water content in the polishing slurry is removed by forced drying. Then, the substrate 1 under a dried condition is transferred into the post-washing treatment part 250 and after the post-washing treatment, it is rinsed with pure water, spin-dried and then accommodated in the unloader 260. In this case, the surface of the substrate 1 is kept drying during the time just after the polishing treatment to the initiation of the post-washing so that the initiation of the electrochemical corrosion is inhibited, which makes it possible to prevent the corrosion of the Cu interconnection effectively.

Figure 14:
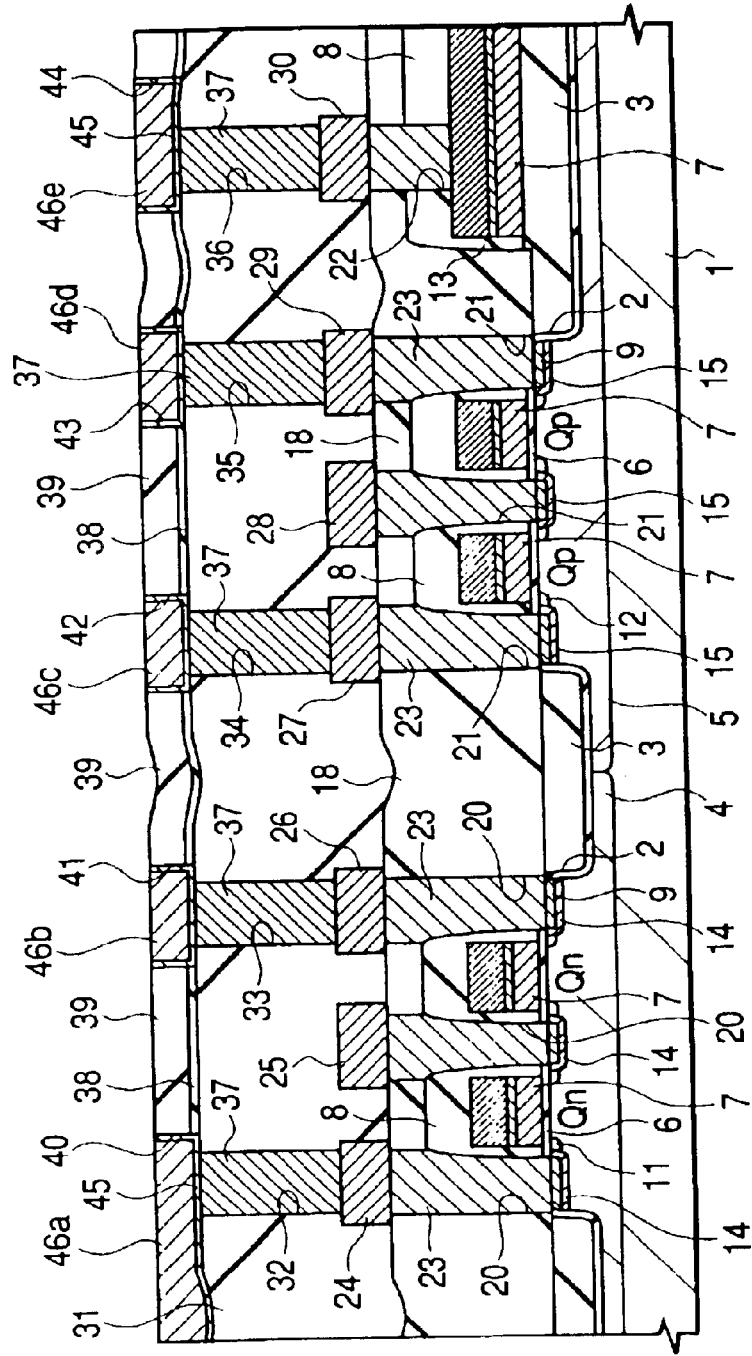
FIG. 14 is a fragmentary cross-sectional view of the semiconductor substrate illustrating the manufacturing method of Embodiment 1.

By such a CMP method, the Cu film 46 and TiN film 45 over the silicon oxide film 39 are removed and as illustrated in FIG. 14, the Cu interconnections 46a to 46e are formed inside of the interconnection grooves 40 to 44.

Figures 15A, 15B:
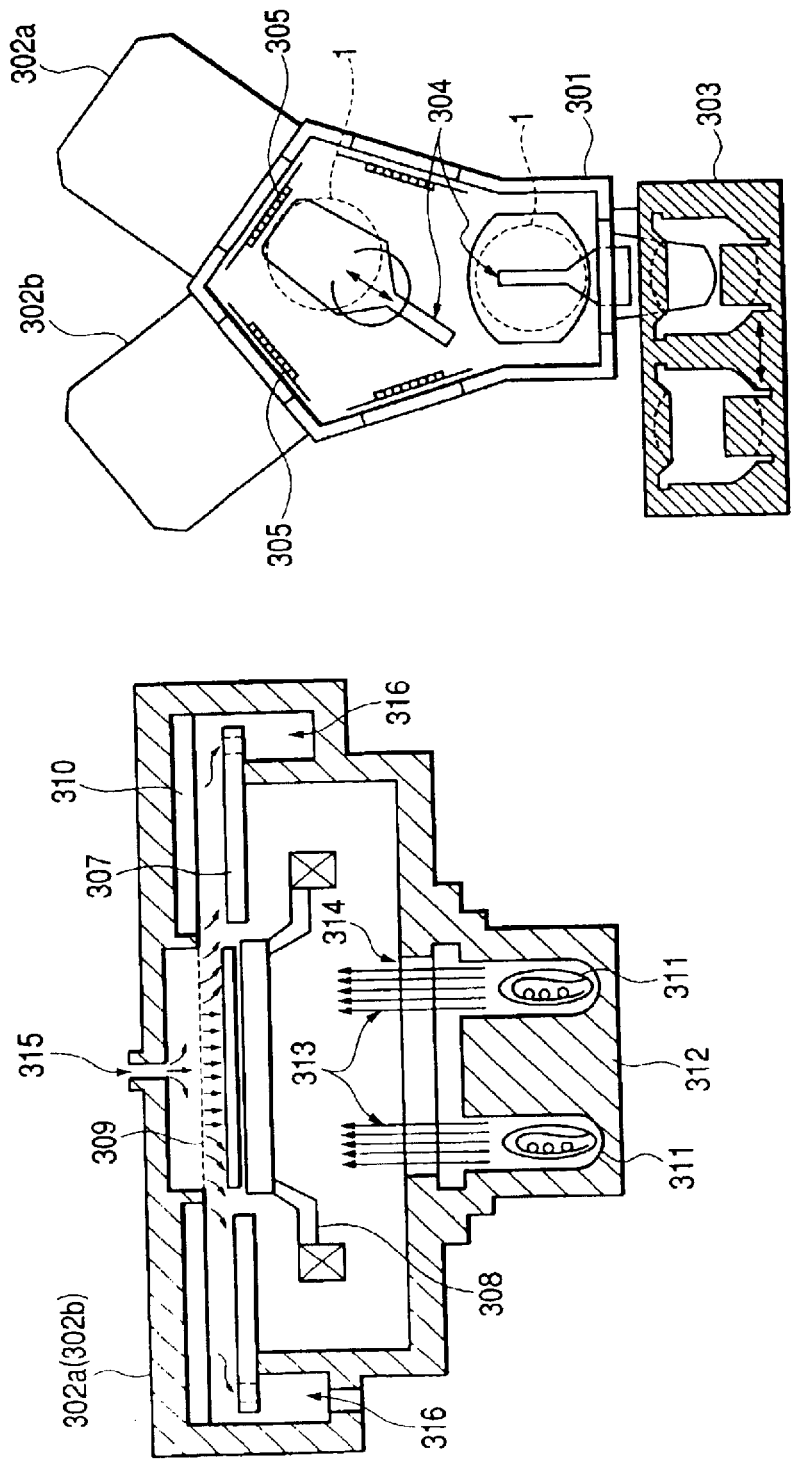
FIG. 15(*a*) is a schematic cross-sectional view of a plasma treating apparatus used for ammonia plasma treatment an deposition of a silicon nitride film and FIG. 15(*b*) is a plan view of the apparatus.

In the next place, the surface of each of the Cu interconnections 46a to 46e and silicon oxide film 39 are subjected to plasma treatment. FIGS. 15(a) and 15(b) are cross-sectional view and plan view each schematically illustrating the apparatus used for plasma treatment.

In this apparatus, two treatment chambers 302a, 302b and cassette interface 303 are attached to a load lock chamber 301. The load lock chamber 301 has therein a robot 304 for transporting the substrate 1. Between the load lock chamber 301 and treatment chambers 302a,302b, a gate valve 305 is disposed for maintaining a high vacuum condition in the load lock chamber 301 during treatment.

The treatment chambers 302a,302b each has, therein, a susceptor 306 for supporting the substrate 1, a baffle plate 307 for adjusting a gas flow, a supporting member 308 for supporting the susceptor 306, a mesh-like electrode 309 disposed opposed to the susceptor 306 and an insulating plate 310 disposed substantially opposite to the baffle plate 307. The insulating plate 310 serves to control the formation of a parasitic discharge in an unnecessary region other than the region between the susceptor 306 and electrode 309. On the reverse side of the susceptor 306, a lamp 312 is installed inside of a reflection unit 311 and from the lamp 312, an infrared ray 313 is irradiated to the susceptor 306 and substrate 1 through a quartz window 314, whereby the substrate 1 is heated. The substrate 1 is installed on the susceptor 306 with the face up.

The chambers 302a,302b can be evacuated to make their insides highly vacuum and a treating gas and high-frequency electric power are fed from a gas port 315. The treating gas is fed to the vicinity of the substrate 1, passing through the mesh-like electrode 309. The treating gas is discharged from a vacuum manifold 316. The pressure is controlled by adjusting the gas flow rate and discharging rate. The high-frequency electric power is applied to the electrode 309, whereby a plasma is generated-between the susceptor 306 and electrode 309. The high-frequency electric power having, for example, a frequency of 13.56 MHz is employed.

In the treating chamber 302a, ammonia plasma treatment which will be described below is carried out. In the treating chamber 302b, a cap film (silicon nitride film) which will be described later is formed by deposition. Since the treating chambers 302a and 302b are connected via the load lock chamber 301, the substrate 1 can be transported to the treating chamber 302b without causing vacuum break after ammonia plasma treatment, which makes it possible to carry out ammonia plasma treatment and formation of the cap film continuously.

Figure 16:
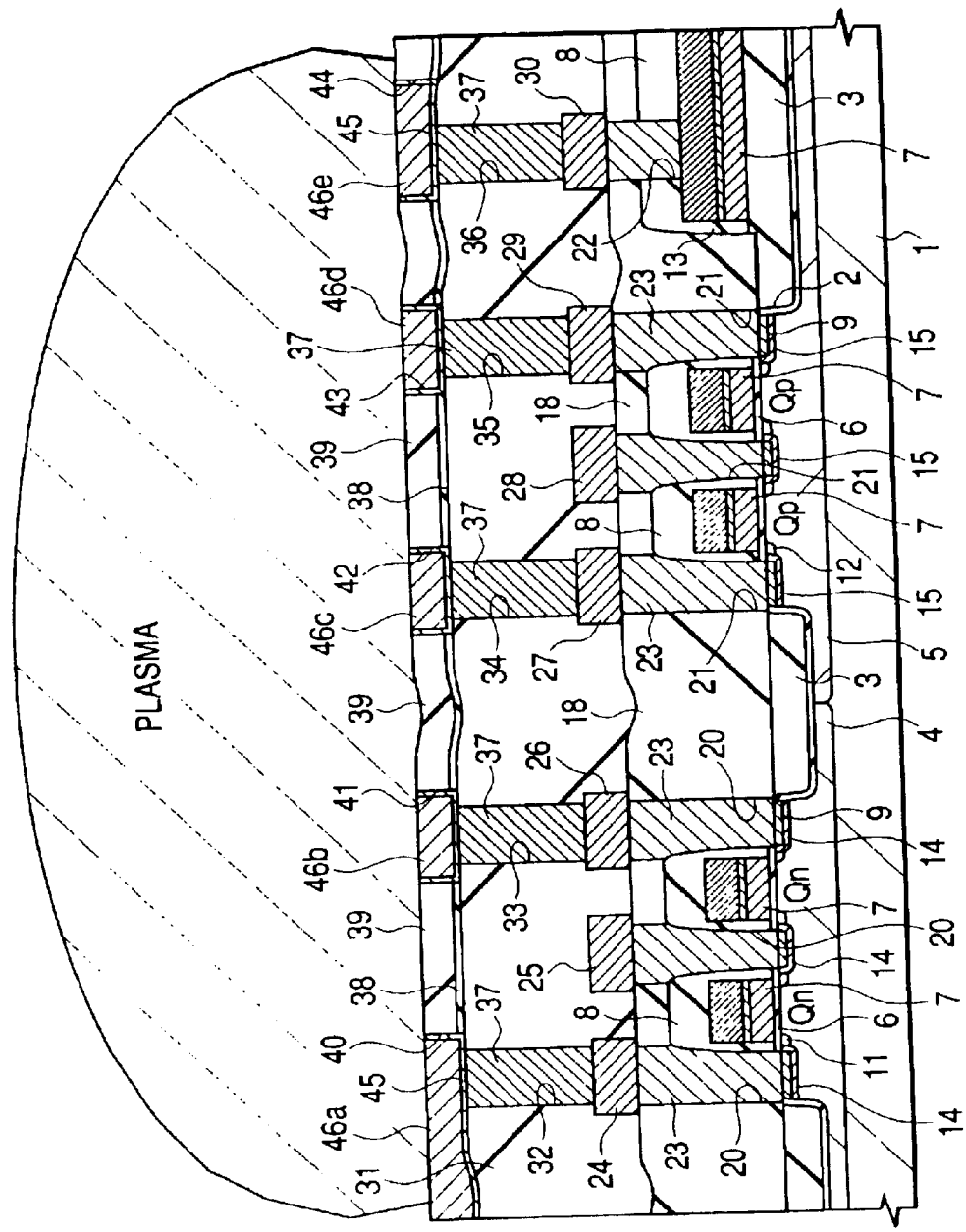
FIG. 16 is a fragmentary cross-sectional view of the semiconductor substrate illustrating the manufacturing method of Embodiment 1.

The substrate 1 is then subjected to ammonia plasma treatment by using the above-described plasma treating apparatus. From the cassette interface 303, the substrate 1 is carried in the load lock chamber 301 by the robot 304. After evacuation of the load lock chamber 301 to a sufficiently pressure-reduced condition, the substrate 1 is transferred into the treating chamber 302a by the robot 304. Then, the gate valve 305 of the treating chamber 302a is closed and the treating chamber 302a is evacuated to a sufficient vacuum degree, followed by the introduction of an ammonia gas into the treating chamber 302a to control the pressure to a predetermined value. An electric field is then applied to the electrode 309 from the high-frequency electric source. The surface of the substrate 1 is subjected to plasma treatment as illustrated in FIG. 16. After a lapse of a predetermined time, the high-frequency electric field is terminated, whereby the plasma is stopped. After evacuation of the treating chamber 302a, the gate valve 305 is opened and the substrate 1 is transported into the load lock chamber 301 by the robot 304. Since the load lock chamber 301 is maintained under a high vacuum condition, the surface of the substrate 1 is not exposed to the atmosphere.

The substrate 1, for example, having a size of 8 inches can be subjected to plasma treatment under the conditions of a treating pressure of 5.0 Torr, RF electric power of 600 W, substrate temperature of 400° C. and ammonia flow rate of 200 sccm and treating time of 10 seconds. The distance between any two adjacent electrodes is set at 600 mils. It is needless to say that the plasma treatment conditions are not limited to the above-described ones. According to the study of the present inventors, a reduction in the plasma damage can be attained by a higher pressure and a reduction in the scatter of TDDB and an increase in TDDB can be attained by a higher substrate temperature. It has-also been found that hillocks tend to appear on the surface of Cu at a higher substrate temperature, a lager RF electric power or a long treating time. In consideration of these findings and a difference in the conditions depending on the constitution of the apparatus, the plasma treatment conditions can be set within a range of from 0.5 to 6 Torr for treating pressure, 300 to 600 W for RF electric power, 350 to 450° C. for substrate temperature, 20 to 500 sccm for ammonia flow rate, 5 to 180 seconds for treating time and 300 to 600 mils for a distance between electrodes.

By the plasma treatment, as described above, on the surface of each of the Cu interconnections 46a to 46e and silicon oxide film 39, a thin nitride film of each of the underlying films can be formed over the surface of each of the Cu interconnections 46a to 46e and silicon oxide film, 39, whereby adhesion between the cap film (silicon nitride film) which will be described later, and each of the Cu interconnections 46a to 46e and silicon oxide film 39 can be improved, leading to a marked improvement in the TDDB characteristics.

Such an improvement brought by the plasma treatment will be described later in detail based on the analysis of the test results by the present inventors.

Figure 17:
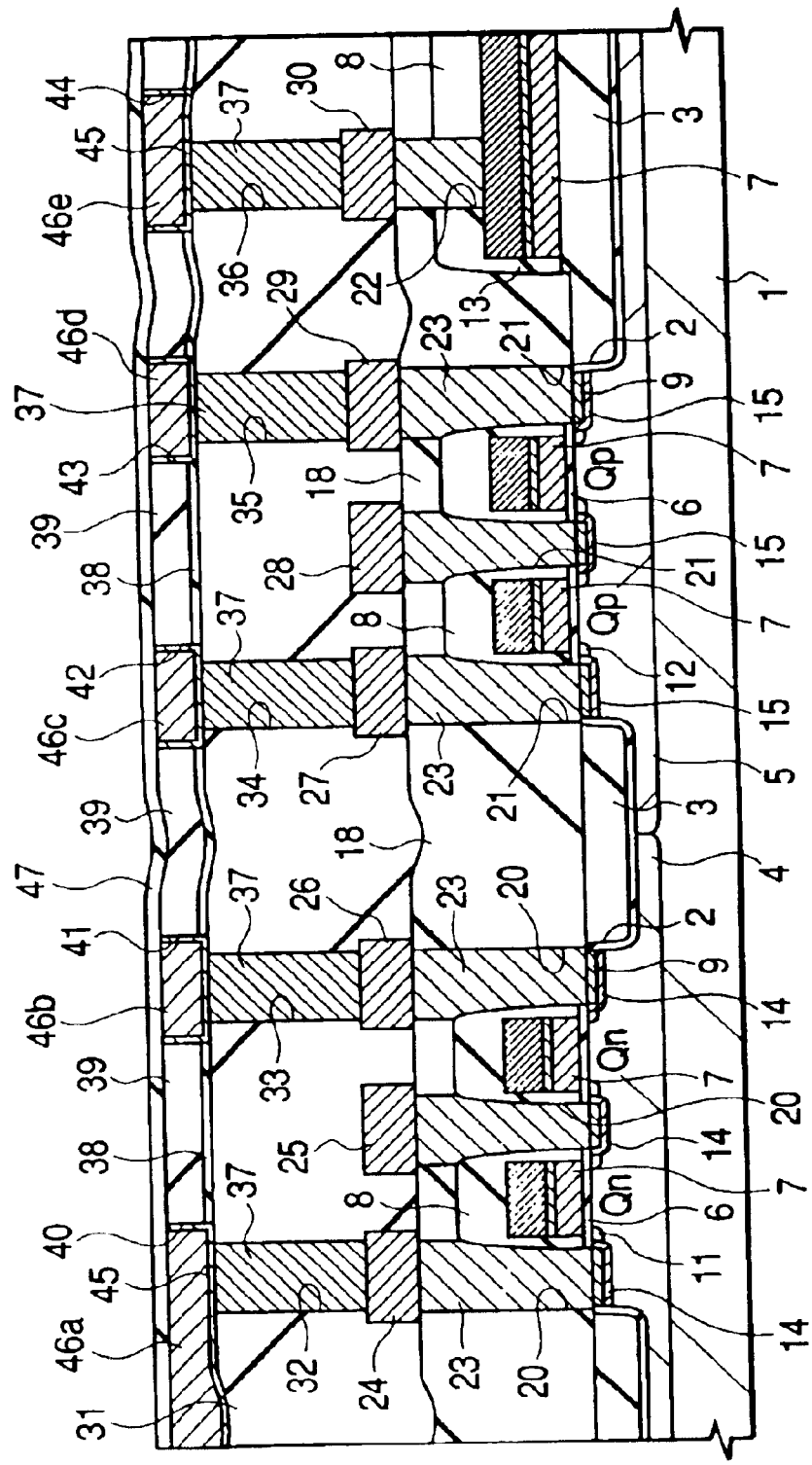
FIG. 17 is a fragmentary cross-sectional view of the semiconductor substrate illustrating the manufacturing method of Embodiment 1.

The substrate 1 is then transported into the treating chamber 302b by the robot 304. After the gate valve 305 of; the treating chamber 302b is closed and the treating chamber 302b is evacuated to a sufficient vacuum degree, a mixed gas of silane ($SiH_4$), ammonia and nitrogen is introduced into the treating chamber 302b and the pressure of the chamber is adjusted and maintained at a predetermined pressure. An electric field is applied to the electrode 309 from the high-frequency electric source to generate a plasma, whereby the silicon nitride film 47 (cap film) is deposited over the surface of each of the Cu interconnections 46a to 46e and silicon oxide film 39 as illustrated in FIG. 17. After a lapse of a predetermined time, the high-frequency electric field is terminated, whereby the plasma is stopped. The treating chamber 302b is evacuated, followed by opening of the gate valve 305 and transportation of the substrate 1 into the load lock chamber 301 by the robot 304. The substrate 1 is then discharged into the cassette interface 303 by using the robot 304.

Figure 18:
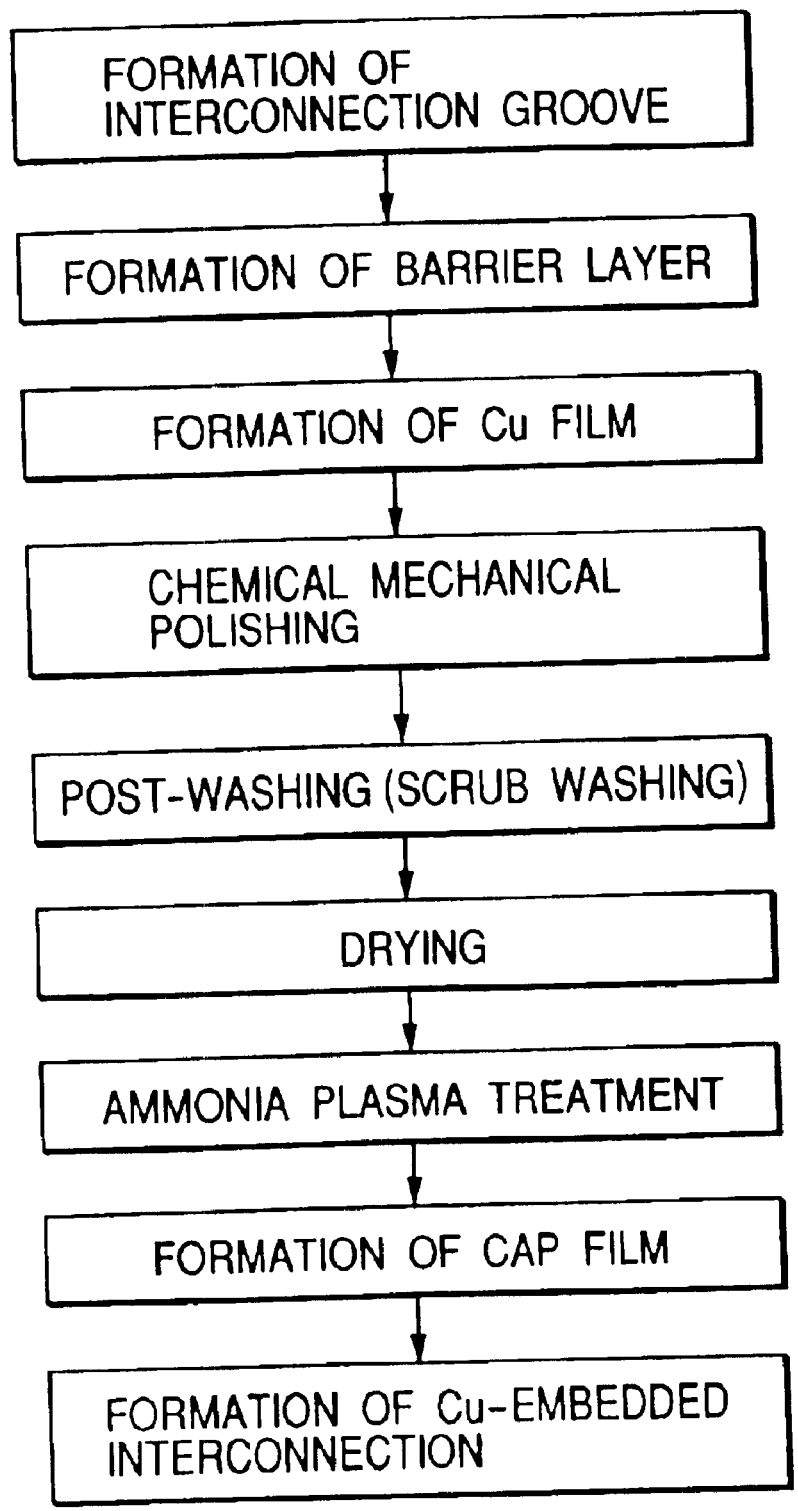
FIG. 18 is a flow chart illustrating the manufacturing method of the semiconductor integrated circuit device of Embodiment 1.

The silicon nitride film 47 is formed to a film thickness of, for example, 50 nm. Then, a silicon oxide film for the formation of a plug to connect the third interconnection layer with the second interconnection layer (Cu interconnections 46a to 46e) and in a similar manner to that described above, the Cu-embedded interconnection of at least the third layer is formed. FIG. 18 is a whole flow chart of the formation process of the above-described Cu interconnections 46a to 46e.

Figure 19:
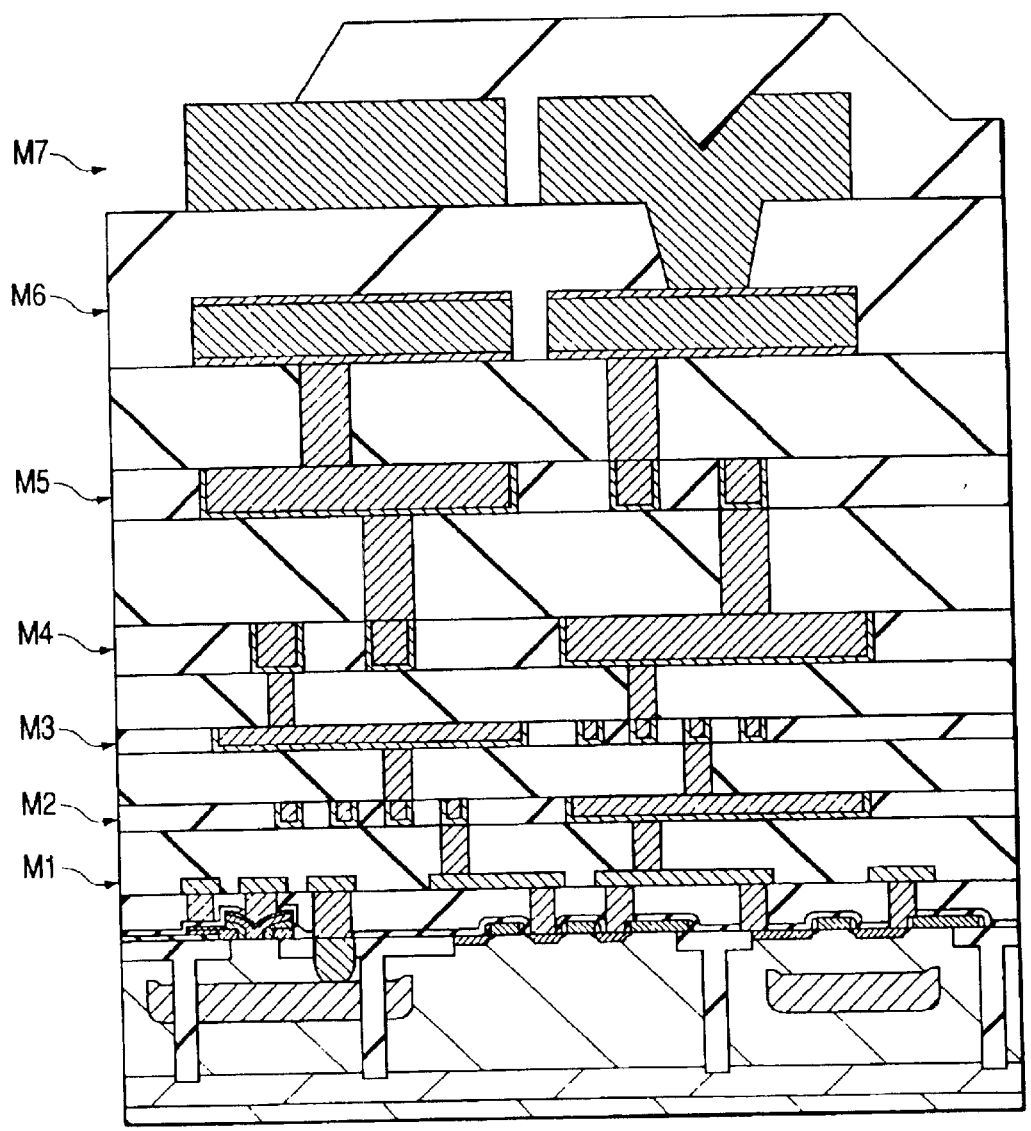
FIG. 19 is a schematic cross-sectional view illustrating the semiconductor integrated circuit device of Embodiment 1.

FIG. 19 illustrates one example of CMOS-LSI in which the formation of the interconnections of the first to the seventh layers has already been finished. The first interconnection layer (M1) is made of a tungsten film, as described above. The second interconnection (M2) to the fifth interconnection (M5) layers are formed in a similar manner to that employed for the formation of the above-described Cu interconnection. In each of the second (M2) and third interconnection (M3) layers, the width, distance between the adjacent two interconnections and height are each formed to 0.5 $\mu$m. In each of the fourth interconnection (M4) and fifth interconnection (M5) layers, on the other hand, the width, distance between adjacent two interconnections and height (thickness) are each formed to 1 $\mu$m. The sixth interconnection (M6) is formed to have three layers, that is, tungsten film, aluminum film and tungsten film, while the seventh interconnection layer (M7) is constituted from an aluminum film. A bump or the like is formed on the seventh interconnection layer (M7), but it is not illustrated.

Figure 20:
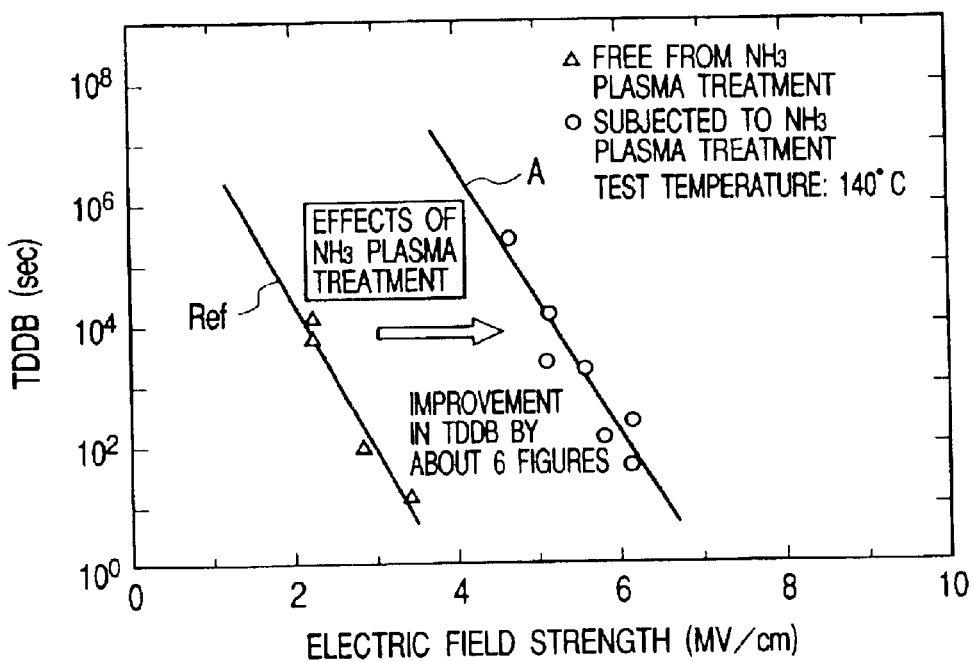
FIG. 20 is a graph illustrating TDDB.

The embodiment of the present invention brings about a large improvement in the TDDB characteristics. FIG. 20 is a graph illustrating the TDDB of a TEG sample formed in the same layer with the second interconnection layer M2 (Cu interconnections 46a to 46e) of this Embodiment, in which Line A indicates the data of this embodiment. At the same time, the TDDB (Line Ref) free from ammonia plasma treatment is shown for comparison. From the drawing, it has been found that the TDDB according to this embodiment is by about 6 figures better than that for comparison.

Figure 21:
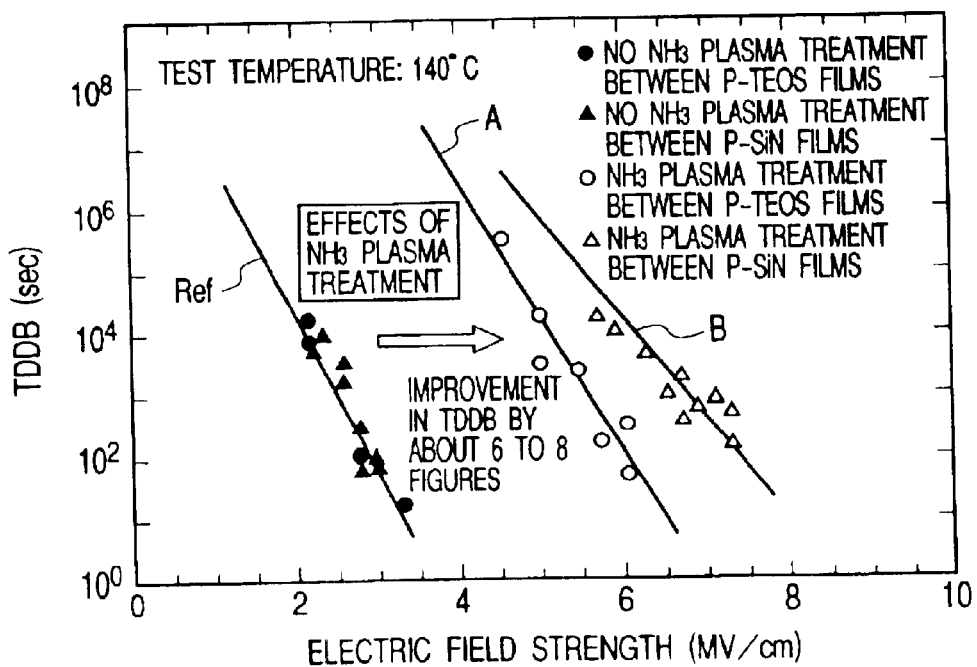
FIG. 21 is a graph illustrating TDDB.

FIG. 21 illustrates the data (Line B) when the silicon oxide film 39 used in this embodiment is replaced by a silicon nitride film which is denser and firmer than the silicon oxide film. Replacement of the insulating film from silicon oxide to silicon nitride does not bring about any difference (Line Ref) unless it is subjected to ammonia plasma treatment. The TDDB characteristics can be improved more than those according to this embodiment by the use of the silicon nitride film as the insulating film, followed by ammonia plasma treatment. The improvement is however not so marked, indicating that the ammonia plasma treatment rather than the replacement has a dominant influence. It suggests that not an insulating film itself but its interface is a dominant factor which controls TDDB.

With a view to analyzing the improving mechanism of the TDDB brought by ammonia plasma treatment, the present inventors have carried out surface analysis of copper and silicon oxide film. The results of analysis will next be described.

FIGS. 22 to 24.are graphs each illustrating the results of XPS analysis (X-ray Photo-electron Spectroscopy) on the surface of the Cu interconnection, wherein (a) and (c) are results of spectral analysis of Cu2p and (b) and (d) are those of N1s.

FIGS. 22(a) and 22(b) each illustrates the analysis results of the as-deposited surface of the Cu film. Since the peak of Cu2p is observed but the peak of N1s is on the noise level, it has been found that no nitrogen exists in the as-deposited Cu film. FIGS. 22(c) and 22(d) are analysis results of the surface of the Cu interconnection rightly after the Cu film was subjected to CMP, from which both of the Cu2p peak and the N1s peak are observed. As described above, BTA is contained in a slurry so that nitrogen in the BTA remaining on the Cu surface is presumed to be observed. FIGS. 23(a) and 23(b) are analysis results of the surface of the Cu interconnection which has been subjected to post-washing after CMP. No change is observed in the peak of Cu2p, while the peak of N1s lowers, which is considered to owe to the removal of BTA by washing. FIGS. 23(c) and 23(d) are analysis results of the surface of the Cu interconnection after the Cu interconnection is allowed to stand for 24 hours in the atmosphere after post-washing. The peak of CuO can be observed with the peak of Cu2p. No change can be observed from the peak of N1s after the Cu interconnection is allowed to stand. It has been found that the Cu interconnection is oxidized by allowing it to stand, whereby CuO is formed.

Figure 24A:
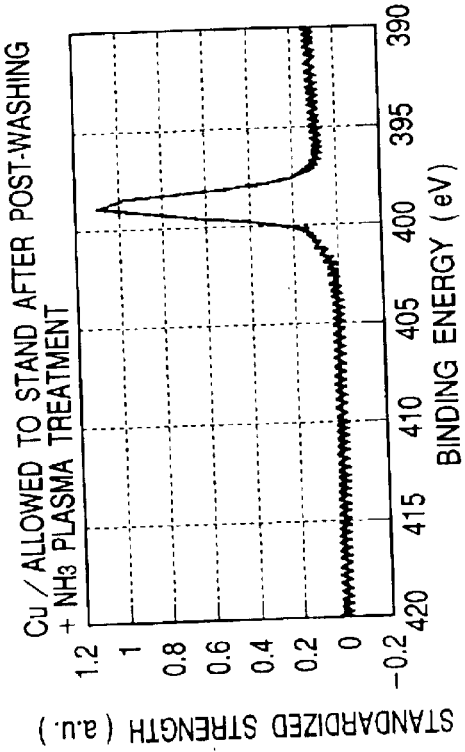
FIGS. 24(*a*) to 24(*d*) are graphs each illustrating XPS data.
Figure 24B:
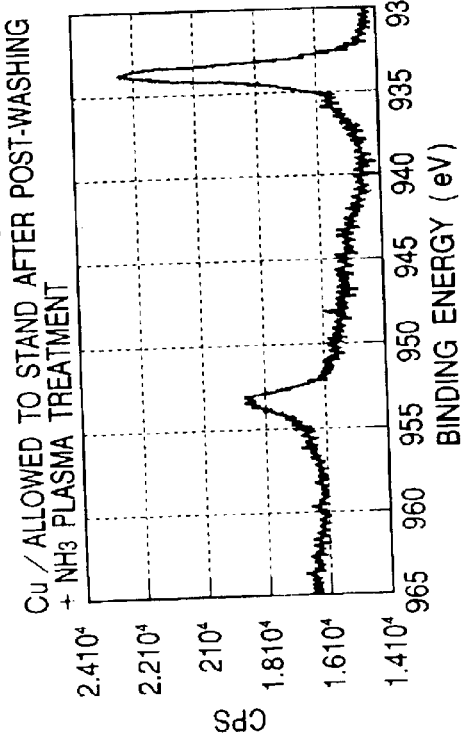
Figure 24C:
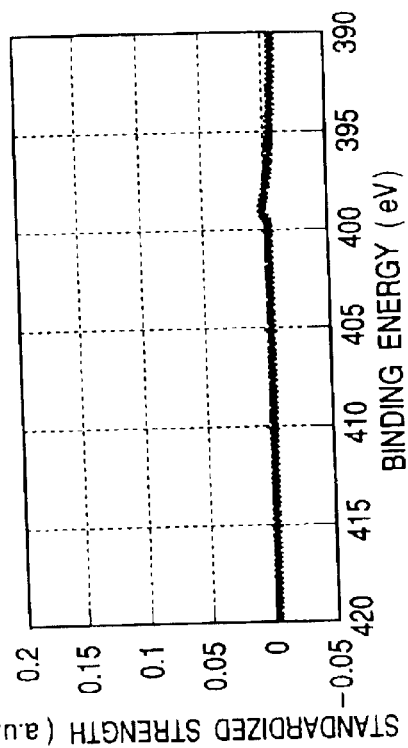
Figure 24D:
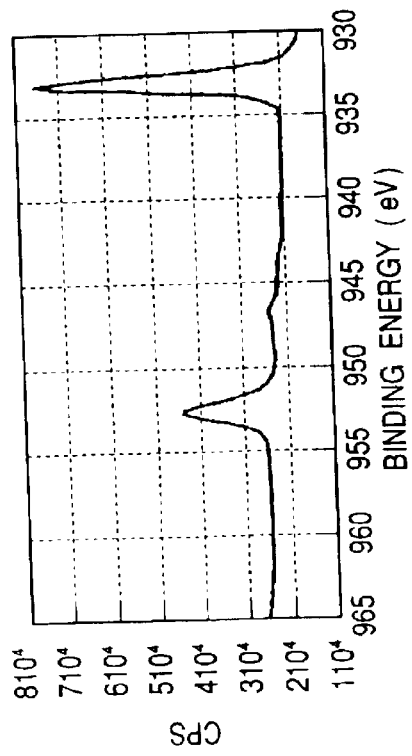

FIGS. 24(a) and 24(b) illustrate the analysis results of the surface of the Cu interconnection which has been oxidized, followed by ammonia plasma treatment. The peak of CuO almost disappears, while the peak of N1s appears strongly, which is presumed to owe to the reduction of the Cu surface and removal of oxygen, and at the same time, nitriding of the Cu surface. For comparison, the surface of the oxidized Cu interconnection subjected to hydrogen thermal treatment at 350° C. was analyzed. The results are shown in FIGS. 24(c) and 24(d). When FIG. 24(c) is compared with FIG. 24(a) concerning the peak of Cu2p, hydrogen thermal treatment is more reducing, because FIG. 22(a) shows the Cu interconnection in a more as-deposited state. Judging from that N1s peak is hardly observed, the Cu surface is only reduced by the hydrogen thermal treatment.

From the above-described results, it has been found. that the surface of each of the Cu interconnections 46a to 46e has been reduced and at the same time, a nitride film has been formed on the surface. This nitride layer is considered to serve to suppress formation of copper silicide by preventing the reaction between copper and silane contained in the raw material gas upon deposition of the silicon nitride film after ammonia plasma treatment. Prevention of silicide formation is presumed to suppress an increase in the interconnection resistance.

FIG. 25 is a graph illustrating the results of XPS analysis on the silicon oxide film, while FIGS. 26 and 27 each illustrates the results of the mass spectrometric analysis (TDS-APIMS) of the silicon oxide film. The analysis was conducted on each of the silicon oxide film after CMP and post-washing (Profile C), that subjected to hydrogen plasma treatment after CMP and post-washing (Profile D), that subjected to ammonia plasma treatment after CMP and post-washing (Profile E) and that subjected to nitrogen plasma treatment after CMP and post-washing (Profile F). A deviation toward the high energy direction of about 1 eV in Profile C is caused by the influence of charge up.

FIGS. 25(a) and 25(b) each illustrates the observation data of Si2p spectrum, wherein FIG. 25(a) illustrates the analysis data of about 10 nm depth and FIG. 25(b) illustrates the analysis data of about 2 nm. FIGS. 25(c), 25(d) and 25(e) illustrate the observation data of N1s, O1s and C1s spectra, respectively.

In FIG. 25(b), a broad peak is observed on the lower energy side (at 102 eV) of hydrogen plasma treatment (Profile D), which is presumed to owe to the formation of an Si—H bond on the surface of the silicon oxide film by the hydrogen plasma treatment.

In FIG. 25(a), peaks of the ammonia plasma treatment (Profile E) and nitrogen plasma treatment (Profile F) at 105 eV are broad on the lower energy side and are therefore asymmetrical. The peak at the asymmetrical part (103.5 eV) is presumed to result from an Si—O—N bond. The surface of the silicon oxide film is considered to be nitrided by the ammonia plasma treatment and nitrogen plasma treatment. The comparison between FIGS. 25(a) and 25(b) suggests that the nitriding is stronger on the surface portion. The nitriding due to ammonia plasma treatment and nitrogen plasma treatment can also be confirmed from FIG. 25(c).

It is apparent from FIG. 25(e) that carbon can hardly be detected in the hydrogen plasma treatment (Profile D), suggesting that organic matters on the surface have been removed by hydrogen plasma treatment. The peak at 289 eV after CMP (Profile C) is presumed to result from a C—O bond. A slurry is considered to remain after CMP.

FIG. 25(f) shows the amount of N estimated from the ratio of the Si peak to N peak. Substantially equal nitriding is considered to be conducted in ammonia plasma treatment and nitrogen plasma treatment.

FIGS. 26(a), 26(b), 26(c) and 26(d) are graphs illustrating the measurement results of the mass number 41 (Ar—H), mass number 27 ($C_2H_3$), mass number 57 ($C_4H_9$) and mass number 59 ($C_3H_7O$), respectively. FIGS. 27(a), 27(b), 27(c) and 27(d) are graphs illustrating the measurement results of the mass number 28 (Si, $C_2H_4$), mass number 44 (SiO, $C_3H_6$), mass number 29 (SiH, $C_2H_5$) and mass number 31 ($SiH_3$), respectively.

Figure 26A:
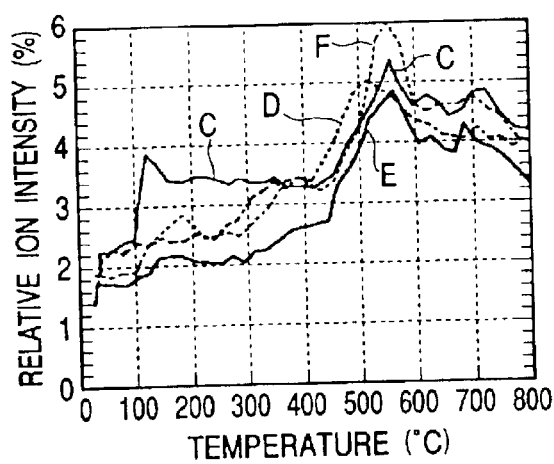
FIGS. 26(a) to 26(d) are graphs each illustrating the results of mass spectroscopy.

It has been revealed from FIG. 26(a) that there is almost no difference in the hydrogen release amount by the plasma treatment, but the release temperature of the hydrogen plasma treatment (Profile D) is 520° C. which is lower than another case (560° C.).

Figure 26B:
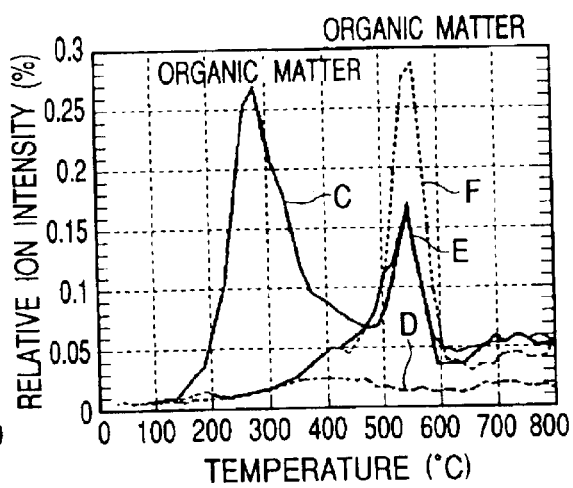
Figure 26C:
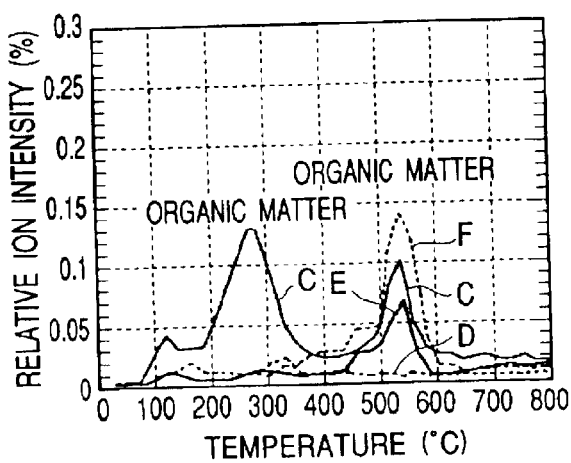
Figure 26D:
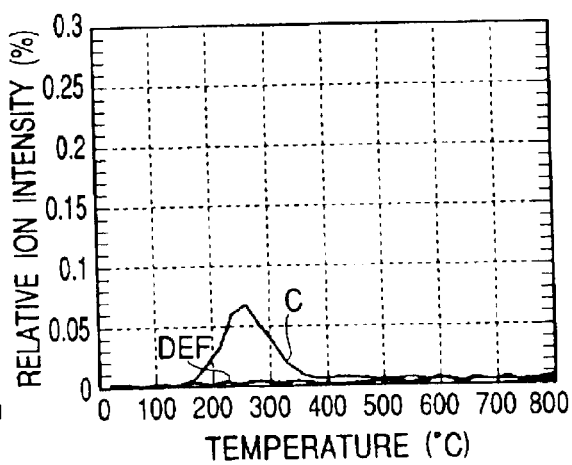
Figure 27A:
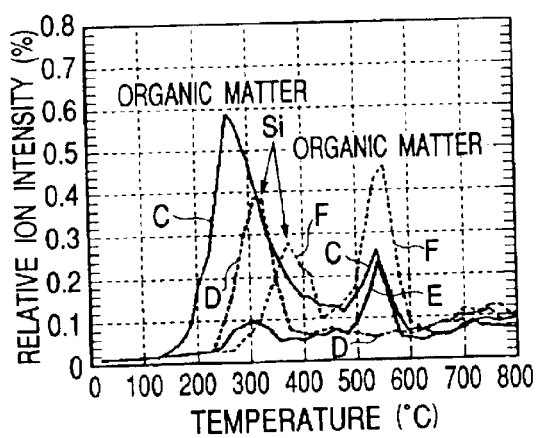
FIGS. 27(a) to 27(d) are graphs each illustrating the results of mass spectroscopy.
Figure 27B:
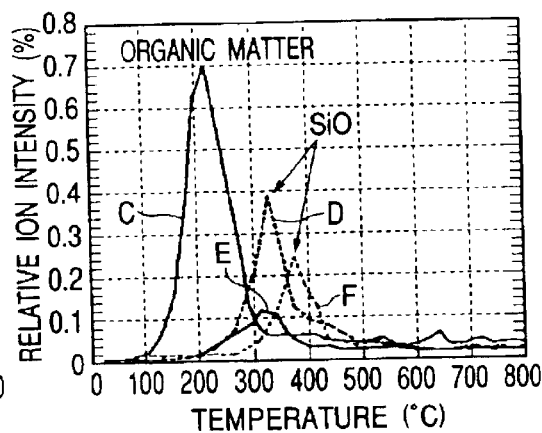
Figure 27C:
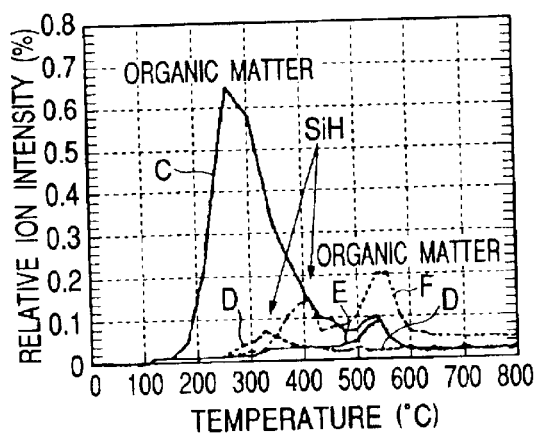
Figure 27D:
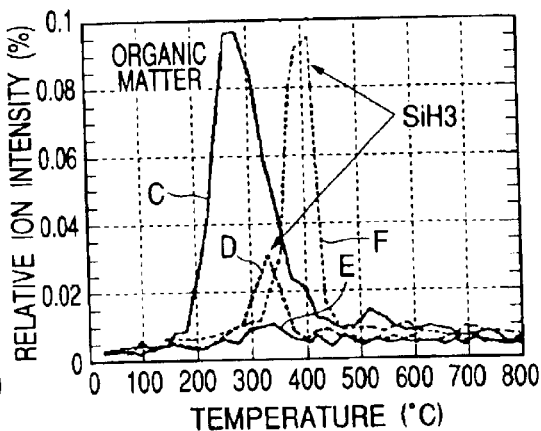

FIGS. 26(a), 26(b) and 26(c) suggest the release of organic matters in each process, while FIGS. 27(a) to 27(d) suggest the existence of a peak which does not result from the release of organic matters. The peaks of FIGS. 27(a). to 27(d) existing within a range of from 300 to 400° C. are presumed to result from Si, SiO, SiH, $SiH_3$, respectively. According to the comparison among these drawings, release of SiO is observed in each of the hydrogen, ammonia and nitrogen plasma treatments, but release of each of SiH and $SiH_3$ is hardly observed in the ammonia plasma treatment. In other words, an Si—O—N bond is formed by the ammonia plasma treatment and release occurs easily at a relatively low energy. The energy necessary for release is the highest in the nitrogen plasma treatment, while it is almost the same in the hydrogen plasma treatment and ammonia plasma treatment.

The above-described results indicate that an Si—OH or Si—O— bond which will be a cause for the dangling bond on the surface of the silicon oxide film is terminated as a weak Si—O—N bond by the ammonia plasma treatment. Upon formation of a silicon nitride film after the ammonia plasma treatment, the Si—O—N on the very surface is released and the Si—O bond of the bulk and Si—N of the silicon nitride film form a strong bond, whereby a continuous interface is formed. This is presumed to be a mechanism for improving the adhesion at the interface. Without the ammonia plasma treatment, on the other hand, the surface of the silicon oxide film rich in an Si—OH bond and ammonia which is a raw material gas of the silicon nitride film would undergo condensation, leading to the formation of a number of Si—O— bonds, thereby causing a dangling bond. If a number of dangling bonds exist on the interface between the silicon oxide film and silicon nitride film, a leak path is inevitably formed there, which will be a cause for leak current between interconnections and, in turn, dielectric break.

Based on the above-mentioned analysis results, it is presumed that by the ammonia plasma treatment, the surface of the oxidized Cu interconnection can be reduced into a Cu single element, it becomes electrically more stable than ionized Cu and moreover, the interface between the silicon oxide film and silicon nitride film becomes firm and continuous, which brings about a reduction in leak current and marked improvement in the TDDB characteristics.

Figure 28:
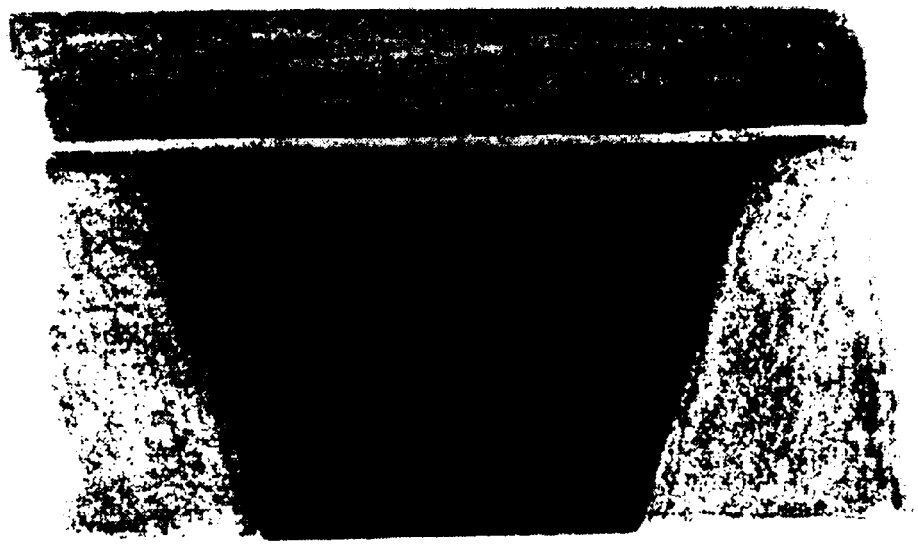
FIG. 28 is a TEM photograph of the interconnection portion of Embodiment 1.
Figure 29:
FIG. 29 is TEM photograph for comparison.

FIG. 28 is a TEM photograph of the ammonia-plasma-treated interface between the interconnection layer and silicon nitride film (cap film) according to this embodiment, while FIG. 29 is a TEM photograph of the ammonia-plasma-treatment-free interface. Existence of a thin film on the interface (shown by an arrow) can be confirmed in FIG. 28. This thin film is presumed to be a nitride layer as described above. In FIG. 29, on the other hand, such a film cannot be confirmed.

Figure 30:
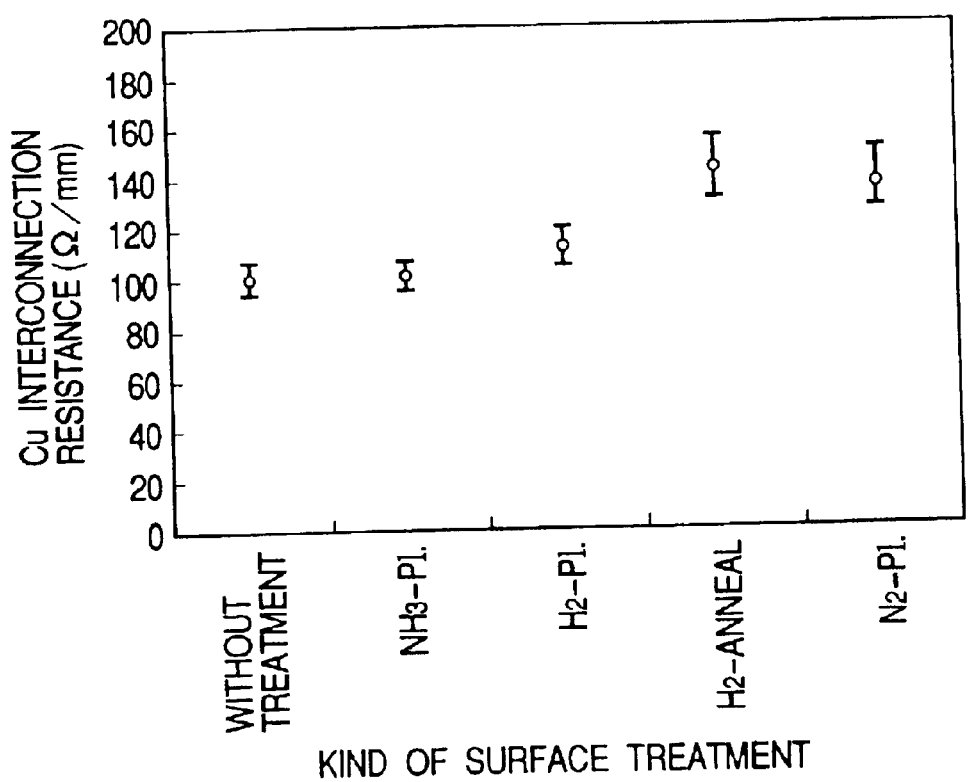
FIG. 30 is a graph illustrating interconnection resistance.
Figure 31:
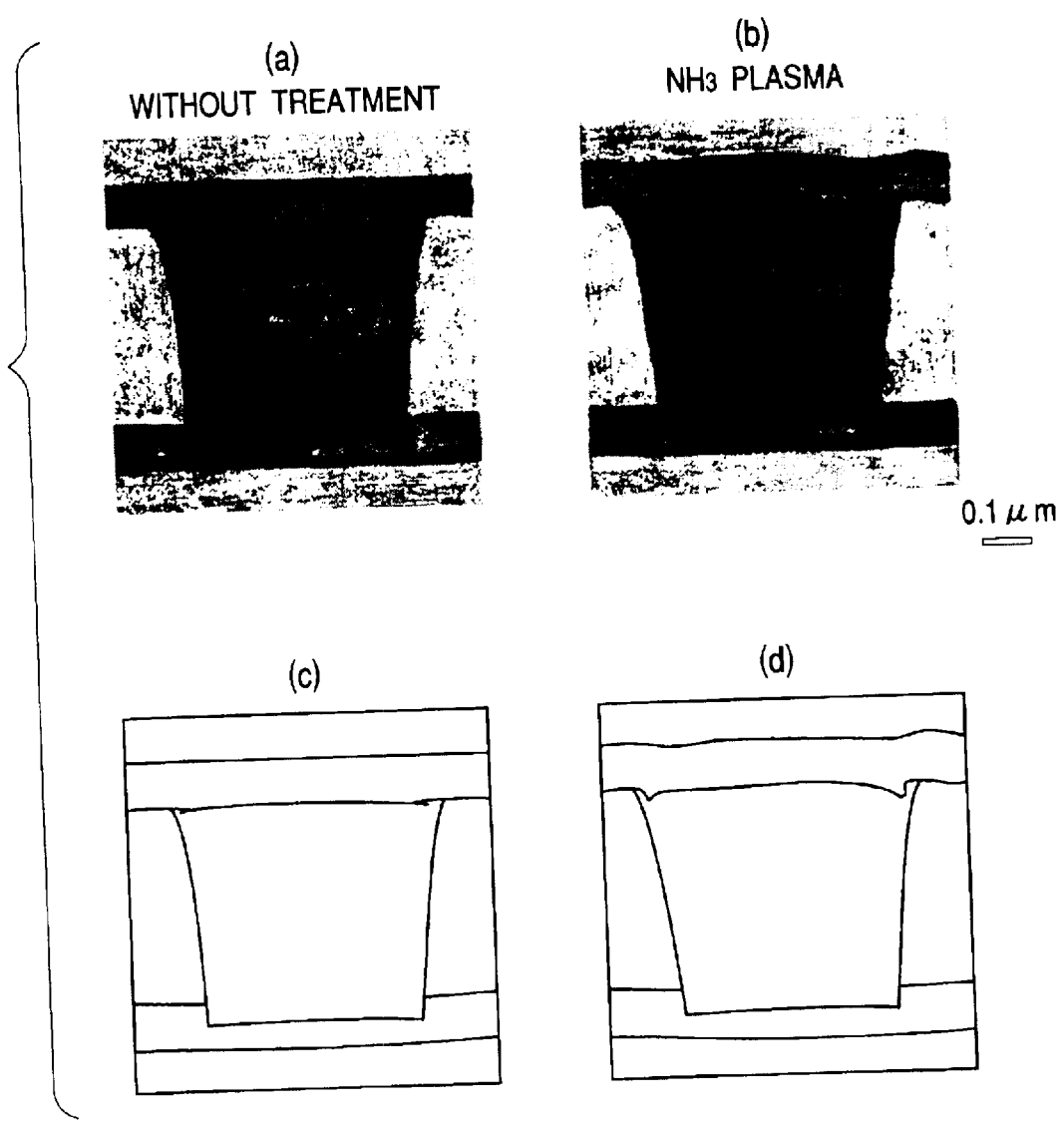
FIG. 31(a) is a TEM photograph of the interconnection portion without treatment.
FIG. 31(b) is a TEM photograph of the interconnection portion of Embodiment 1.
FIGS. 31(c) and 31(d) are traced drawings of FIGS. 31(a) and 31(b), respectively.
Figure 32:
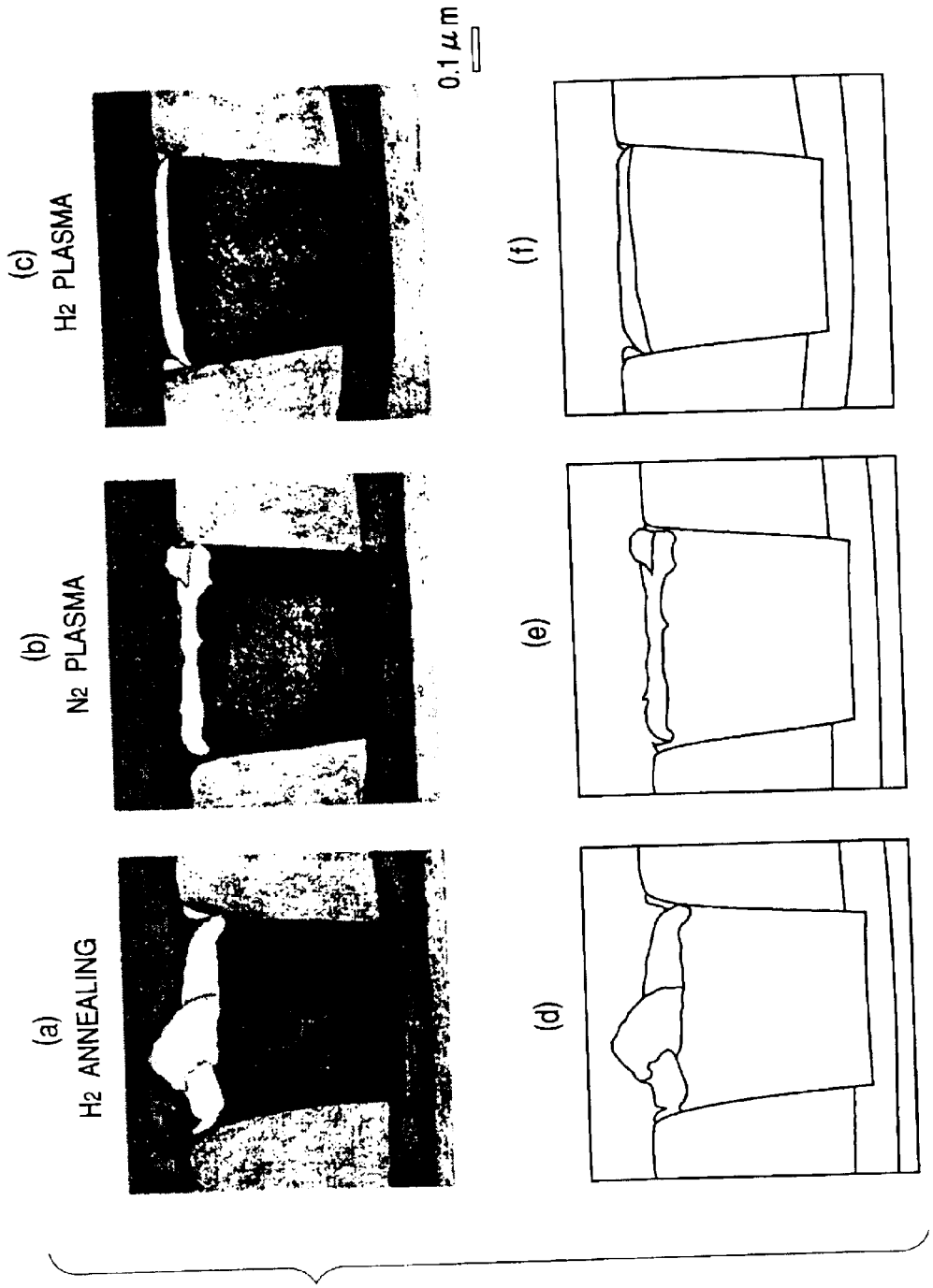
FIGS. 32(a) to 32(c) are TEM photographs for comparison.
FIGS. 32(d), 32(e) and 32(f) are traced drawings of FIGS. 32(a), 32(b) and 32(c), respectively.

In addition, resistance of the Cu interconnection can be reduced according to this embodiment. FIG. 30 illustrates the measuring results of the resistance of each of the Cu interconnections subjected to various treatments. The resistance without treatment (without plasma treatment) or after ammonia plasma treatment is significantly low compared with that after another treatment (hydrogen plasma treatment, hydrogen annealing or nitrogen plasma treatment). FIGS. 31 and 32 are each a TEM photograph of the interface between the Cu interconnection and cap film (silicon nitride film) subjected to one of these treatments. Nothing particular can be observed from the interface free of treatment or after ammonia plasma treatment (FIG. 31), while a copper silicide (CuSi) layer has been formed on the interface subjected to hydrogen annealing or nitrogen plasma treatment (FIG. 32). This silicide layer is presumed to cause an increase in the resistance. Such a silicide layer is formed by the reaction with a silane gas upon formation of the silicon nitride film. By the ammonia treatment, however, a markedly thin nitride film is formed on the Cu surface and it functions as a blocking layer against the silicide formation. It is presumed that in the case of hydrogen annealing or the like, however, only the reduction of the copper surface causes exposure of the active Cu surface, thereby accelerating reaction with silicon, resulting in a tendency to form a silicide layer. In the case of hydrogen plasma treatment (FIGS. 32(c), 32(f)), something is formed on the interface. It is not always the case so that the degree of silicide formation is presumed to be small in the case of hydrogen plasma treatment. In FIGS. 31 and 32, in addition to the TEM photographs (FIGS. 31(a) and 31(b), FIGS. 32(a) to 32(c)), corresponding traced drawings (FIGS. 31(c) and 31(d), FIGS. 32(d) to 32(f)) are shown below the, TEM photographs for reference.

Based on the above-described analysis results, the following model can be indicated as a deteriorating mechanism of the TDDB characteristics. Without ammonia treatment of the present embodiment, copper oxide (CuO) is formed on the surface of the Cu interconnection and upon formation of a cap film (silicon nitride film 47), copper silicide is formed. Such copper oxide or copper silicide is ionized easier than pure copper. Ionized copper is drifted by an electric field between interconnections and diffused into the insulating film between interconnections. The interface between the insulating film (silicon oxide film 39) having copper interconnections embedded therein and cap film (silicon nitride film 47) is discontinuous due to many dangling bonds formed thereon and is therefore poor in adhesion when it is free from ammonia treatment of this embodiment. Such dangling bonds serve to accelerate diffusion of copper ions so that copper ions are drifted and diffused along the interface. In other words, a leak path is formed on the interface between the interconnections. Owning to the leak action for long hours and, in addition, thermal stress by electric current, an increase of leak current passing through the leak path is accelerated, leading to breakdown (TDDB).

In this embodiment, on the other hand, owing to the ammonia treatment on the surface of each of the Cu interconnections 46a to 46e, an oxide layer on the surface thereof is reduced and disappears, and instead, a thin nitride layer is formed. Copper silicide is therefore not formed upon formation of the silicon nitride film 47, which makes it possible to prevent the formation of a substance becoming a main supply source of copper ions, which will be a cause for leakage and dielectric breakdown.

In this embodiment, the surface of the silicon oxide film 39 is subjected to ammonia treatment, which makes it possible to continuously connect the silicon oxide film with the silicon nitride film 47, reduce the density of dangling bonds and suppress the formation of a leak path. In other words, the present embodiment makes it possible to form, between the silicon oxide film 39 and silicon nitride film 47, an interface capable of suppressing the generation of copper ions which will be a cause for lowering of TDDB and suppressing the diffusion of copper, leading to an improvement in TDDB.

Figure 33:
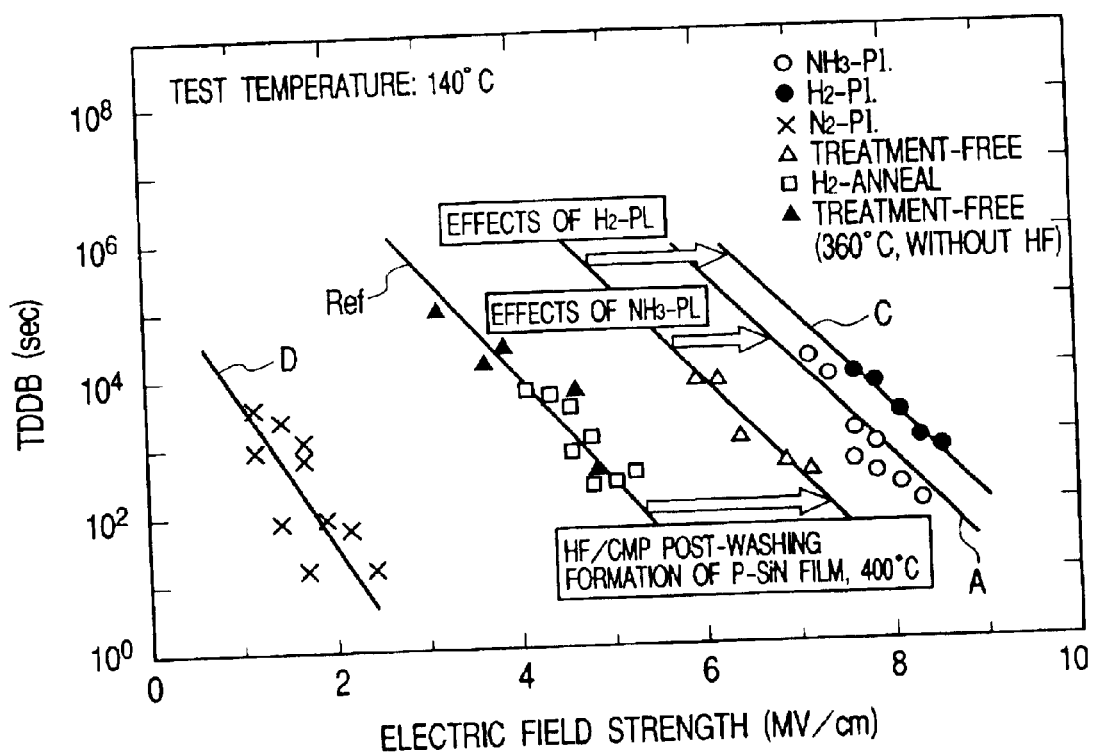
FIG. 33 is a graph illustrating the TDDB life.

The above-described analysis suggests that TDDB can also be improved by hydrogen plasma treatment. Described specifically, by the hydrogen plasma treatment, the Cu surface is reduced and a dangling bond such as Si—O— or Si—OH which will be a cause therefor is terminated as Si—H. Upon formation of the silicon nitride film, the Si—H having a weak bond surface is released and substituted by Si—N. As a result, a continuous interface is formed between the silicon oxide film and silicon nitride film. The interconnection resistance, however, increases as described above. FIG. 33 is a graph illustrating the data of the TDDB after hydrogen plasma treatment. For reference, Line Ref (without treatment) and Line A (ammonia plasma treatment) are shown. The graph clearly shows that the hydrogen plasma treatment (Line C) brings about a marked improvement in TDDB. Relaxation of the plasma damage is expected in the hydrogen plasma treatment so that the use of a material, as a cap film, which is replaceable for the silicon nitride film and at the same time, does not form a reaction product with Cu is particularly effective. The nitrogen plasma treatment (Line D), on the contrary, lowers TDDB, which is presumed to occur owing to an increase in the deposit of an organic matter by the nitrogen plasma treatment as is apparent from FIG. 26 or FIG. 27.

Moreover, this embodiment is effective for heightening the peel strength of the interface, thereby increasing the margin because of improved adhesion between each of the Cu interconnections 46a to 46e and silicon oxide film 39, and the cap film 47.

Treatment is not limited to that with a single gas such as ammonia or hydrogen but with a mixed gas plasma with an inactive gas such as nitrogen, argon or helium. More specifically, a mixed gas of ammonia with hydrogen, nitrogen, argon or helium or that of hydrogen with ammonia, nitrogen, argon or helium can be employed. In addition, a mixed gas including three or more gases selected from the above-described ones may be used. The amount of hydrogen, ammonia or hydrogen+ammonia must be at least 5% of the total flow rate (mass flow rate).

Embodiment 2

A manufacturing method of the CMOS-LSI according to Embodiment 2 of the present invention will next be described in the order of steps based on FIGS. 34 to 43.

The process of this embodiment is similar to that of Embodiment 1 in steps illustrated in FIG. 1 to FIG. 8. The steps after CMP will next be described.

Figure 34:
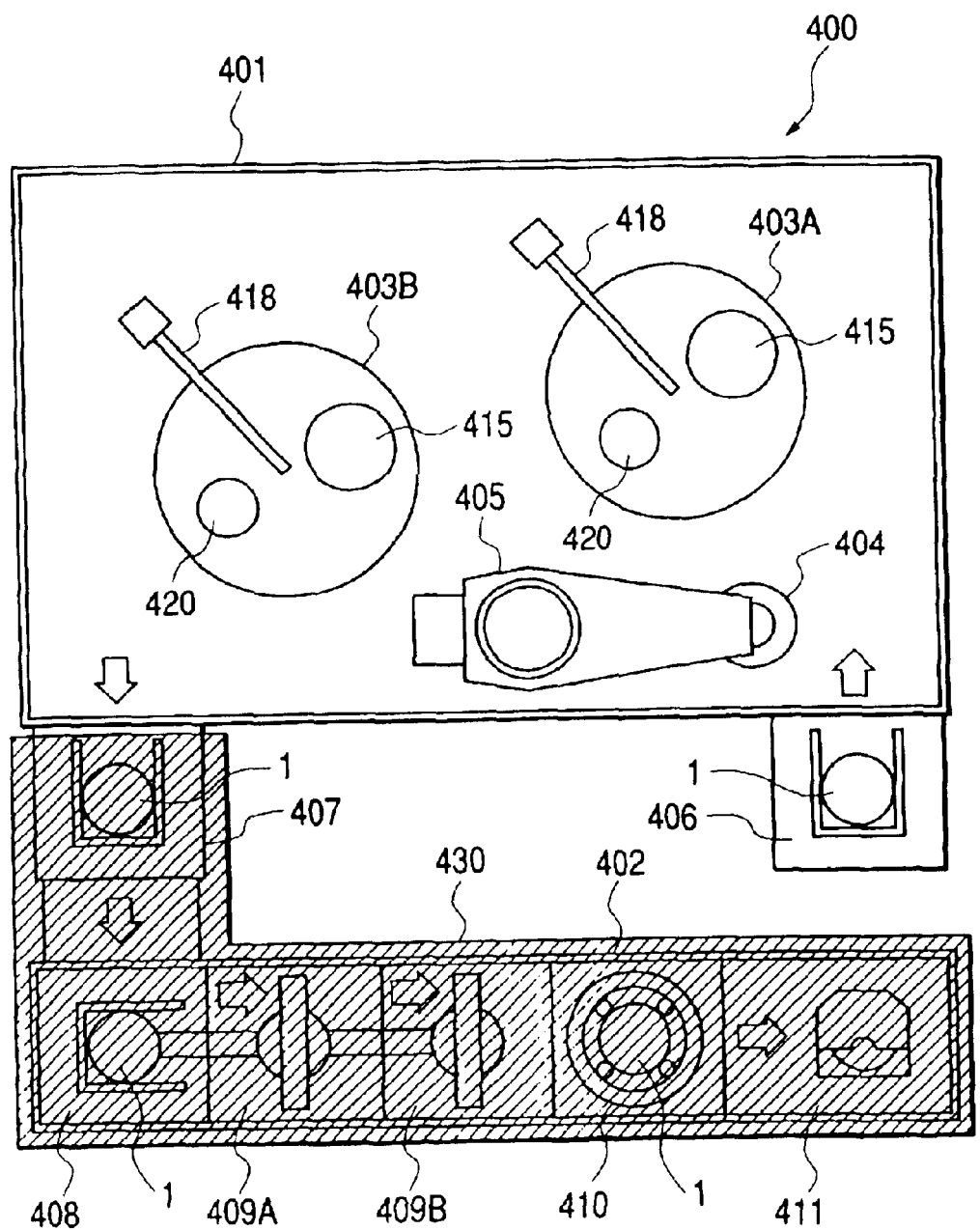
FIG. 34 is a schematic view illustrating one example of the whole constitution of a CMP apparatus used for a manufacturing method of a semiconductor integrated circuit device according to Embodiment 2 of the present invention.

FIG. 34 is a schematic view illustrating one example of the whole constitution of the CMP apparatus employed for the formation of a Cu-embedded interconnection.

As illustrated in the drawing, the CMP apparatus 400 has a polishing treatment part 401 and a post-washing treatment part 402 disposed downstream thereof. The polishing treatment part 401 is equipped with two fixed disks (first disk 403A, second disk 403B) for polishing a wafer (substrate) 1; a clean station 404 for subjecting the polished substrate 1 to preliminary washing and its surface to corrosion treatment, and a rotary arm 405 for transferring the substrate 1 among the loader, the first disk 403A, second disk 403B, clean station 404 and unloader 407.

Downstream of the polishing treatment part 401, a post-washing part 402 is disposed for scrub washing of the surface of the substrate 1 which has finished preliminary washing. The post-washing part 402 is equipped with a loader 408, first washing part 409A, second washing part 409B, spin drier 410 and unloader 411. The post-washing part 402 is surrounded by a shading wall 430 to prevent the surface of the substrate 1 from being exposed to light during washing and its inside is dark with an illuminance of 180 lux, preferably 100 lux or less. This shading wall is disposed because, if the substrate 1 having a polishing liquid attached to the surface thereof is exposed to light under wet condition, a short-circuit current passes through the pn junction by the photoelectromotive force of silicon, and Cu ions are dissociated from the surface of the Cu interconnection connected to the p side (+ side) of the pn junction, which causes corrosion of the interconnection.

Figure 35:
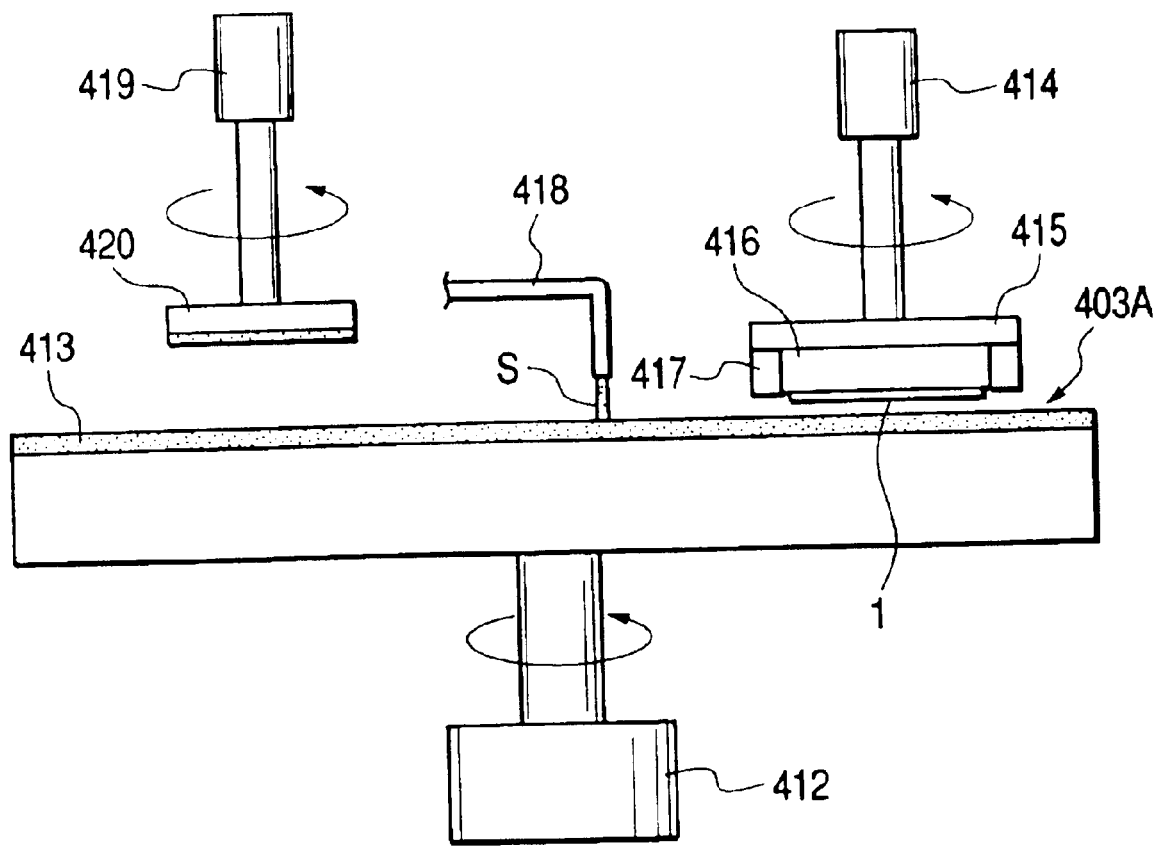
FIG. 35 is a schematic view illustrating a part of a CMP apparatus used for the formation of a Cu-embedded interconnection.

As illustrated in FIG. 35, the first disk 403A is turned and driven within a horizontal plane by a driving mechanism 412 disposed below the disk. The first disk 403A has, on the upper surface thereof, a polishing pad 413 which has been formed by uniformly adhering a synthetic resin such as polyurethane having a number of pores. A wafer carrier 415 turned and driven vertically within a horizontal plane by a driving mechanism 414 is disposed above the first disk 403A. The substrate 1 is supported by a wafer chuck 416 and retainer ring 417, each disposed at the lower end of the wafer carrier 415, with its main surface (a surface to be polished) down; and is pressed against the polishing pad 413 under a predetermined load. Between the surface of the polishing pad 413 and the surface of the substrate 1 to be polished, a slurry (polishing liquid). S is fed through a slurry feeding pipe 418, whereby the surface of the substrate 1 to be polished is chemically and mechanically polished. Above the first disk 403A, a dresser 420 turned and driven vertically within a horizontal plane by a driving mechanism 419 is disposed. The dresser 420 has, at the lower end thereof, a base having thereon electrodeposited diamond particles, by which the surface of the polishing pad 413 is periodically shaven in order to prevent clogging with the abrasive grains. The constitution of the second disk 403B is almost similar to that of the first disk 403A except that it has two slurry feeding pipes 418a, 418b.

Figure 36:
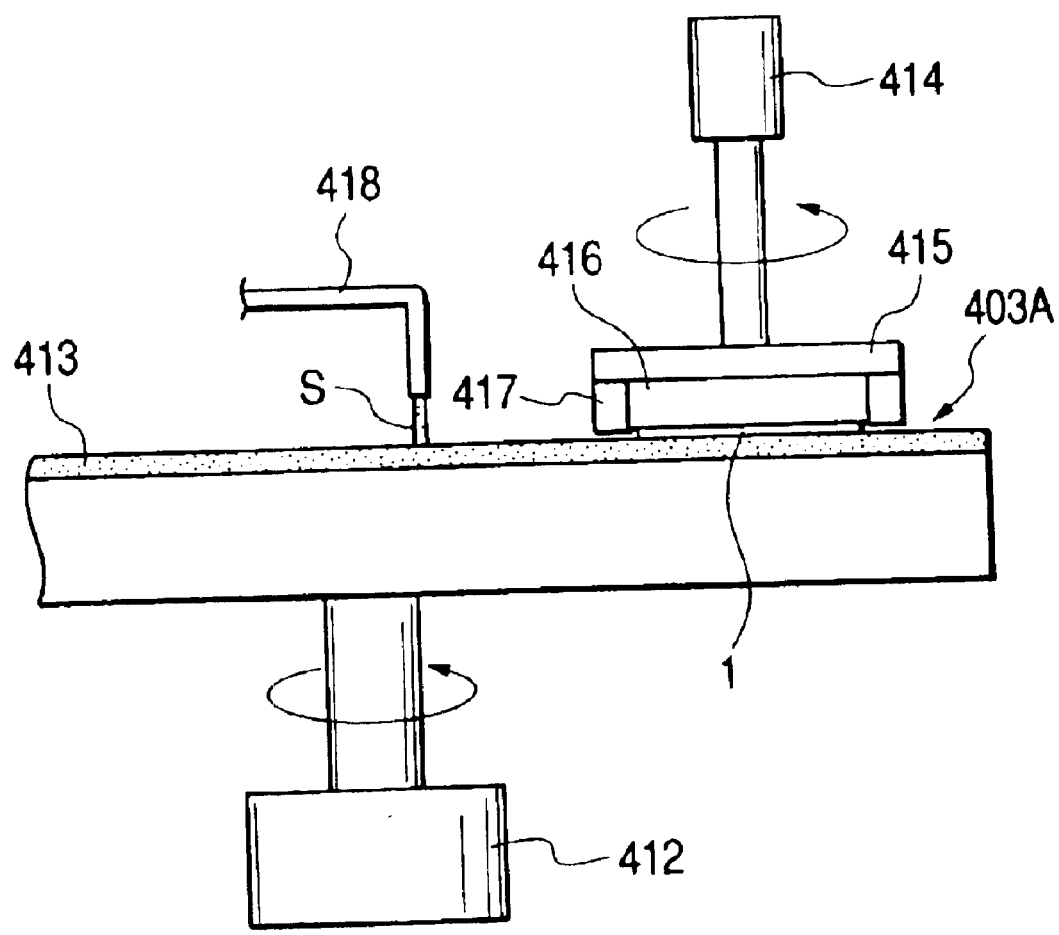
FIG. 36 is a schematic view of a CMP apparatus illustrating the polished condition of a Cu film.
Figure 37:
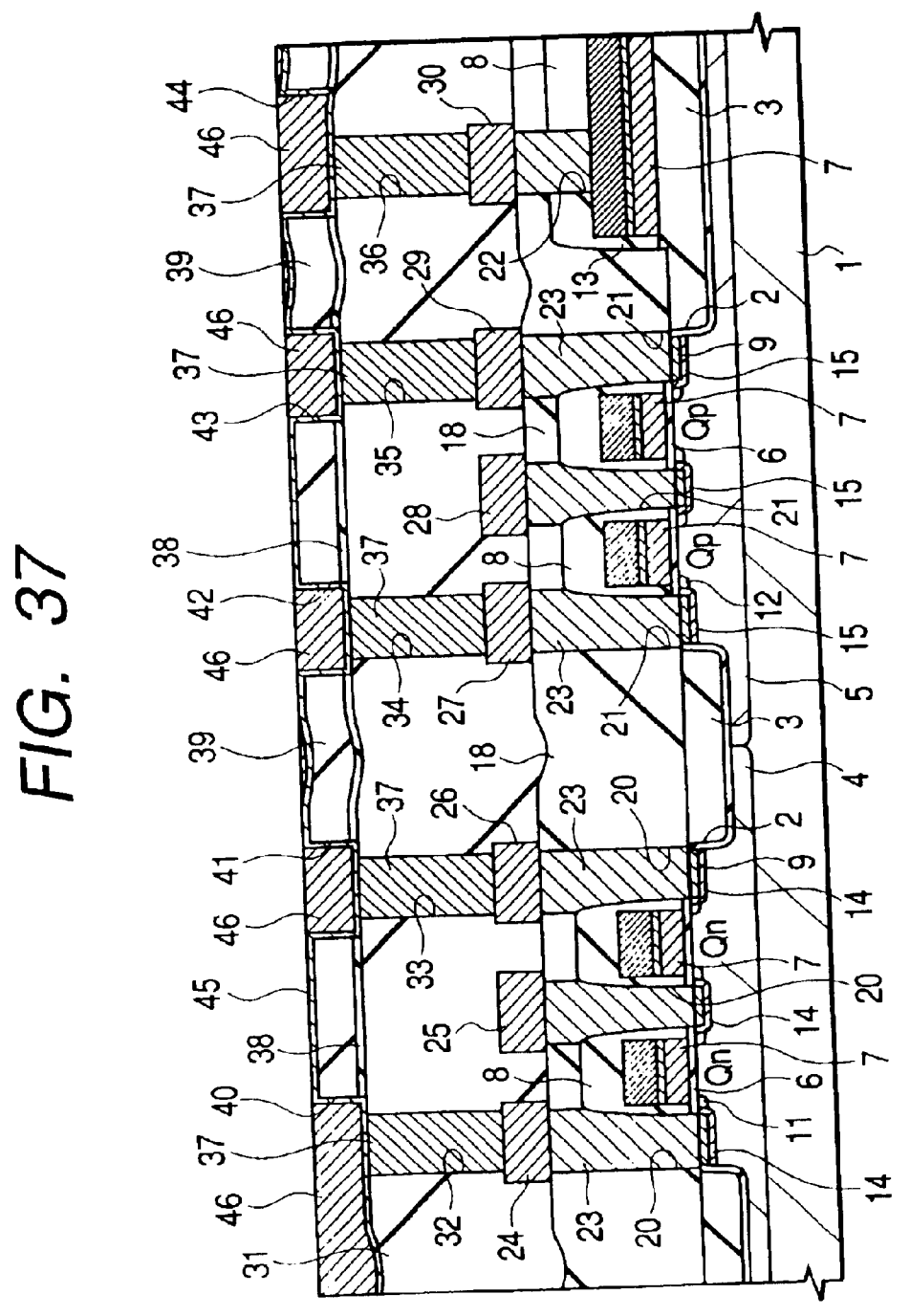
Figure 38A:
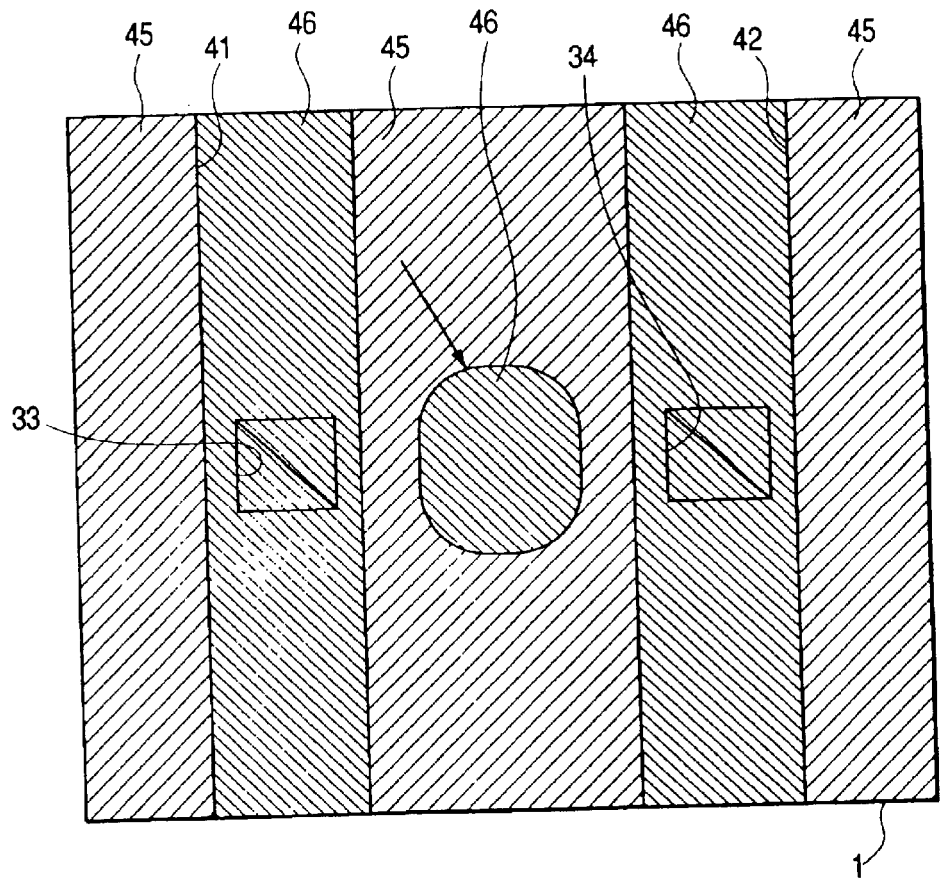
FIG. 38(a) is a fragmentary plan view of the semiconductor substrate illustrating the manufacturing method of the semiconductor integrated circuit device according to Embodiment 2 and FIG. 38(b) is a fragmentary cross-sectional view of the substrate.
Figure 38B:
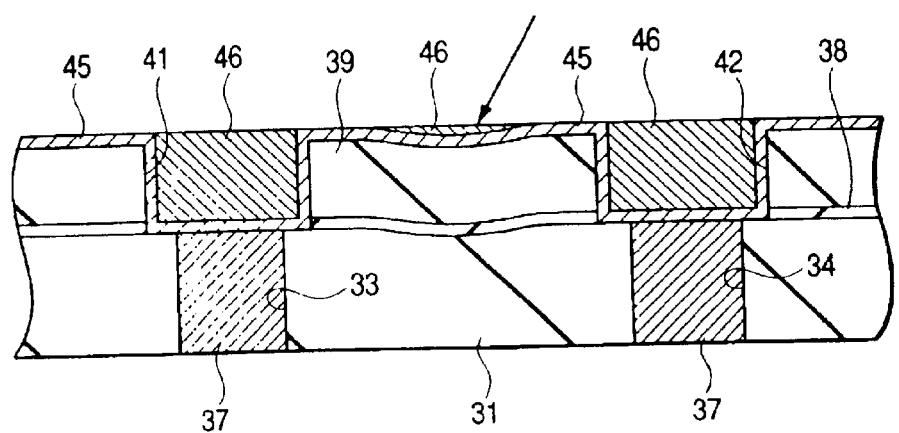

For the formation of the Cu-interconnection by the above-described CMP apparatus 400, the substrate 1 accommodated in the loader 406 is transported to the polishing treatment part 401 by the rotary arm 405, followed by chemical mechanical polishing (abrasive-grain-free chemical mechanical polishing) (CMP of the first step) using an abrasive-grain-free slurry, as illustrated in FIG. 36, on the first disk 403A to remove the Cu film 46 outside the interconnection grooves 40 to 44 (FIG. 37).

The term "abrasive-grain-free chemical mechanical polishing" as used herein means chemical mechanical polishing using a polishing liquid (slurry) containing abrasive grains made of powders such as alumina and silica in an amount less than 0.5%. As the content of the abrasive grains in the polishing liquid, an amount less than 0.1 wt. % is preferred, with that less than 0.01 wt. % being more preferred.

The polishing liquid having a pH adjusted to a range belonging to the corrosive range of Cu and moreover, having a composition adjusted so that the polishing selection ratio of the Cu film 46 to the TiN film 45 (barrier layer) will become not less than 5 is employed. As such a polishing liquid, a slurry containing both an oxidizing agent and an organic acid can be exemplified. Examples of the oxidizing agent include hydrogen peroxide, ammonium hydroxide, ammonium nitrate and ammonium chloride, while those of the organic acid include citric acid, malonic acid, fumaric acid, malic acid, adipic acid, benzoic acid, phthalic acid, tartaric acid, lactic acid and succinic acid. Among the above-exemplified oxidizing agents, hydrogen peroxide is preferred because it is free of a metal component and is not a strong acid. Among the above-exemplified organic acids, citric acid is preferred, because it is ordinarily employed as a food additive and has therefore low toxicity, its waste liquid is not so harmful and has a high solubility in water. Employed in this embodiment is a polishing liquid obtained, for example, by adding 5 vol. % of hydrogen peroxide and 0.03 wt. % of citric acid to pure water and adjusting the content of the abrasive grains to less than 0.01 wt. %.

By the chemical mechanical polishing with the above-described polishing liquid, the Cu surface is oxidized by an oxidizing agent, whereby a thin oxide layer is formed on the surface. When a substance for making the oxide water-soluble is fed, the oxide layer elutes as a water solution and the oxide layer becomes thin. Exposed to the oxidizing substance again, the thin portion of the oxide layer becomes thick. By the repetition of this reaction, chemical mechanical polishing proceeds. Chemical mechanical polishing using such an abrasive-grain-free polishing liquid is described in detail in Japanese Patent Application Hei 9-299937 and Japanese Patent Application Hei 10-317233 filed by the inventors of this application.

Polishing is carried out, for example, under the following conditions: a load of 250 g/cm$^2$, rotational frequency of wafer carrier of 30 rpm, rotational frequency of disk of 25 rpm and slurry flow rate of 150 cc/min. As a polishing pad, hard pad (IC1400) produced by Rodel/U.S.A. is employed. The polishing is terminated when the underlying TiN film 45 appears by the removal of the Cu film 46 and detection of the end point is conducted by detecting the torque signal strength of the disk or wafer carrier when the object to be polished changes from the Cu film 46 to the Tin film 45. It is also possible to detect the end point by forming a pore in the polishing pad and observing a change of light reflection spectrum from the surface of the wafer or by observing an optical spectrum change of the slurry.

As illustrated in FIG. 37, the Cu film 46 outside the interconnection grooves 40 to 44 are almost removed and the underlying TiN film 45 appears by the above-described abrasive-grain-free chemical mechanical polishing. As illustrated in enlarged views of FIGS. 38(a) and 38(b), however, the Cu film 46 not removed completely remains in the recess (shown by an arrow) of the TiN film 45 which has inevitably been formed along the underlying step difference.

The TiN film 45 outside the interconnection grooves 40 to 44 and the Cu film 46 which has partially remained thereover are removed by transferring the substrate 1 from the first disk 403A to the second disk 403B and subjecting it to chemical mechanical polishing (abrasive-grain-using chemical mechanical polishing) (CMP of the second step) using an abrasive-grain-containing polishing liquid (slurry). The term "abrasive-grain-using chemical mechanical polishing" as used herein means chemical mechanical polishing with a polishing liquid containing abrasive grains made of powders such as alumina and silica in an amount not less than 0.5 wt. %. In this embodiment, a polishing liquid obtained by mixing 5 vol. % of hydrogen peroxide, 0.03 wt. % of citric acid and 0.5 wt. % of abrasive grains with pure water is used, but it is not limited thereto. This polishing liquid is fed to the polishing pad 413 of the second disk 403B through the above-described slurry feeding pipe 418a.

In abrasive-grain-using chemical mechanical polishing, the Cu film 46 which has partially remained over the TiN film 45 is removed, followed by the removal of the TiN film 45 outside the interconnection grooves 40 to 44. The polishing of the surface of the Cu film 46 inside of the interconnection grooves 40 to 44 is suppressed by polishing under the conditions to give a polishing selection ratio of the Cu film 46 to the TiN film (barrier layer) not greater than that for the above-described abrasive-grain-free chemical mechanical polishing, for example, not greater than 3.

The polishing is conducted using a polishing pad "IC1400" produced by Rodel Inc., for example, under the conditions of a load of 120 g/cm$^2$, wafer rotational number of 30 rpm, disk rotational number of 25 rpm and slurry flow rate of 150 cc/min. The amount corresponding to the film thickness of the TiN film 45 is polished and the end point of polishing is controlled by the time calculated from the thickness and the polishing rate of the TiN film 45.

Figure 39:
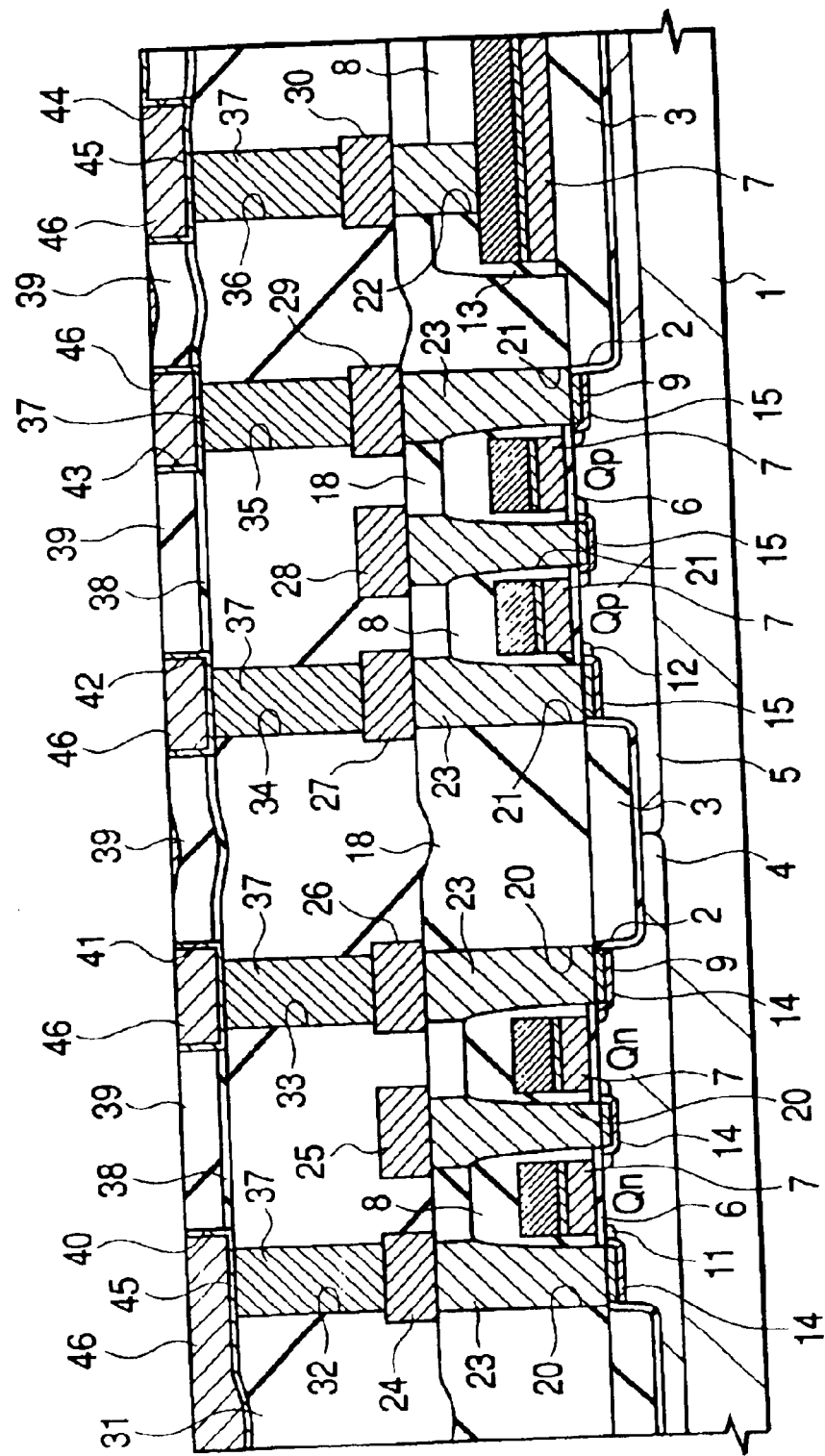
FIG. 39 is a fragmentary cross-sectional view of the semiconductor substrate illustrating the manufacturing method of the semiconductor integrated circuit device according to Embodiment 2.
Figure 40A:
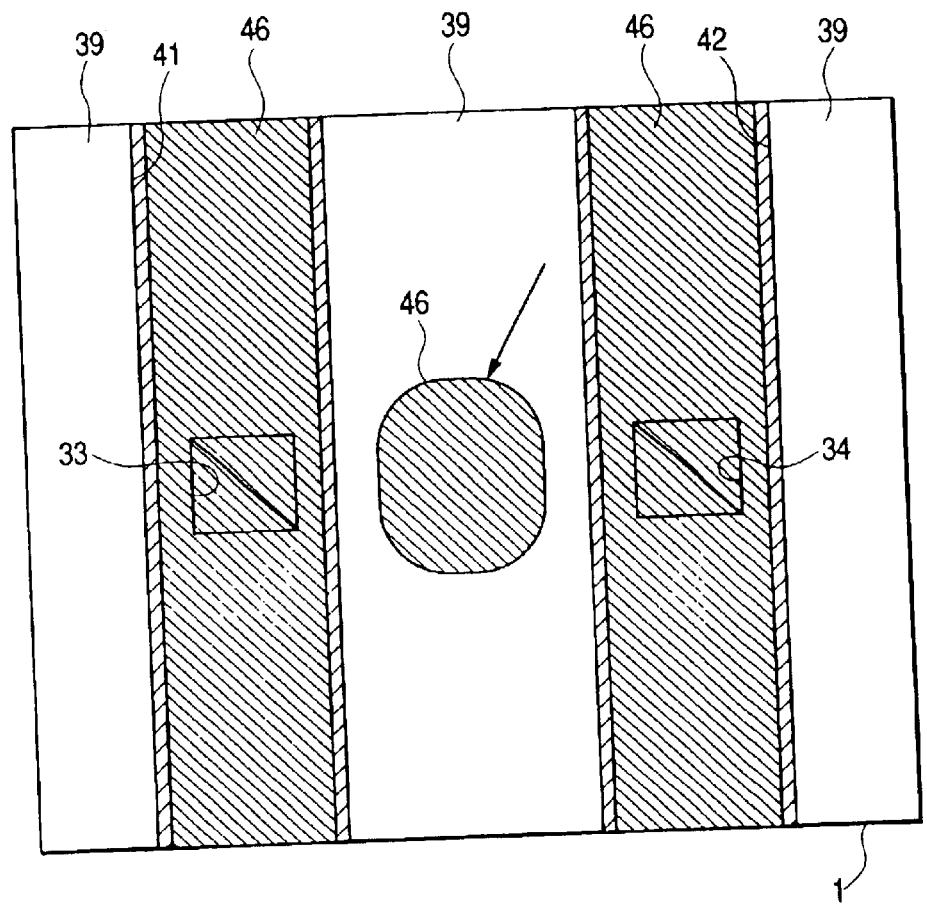
FIG. 40(a) is a fragmentary plan view of the semiconductor substrate illustrating the manufacturing method of the semiconductor integrated circuit device according to Embodiment 2 and FIG. 40(b) is a fragmentary cross-sectional view of this substrate.
Figure 40B:
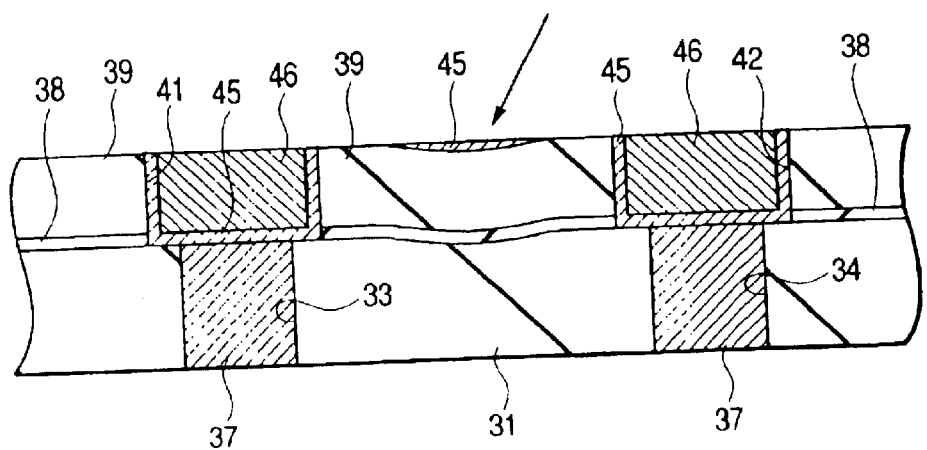

As illustrated in FIG. 39, the TiN film 45 outside the interconnection grooves 40 to 44 are substantially removed and the underlying silicon oxide film 39 appears by the above-described abrasive-grain-using chemical mechanical polishing. As illustrated in the enlarged views of FIGS. 40(a) and (b), the TiN film 45 not completely removed by the above-described polishing remains in the recess (shown by an arrow) of the silicon oxide film 39 which has inevitably been formed along the underlying step difference.

Then, selective chemical mechanical polishing (CMP of the third step) is conducted for removing the TiN film 45 (barrier layer) which has partially remained on the silicon oxide film 39 outside the interconnection grooves 40 to 44 while suppressing the polishing of the Cu film 46 inside of the interconnection grooves 40 to 44 as much as possible. This selective chemical mechanical polishing is conducted under the condition to give a polishing selection ratio of the TiN film 45 to the Cu film 46 not less than 5 and at the same time, to give a polishing rate ratio of the silicon oxide film 39 to the Cu film 46 not less than 1.

The above-described selective chemical mechanical polishing is conducted using a mixture of a polishing. liquid, as used in the above-described abrasive-grain-using chemical mechanical polishing, which contains at least 0.5 wt. % of abrasive grains; and an anticorrosive. The anticorrosive is a chemical for preventing or controlling the progress of polishing by forming an anticorrosive protective film on the surface of the Cu film 46. Examples include BTA derivatives such as benzotriazole (BTA) and BTA carboxylic acid, dodecyl mercaptan, triazole and tolyl triazole. A particularly stable protective film is formed by the use of BTA.

Sufficient effects are usually available by the addition of BTA, as an anticorrosive, in an amount of 0.001 to 1 wt. %, more preferably 0.01 to 1 wt. %, still more preferably 0.1 to 1 wt. % (three stages), though depending on the kind of the slurry. In this embodiment, a mixture of 0.1 wt. % of BTA, as an anticorrosive, with the polishing liquid employed in the abrasive-grain-using chemical mechanical polishing in the second step is used, but it is not limited thereto. Polyacrylic acid or polymethacrylic acid, ammonium salt thereof or ethylenediamine tetraacetic acid (EDTA) may be added as needed in order to prevent lowering in the polishing rate due to the addition of an anticorrosive. The chemical mechanical polishing using a slurry containing such an anticorrosive is described in detail in Japanese Patent Application No. Hei 10-209857, Japanese Patent Application No. Hei 9-299937 or Japanese Patent Application No. Hei 10-317233 filed by the inventors of the present application.

This selective chemical mechanical polishing (CMP of the third step) is conducted on the second disk 403B successively after completion of the above-described abrasive-grain-using chemical mechanical polishing (CMP of the second step). The polishing liquid added with an anticorrosive is fed to the surface of the polishing pad 413 through the above-described slurry feeding pipe 418b. The polishing is conducted, for example, under the conditions of a load of 120 g/cm², wafer carrier rotational frequency of 30 rpm, disk rotational frequency of 25 rpm and slurry flow rate of 190 cc/min.

Figure 41:
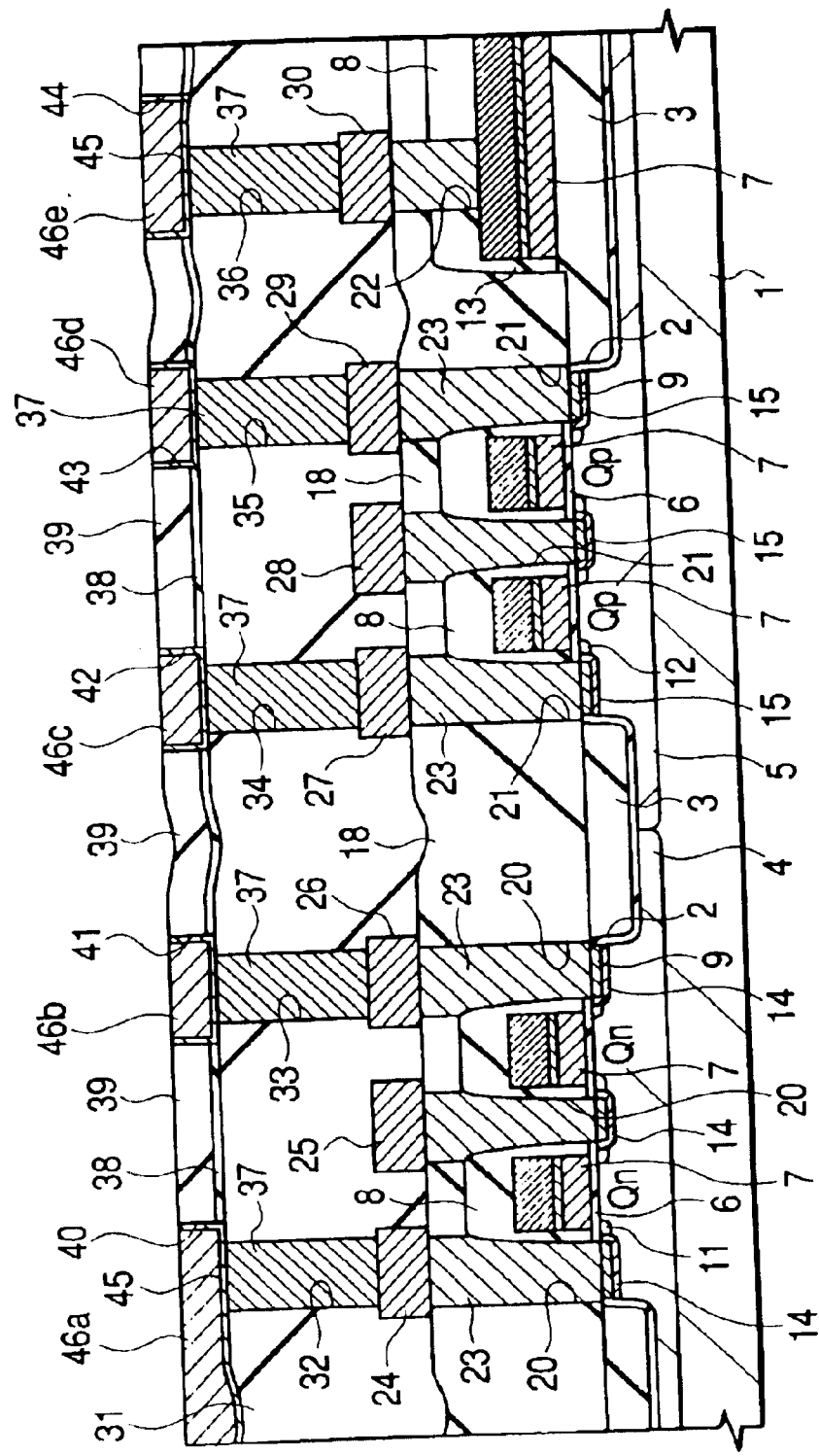
FIG. 41 is a fragmentary cross-sectional view of a semiconductor substrate illustrating the manufacturing method of the semiconductor integrated circuit device according to Embodiment 2.
Figure 42A:
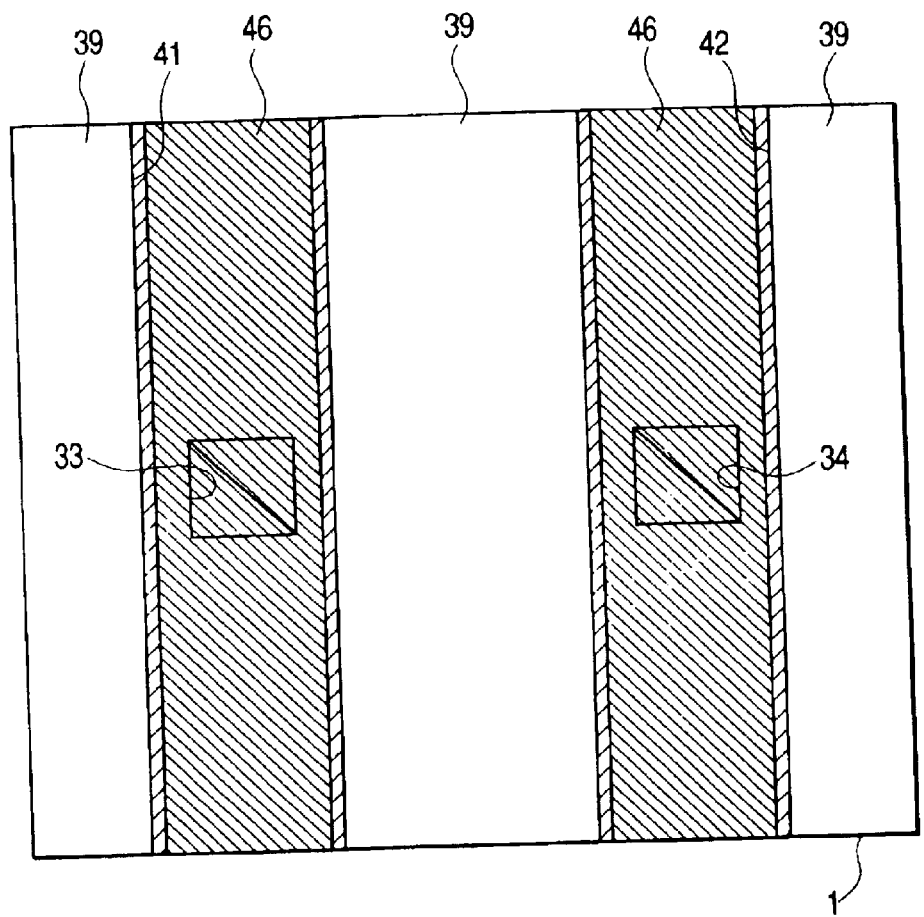
FIG. 42(a) is a fragmentary plan view of the semiconductor substrate illustrating the manufacturing method of the semiconductor integrated circuit device according to Embodiment 2 and FIG. 42(b) is a fragmentary cross-sectional view of this substrate.
Figure 42B:
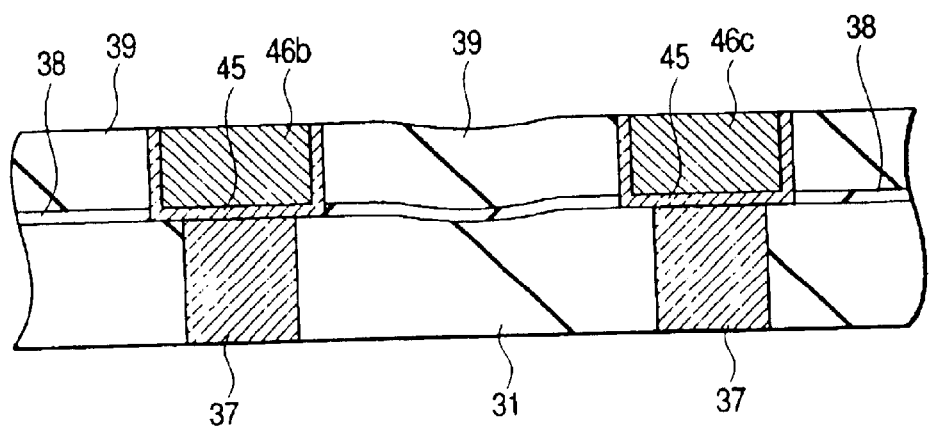

As illustrated in FIG. 41 and FIGS. 42(a) and 42(b), the above-described selective chemical mechanical polishing completely removes the TiN film 45 outside the interconnection grooves 40 to 44, whereby the Cu-embedded interconnections 46a to 46e are formed inside of the interconnection grooves 40 to 44.

On the surface of the substrate 1 having Cu-embedded interconnections 46a to 46e formed thereon, the slurry residue containing particles such as abrasive grains or metal particles such as Cu oxide has been attached. In order to remove this slurry residue, the substrate 1 is washed with BTA-containing pure water in the clean station. 404 as shown in FIG. 34. At this time, megasonic washing wherein high-frequency vibration of 800 kHz or greater is applied to the washing liquid to release the slurry residue from the surface of the substrate 1 may be used in combination. Then, the substrate 1, which is maintained under a wet condition to prevent surface drying, is transported from the polishing treatment part 401 to the post-washing part 402. In the first washing part 409A, the substrate 1 is subjected to scrub washing with a washing liquid containing 0.1 wt. % of NH₄OH, followed by scrub washing with pure water in the second washing part 409B. As described above, the post-washing part 402 is covered with a shading wall 430 to prevent corrosion of the Cu interconnections 46a to 46e due to exposure of the surface of the substrate 1 to light during washing.

After completion of the scrub washing (post-washing), the substrate 1 is dried by a spin drier 410 and then transported to the subsequent step.

Figure 43:
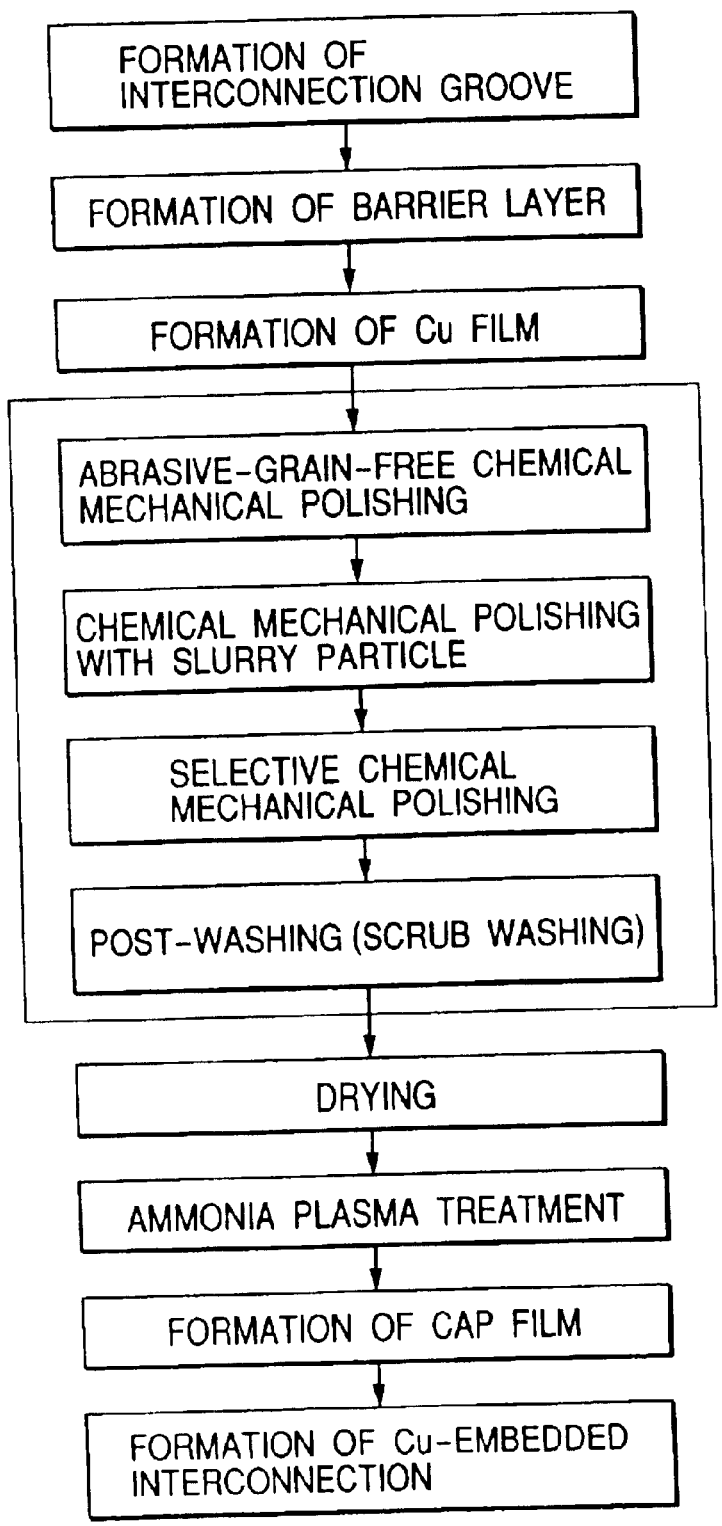
FIG. 43 is a flow chart showing the manufacturing method of the semiconductor integrated circuit device according to Embodiment 2.

The steps after the scrub washing are similar to those of Embodiment 1. FIG. 43 illustrates the whole flow chart of the above-described formation process of the Cu interconnections 46a to 46e.

Figure 44:
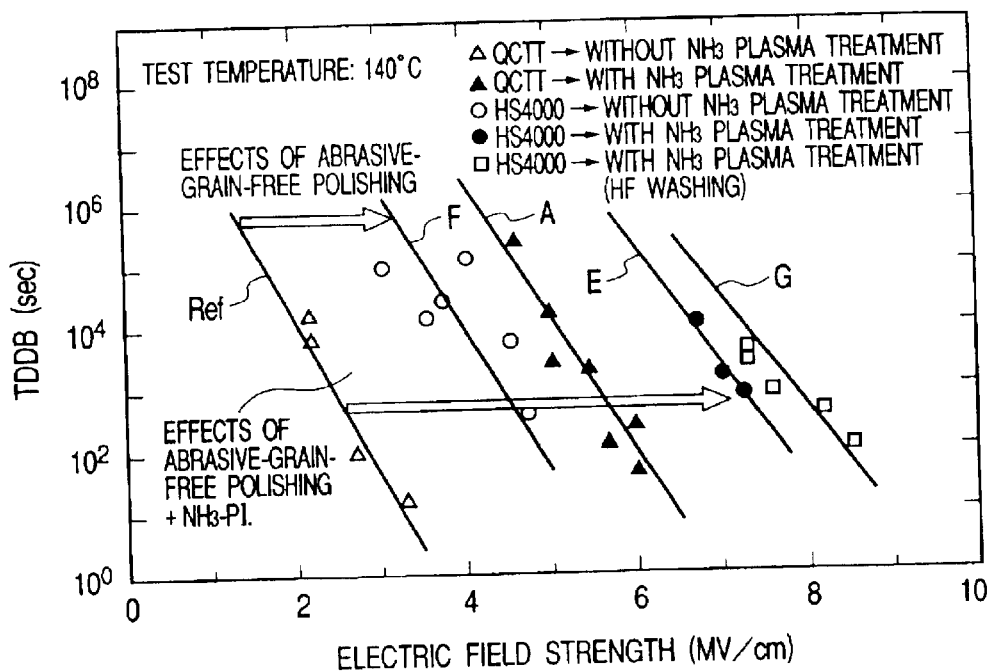
FIG. 44 is a graph illustrating TDDB.

According to this embodiment, the TDDB characteristics can be improved more than that of Embodiment 1. FIG. 44 is a graph illustrating TDDB and that of this embodiment is shown by Line E. For reference, TDDB (Line Ref) without treatment and that (Line A) subjected to abrasive-grain-using chemical mechanical polishing (Embodiment 1) are shown together. The TDDB is improved, as shown in Line F, only by the abrasive-grain-free chemical mechanical polishing without ammonia plasma treatment. Such an improvement in TDDB is presumed to occur because damage to the silicon oxide film can be reduced in the case of the abrasive-grain-free CMP. In the case of the abrasive-grain-using CMP, on the other hand, the slurry contains abrasive grains (such as alumina) having a particle size (secondary particle size) of 2 to 3 μm. These abrasive grains make micro scratches and cause a damage to the surface of the silicon oxide film 39. The abrasive-grain-free slurry does not contain abrasive grains or contains, if any, a very small amount or them so that the damage can be lessened to the minimum. The improvement in TDBB is presumed to be brought about because of the above-described reasons.

The TDDB characteristics will be improved further (Line G) by using acid treatment (HF treatment), which will be described later, in combination. The acid treatment is conducted by treating the substrate 1 with an acidic aqueous solution (ex. an aqueous HF solution) after CMP and post-washing but prior to ammonia plasma treatment. By the removal of the damaged layer on the surface by this acid treatment, the adhesion of the interface and, in turn, the TDDB are presumed to be improved.

Embodiment 3

Figure 45:
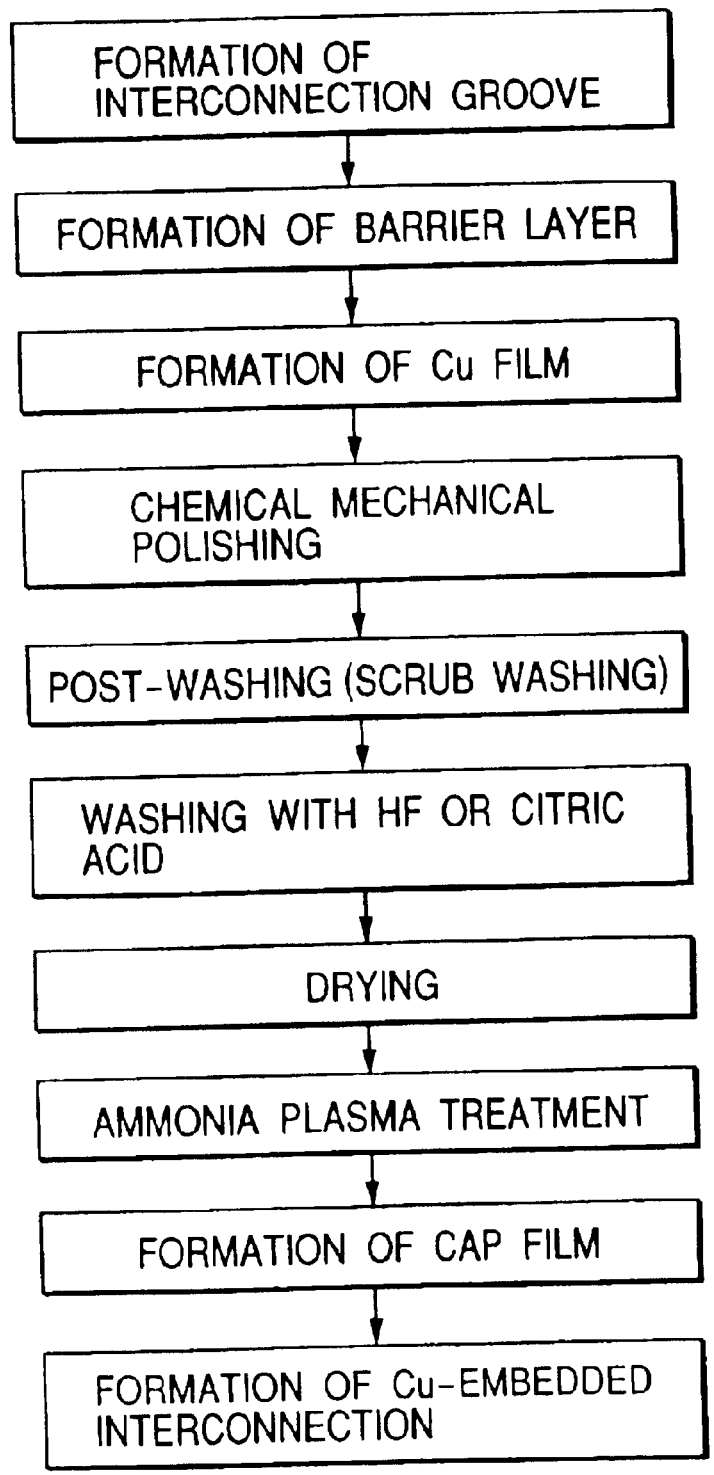
FIG. 45 is a flow chart showing a manufacturing method of a semiconductor integrated circuit device according to Embodiment 3.

FIG. 45 is a general flow chart of the formation process of the Cu interconnections 46a to 46e. As illustrated in this drawing, this process is similar to that of Embodiment 1 except that a washing step with HF or citric acid is added.

For HF washing, brush scrub washing can be employed. It can be conducted under the conditions of an HF concentration of 0.5% and washing time for 20 seconds.

Alternatively, citric acid washing can be employed instead of HF washing. For the citric acid washing, brush scrub washing can be employed and it can be conducted under: the conditions of a citric acid concentration of 5% and washing time for 45 seconds.

Figure 46:
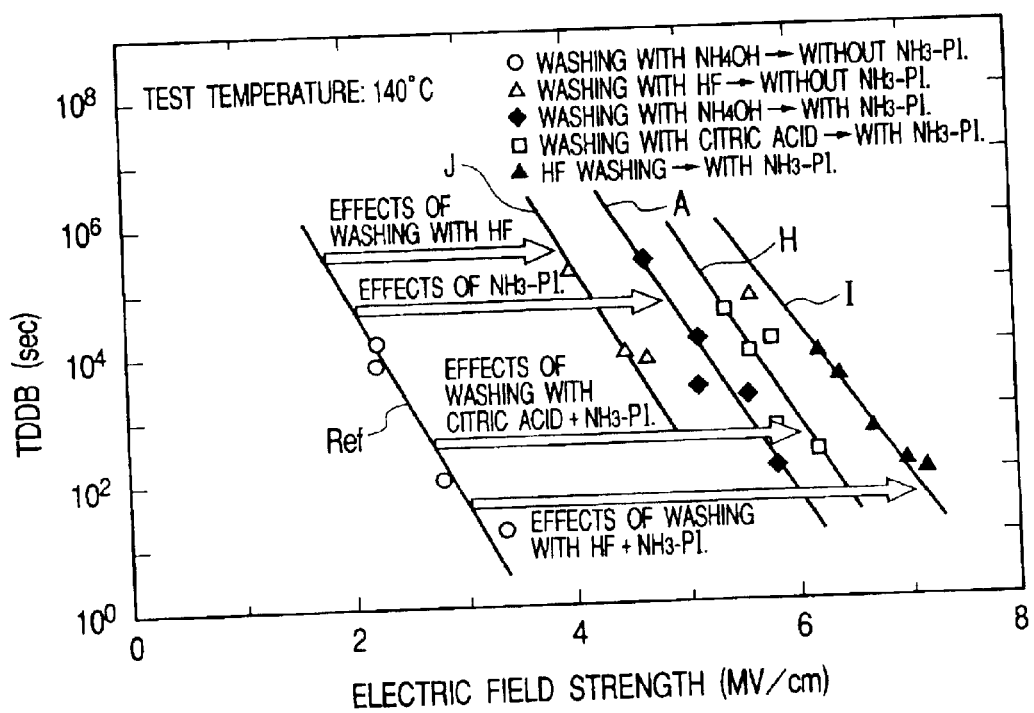
FIG. 46 is a graph illustrating TDDB.

By the HE or citric acid washing, the surface layer damaged by CMP or the like can be removed, which improves the TDDB characteristics. FIG. 46 is a graph illustrating TDDB, wherein Line H shows the data of citric acid washing, while Line I shows the data of HF washing, each according to this embodiment. For reference, the data without treatment (Line Ref) and that of Embodiment 1 (Line A) are shown on the same graph. As apparent from Line J. the TDDB characteristics show an improvement only by the HF washing without ammonia plasma treatment, which is presumed to result from an improvement in the properties of the interface by the removal of the damaged layer.

Embodiment 4

Figure 47:
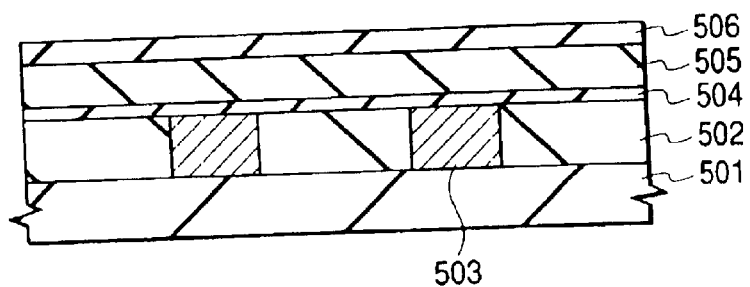
FIG. 47 is a fragmentary cross-sectional view of a semiconductor substrate illustrating a manufacturing method of a semiconductor integrated circuit device according to Embodiment 4.
Figure 48A:
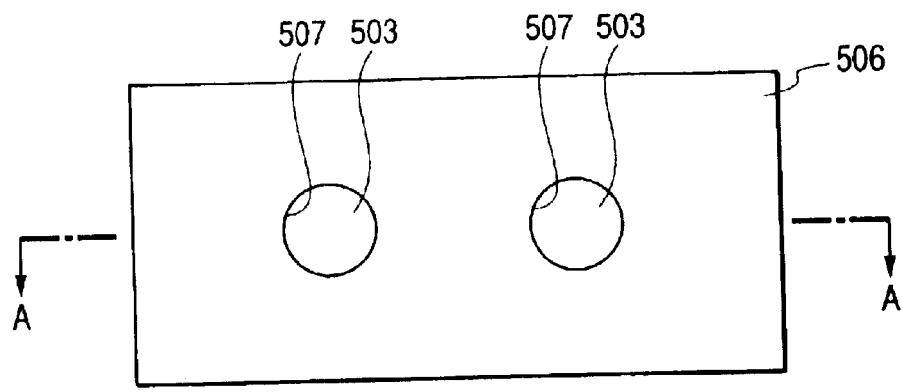
FIG. 48(a) is a fragmentary plan view of a semiconductor substrate illustrating the manufacturing method of the semiconductor integrated circuit device according to Embodiment 4 and FIG. 48(b) is a fragmentary cross-sectional view of this substrate.
Figure 48B:
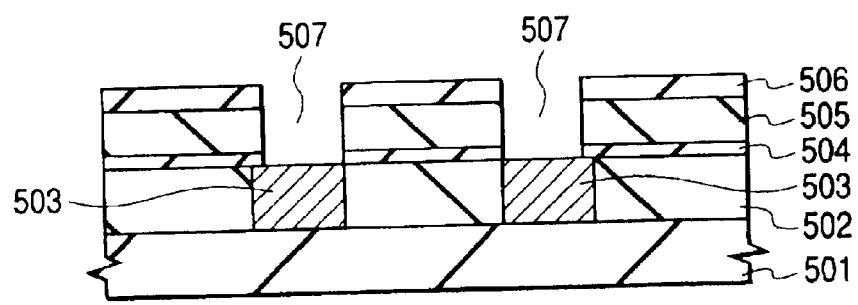
Figure 49:
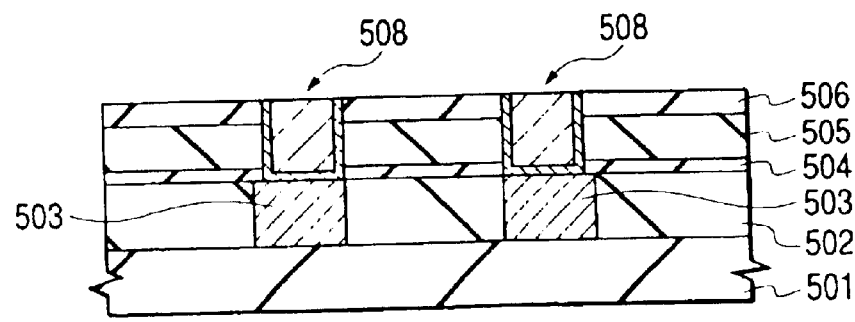
FIG. 49 is a fragmentary cross-sectional view of a semiconductor substrate illustrating the manufacturing method of the semiconductor integrated circuit device according to Embodiment 4.

FIGS. 47 to 49 are a plan view and cross-sectional views illustrating a manufacturing method of a semiconductor integrated circuit device according to Embodiment 4 of the present invention. In FIGS. 47 to 49, only an interconnection part is shown.

As illustrated in FIG. 47, an insulating film 502 for the formation of an interconnection is formed over another insulating film 501 and a copper interconnection 503 is formed by embedding it in this insulating film 502. The process for forming the copper interconnection 503 is similar to that of Embodiments 1 to 3.

Then, a silicon nitride film 504 and a silicon oxide film 505 of a low dielectric constant are formed, followed by the formation of a silicon oxide film (TEOS oxide film) 506 by the plasma CVD by using TEOS as a raw material gas.

The silicon oxide film 505 of a low dielectric constant is made of a silicon oxide insulating film having a specific dielectric constant ($\epsilon$) not greater than 3.0, for example, coating type insulating film such as an inorganic SOG film formed using hydrogen silsesquioxane as a raw material or an organic SOC film formed using tetraalkoxy silane and alkyl alkoxy silane as raw materials, or a fluorocarbon polymer film formed by the plasma CVD. Use of such a silicon oxide film having a low dielectric constant makes it possible to reduce the parasitic capacitance between interconnections, thereby avoiding the problem of delay between interconnections.

A connecting hole 507 is then opened as shown in FIG. 48(b) according to the pattern as shown in FIG. 48(a). Photolithography and etching are applied to the opening of the connecting hole 507. The silicon oxide film 505 of a low dielectric constant has a rough surface and contains many Si—OH bonds. Experience has revealed that the quality of the film formed over such a silicon oxide film or the condition of the interface therebetween are poor and that formation of a barrier film (titanium nitride) which will be described in the subsequent step over the silicon oxide film without any treatment leads to inferior TDDB characteristics. The exposed portion of the silicon oxide film 505 inside of the connecting hole 507 is therefore subjected to ammonia plasma treatment as described in Embodiment 1. Then, the Si—OH bonds on the surface are modified and converted into the Si—O—N bonds as described in Embodiment 1.

As illustrated in FIG. 49, a plug 508 made of titanium nitride and tungsten is formed in the connecting hole 507. Upon deposition of titanium nitride, an Si—O—N bond is released as in Embodiment 1, whereby the interface between titanium nitride and the silicon oxide film 50 of a low dielectric constant is improved and adhesion therebetween is heightened.

It is needLess to say that such plasma treatment in the connecting hole can be applied to an interconnection groove.

Instead of ammonia plasma treatment, hydrogen plasma treatment or plasma treatment with a mixed gas with nitrogen, argon or helium can also be adopted.

In the ashing step for the removal of a photoresist film after opening of the connecting hole 507, the surface of the interconnection 503 at the bottom of the connecting hole 507 happens to be oxidized. In Japanese Patent Application Laid-Open No. Hei 11-16912, described is a technique for removing such an oxide layer.

The silicon oxide film 505 of a low dielectric constant can be defined as a silicon oxide film having a dielectric constant lower than that of a silicon oxide film (ex. TEOS oxide film) contained in the protective film formed as a passivation film.

The inventions made by the present inventors have so far been described specifically based on the embodiments of the invention. It should however be borne in mind that the present invention is not limited by these embodiments but can be modified within an extent not departing from the scope of the invention.

The above-described process for the formation of Cu-embedded interconnections 46a to 46e can also be applied to a process for forming a Cu-embedded interconnection by the dual damascene process. In this case, after formation of the W interconnections 24 to 30 of the first layer, a silicon oxide film 31 of about 1200 nm thick, a silicon nitride film 38 as thin as about 50 nm and a silicon oxide film 39 of about 350 nm thick are successively deposited by the plasma CVD over the W interconnections 24 to 30 of the first layer, as illustrated in FIG. 50.

Figure 52A:
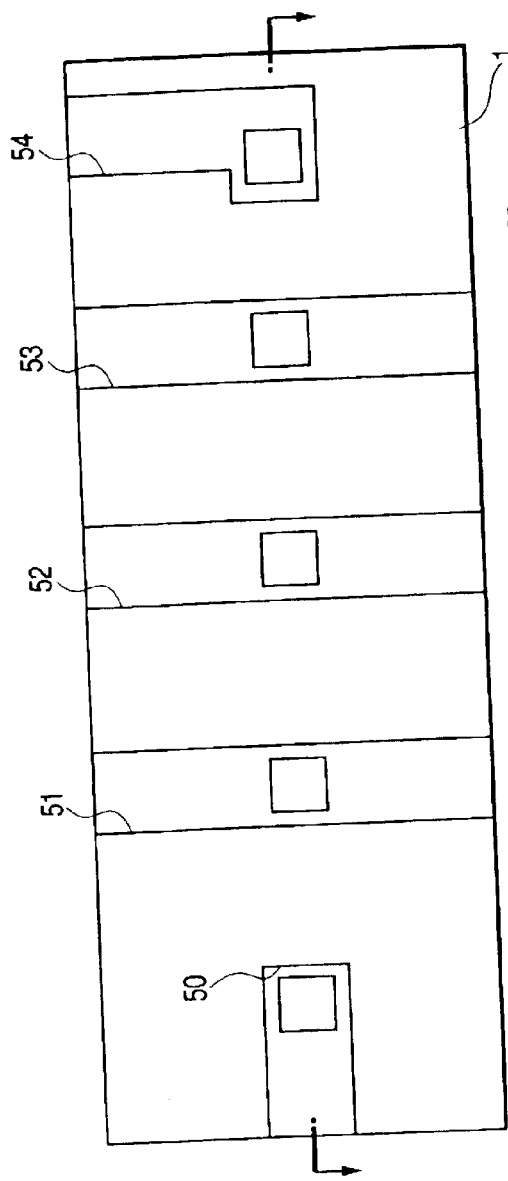
FIG. 52(a) is a fragmentary plan view of a semiconductor substrate illustrating the manufacturing method of the semiconductor integrated circuit device according to another embodiment and FIG. 52(b) is a fragmentary cross-sectional view of this substrate.
Figure 52B:
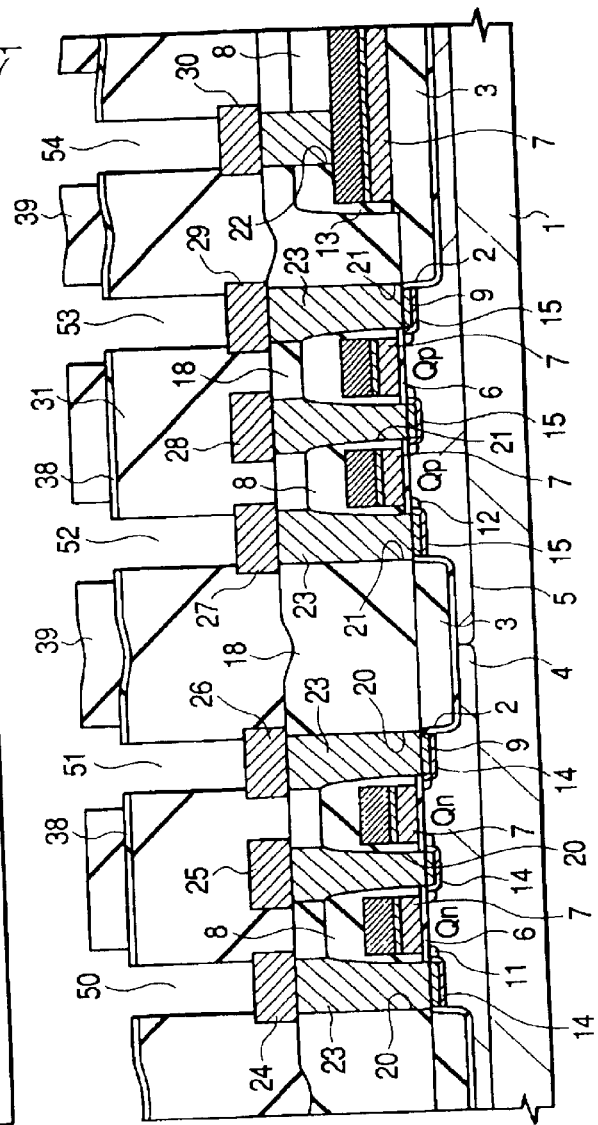
Figure 55:
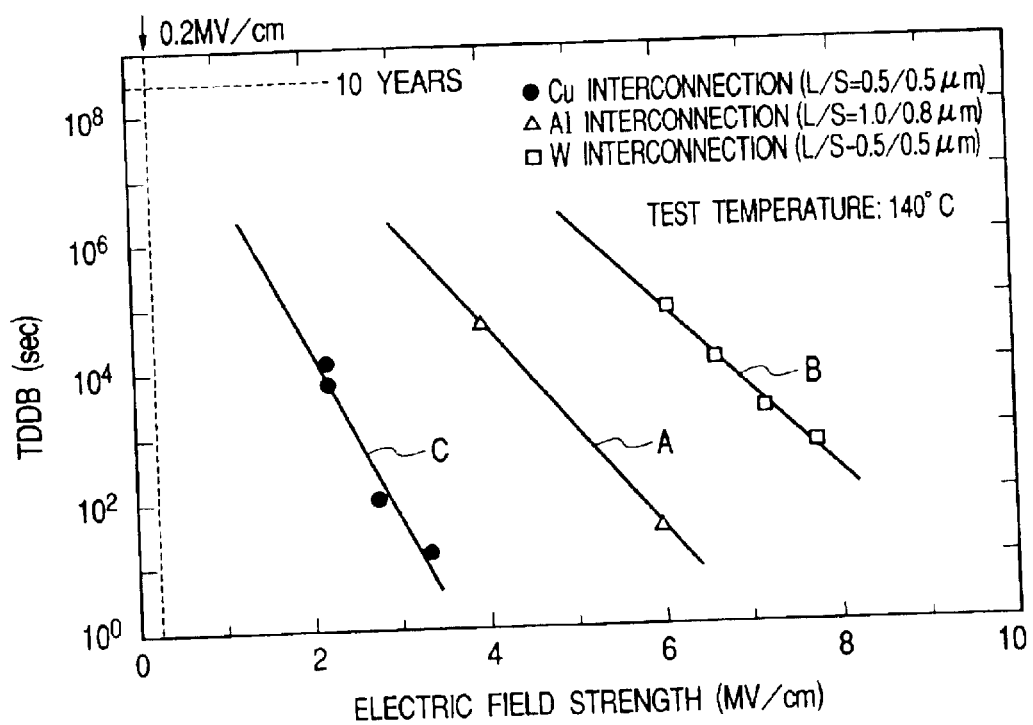
FIG. 55 is a graph showing measured data of TDDB characteristics of copper, aluminum and tungsten interconnections.

As illustrated in FIG. 51, the silicon oxide film 39, silicon nitride film 38 and silicon oxide film 31 over the W interconnections 24,26,27,29,30 of the first layer were removed successively by dry etching with a photoresist film as a mask. As illustrated in FIGS. 52(a) and 52(b), the silicon oxide film 39 is removed by dry etching with another photoresist film as a mask and with the silicon nitride film 38 as an etching stopper, whereby interconnection grooves 50 to 54 serving also as through-holes are formed.

As illustrated in FIG. 53, after deposition of a TiN film 45 as thin as about 50 nm over the silicon oxide film 39 including the inside of each of the interconnection grooves 50 to 54, a Cu film 46 sufficiently thicker than the depth of each of the interconnection grooves 50 is formed over the TiN film 45. The interconnection grooves 50 to 54 which also serve as throuqh-holes have a larger aspect ratio than the above-described interconnection grooves 40 to 44, so that the TiN film 45 is deposited by the CVD. The Cu film 46 is deposited by repeating sputtering at least twice. Instead of sputtering, CVD, electroplating or electroless plating method can be adopted. The formation of the Cu film 46 by the plating method requires a step for forming a Cu seed layer below the interconnection grooves 50 to 54 by sputtering or the like.

As illustrated in FIG. 54, the Cu film 46 and TiN film 45 outside the interconnection grooves 50 to 54 are removed by the above-described abrasive-grain-free chemical mechanical polishing, abrasive-grain-using chemical mechanical polishing and selective chemical mechanical polishing, whereby the Cu-embedded interconnections 46a to 46e are formed inside of the interconnection grooves 50 to 54. The steps subsequent thereto are similar to those employed for the formation of the Cu-embedded interconnections 46a to 46e by the single damascene method.

It is needless to say that Embodiments 1 to 4 can be applied either singly or in combination. For example, after abrasive-grain-free chemical mechanical polishing according to Embodiment 2, acid treatment is conducted according to Embodiment 3, followed by plasma treatment with ammonia, hydrogen or another gas according to Embodiment 1.

In the above-described embodiments, the silicon nitride film 47 is formed continuously after ammonia plasma treatment without vacuum break. Alternatively, the silicon nitride film 47 may be formed after ammonia plasma treatment and vacuum break. The present invention is more effective when the silicon nitride film is formed without vacuum break. A thin nitride layer is however formed by ammonia plasma treatment so that vacuum break and exposure to the atmosphere do not disturb the control of the formation of an oxide layer. It is therefore possible to bring about effects of this embodiment to some extent even if vacuum break is conducted.

Effects of the representative inventions, among the inventions disclosed by the present invention, will next be described briefly.

Dielectric breakdown resistance (reliability) of a copper interconnection formed by the damascene method can be improved.

Peeling of the interconnection layer from the cap film can be controlled.

An increase in the resistance of a copper interconnection when a silicon nitride film is employed as the cap film can be prevented.

What is claimed is:

1. A manufacturing method of a semiconductor integrated circuit device, comprising the steps of:
   (a) forming a first interconnection groove in a first interlayer insulating film over a first main surface of a wafer;
   (b) forming a first barrier metal film over the first interlayer insulating film both outside and inside the first interconnection groove;
   (c) forming a first interconnection metal film containing copper as a main component over the first barrier metal film both outside and inside the first interconnection groove so as to fill the first interconnection groove;
   (d) removing the first interconnection metal film outside the first interconnection groove by first chemical mechanical polishing using a first polishing slurry;
   (e) after step (d), removing the first barrier metal film outside the first interconnection groove by second chemical mechanical polishing using a second polish ing slurry different from the first polishing slurry in composition;

(f) after step (e), performing ammonia plasma treatment to upper surfaces of both the first interlayer insulating film and the first interconnection metal film; and (g) after step (f), forming a copper diffusion barrier insulating film on the treated upper surfaces by plasma CVD.

2. The method according to claim 1, wherein the first chemical mechanical polishing is performed using a first polishing pad, and the second chemical mechanical polishing is performed using a second polishing pad different from said first polishing pad.

3. The method according to claim 2, wherein the copper diffusion barrier insulating film is a silicon nitride film.

* * * * *